United States Patent
Nagel et al.

(10) Patent No.: US 11,939,671 B2
(45) Date of Patent: Mar. 26, 2024

(54) QUANTUM PRINTING NANOSTRUCTURES WITHIN CARBON NANOPORES

(71) Applicant: Quantum Elements Development Inc., Mansfield, MA (US)

(72) Inventors: Christopher J. Nagel, Wayland, MA (US); Chris Leo Brodeur, Swansea, MA (US)

(73) Assignee: Quantum Elements Development Inc., Mansfield, MA (US)

( * ) Notice: Subject to any disclaimer, the term of this patent is extended or adjusted under 35 U.S.C. 154(b) by 0 days.

(21) Appl. No.: 18/127,210

(22) Filed: Mar. 28, 2023

(65) Prior Publication Data

US 2023/0366083 A1 Nov. 16, 2023

Related U.S. Application Data

(63) Continuation of application No. 17/723,915, filed on Apr. 19, 2022, now Pat. No. 11,643,723, which is a
(Continued)

(51) Int. Cl.
| | |
|---|---|
| *C23C 16/44* | (2006.01) |
| *C01B 32/15* | (2017.01) |
| *C01B 32/194* | (2017.01) |
| *C23C 16/02* | (2006.01) |
| *C23C 16/04* | (2006.01) |
| *C23C 16/06* | (2006.01) |
| *C23C 16/452* | (2006.01) |
| *C23C 16/48* | (2006.01) |

(Continued)

(52) U.S. Cl.
CPC .......... *C23C 16/4417* (2013.01); *C01B 32/15* (2017.08); *C01B 32/194* (2017.08); *C23C 16/0227* (2013.01); *C23C 16/045* (2013.01); *C23C 16/06* (2013.01); *C23C 16/452* (2013.01); *C23C 16/482* (2013.01); *C23C 16/483* (2013.01); *C23C 16/484* (2013.01); *C23C 16/505* (2013.01); *C23C 16/52* (2013.01); *B82Y 30/00* (2013.01); *B82Y 40/00* (2013.01); *C01P 2004/64* (2013.01); *C01P 2006/16* (2013.01)

(58) Field of Classification Search
CPC ....... C01B 32/194; C01B 32/15; C23C 16/06; C23C 16/505; C23C 16/484; C23C 16/045; C23C 16/452; C23C 16/482; C23C 16/483
See application file for complete search history.

(56) References Cited

U.S. PATENT DOCUMENTS

| | | |
|---|---|---|
| 4,957,061 A | 9/1990 | Ando et al. |
| 5,798,137 A | 8/1998 | Lord et al. |
| | (Continued) | |

OTHER PUBLICATIONS

Campos-Roldan, C. A, et al., "Influence of sp3-sp2 Carbon Nanodomains on Metal/Support Interaction, Catalyst Durability, and Catalytic Activity for the Oxygen Reduction Reaction", ACS Appl. Molec. Interfaces, 8(35), Aug. 5, 2016, 23260-23269.
(Continued)

*Primary Examiner* — Joseph A Miller, Jr.
(74) *Attorney, Agent, or Firm* — Elmore Patent Law Group; Carolyn S. Elmore; Joseph C. Zucchero

(57) ABSTRACT

The invention includes apparatus and methods for instantiating and quantum printing materials, such as elemental metals, in a nanoporous carbon powder.

29 Claims, 44 Drawing Sheets
(10 of 44 Drawing Sheet(s) Filed in Color)

Related U.S. Application Data continuation of application No. 17/408,821, filed on Aug. 23, 2021, now Pat. No. 11,345,995, which is a continuation of application No. 17/122,355, filed on Dec. 15, 2020, now Pat. No. 11,332,825.

(60) Provisional application No. 62/948,450, filed on Dec. 16, 2019.

(51) Int. Cl.
  *C23C 16/505* (2006.01)
  *C23C 16/52* (2006.01)
  *B82Y 30/00* (2011.01)
  *B82Y 40/00* (2011.01)

(56) References Cited

U.S. PATENT DOCUMENTS

| | | | |
|---|---|---|---|
| 6,187,379 B1 | 2/2001 | Lackey | |
| 7,326,396 B2 | 2/2008 | Yu et al. | |
| 10,844,483 B1 | 11/2020 | Nagel | |
| 10,889,892 B1 | 1/2021 | Nagel | |
| 2002/0187082 A1 | 12/2002 | Wu et al. | |
| 2003/0075925 A1 | 4/2003 | Lindfors et al. | |
| 2004/0091415 A1 | 5/2004 | Yu et al. | |
| 2007/0082816 A1 | 4/2007 | Yang et al. | |
| 2007/0183944 A1 | 8/2007 | Shawcross | |
| 2008/0048153 A1 | 2/2008 | Naoi | |
| 2008/0085226 A1 | 4/2008 | Fondurulia et al. | |
| 2010/0009080 A1 | 1/2010 | Jan et al. | |
| 2010/0111752 A1 | 5/2010 | Nagel | |
| 2010/0140802 A1 | 6/2010 | Matsumoto et al. | |
| 2010/0150808 A1 | 6/2010 | Bhusarapu et al. | |
| 2011/0052805 A1 | 3/2011 | Bordere et al. | |
| 2012/0100303 A1 | 4/2012 | Kim et al. | |
| 2012/0164323 A1 | 6/2012 | Bhusarapu et al. | |
| 2012/0265122 A1 | 10/2012 | El-Shall et al. | |
| 2012/0300364 A1 | 11/2012 | Cai et al. | |
| 2013/0202790 A1 | 8/2013 | Li et al. | |
| 2013/0264066 A1 | 10/2013 | Steele | |
| 2013/0312855 A1 | 11/2013 | Birtcher et al. | |
| 2015/0125599 A1 | 5/2015 | Lindfors et al. | |
| 2015/0194668 A1 | 7/2015 | Ueda et al. | |
| 2016/0086700 A1 | 3/2016 | Suetsuna et al. | |
| 2016/0101398 A1 | 4/2016 | Worsley et al. | |
| 2016/0130698 A1 | 5/2016 | Alcott | |
| 2016/0175930 A1 | 6/2016 | She et al. | |
| 2016/0204449 A1 | 7/2016 | Mal et al. | |
| 2018/0126456 A1 | 5/2018 | So et al. | |
| 2018/0333774 A1 | 11/2018 | Christensen et al. | |
| 2019/0051892 A1 | 2/2019 | Yushin et al. | |
| 2019/0110336 A1 | 4/2019 | Cong et al. | |

OTHER PUBLICATIONS

Joo, S. H, et al., "Ordered nanoporous arrays of carbon supporting high dispersions of platinum nanoparticles", Nature, 412, Jul. 12, 2001, 169-172.

Roy, C., et al., "Scalable Synthesis of Carbon-Supported Platinum—Lanthanide and—Rare-Earth Alloys for Oxygen Reduction", ACS Catal., 8, 2071-2080.

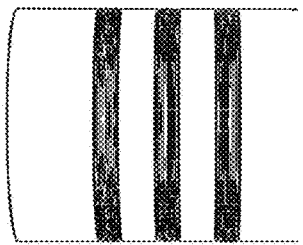
3 Coil 1"
QPP Ag/Cu-
Cu-Ag/Cu
FIG. 3C
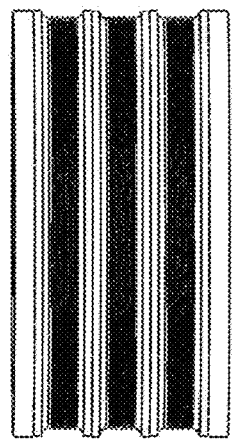
3 Coil 2" QPP
Ag/Cu-Cu-Ag/
Cu
FIG. 3E
1" QPP Coil
Ag/Cu
(Also
Pt,Ni240
FIG. 3B
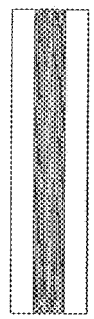
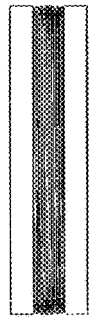
2" QPP Coil Cu
(Also Pt,Ni240, Al
and Ag/Cu)
FIG. 3D
1" QPP Coil
-Copper
FIG. 3A

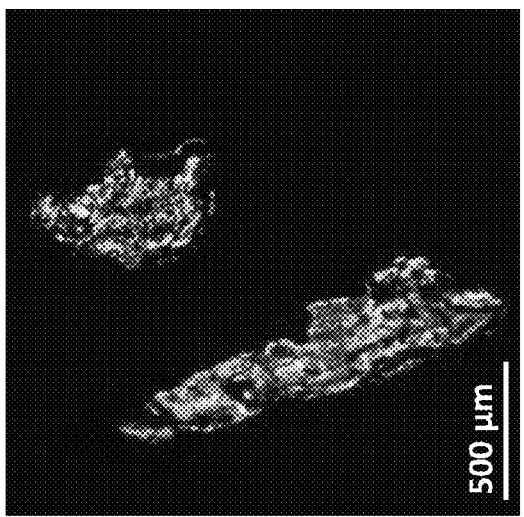
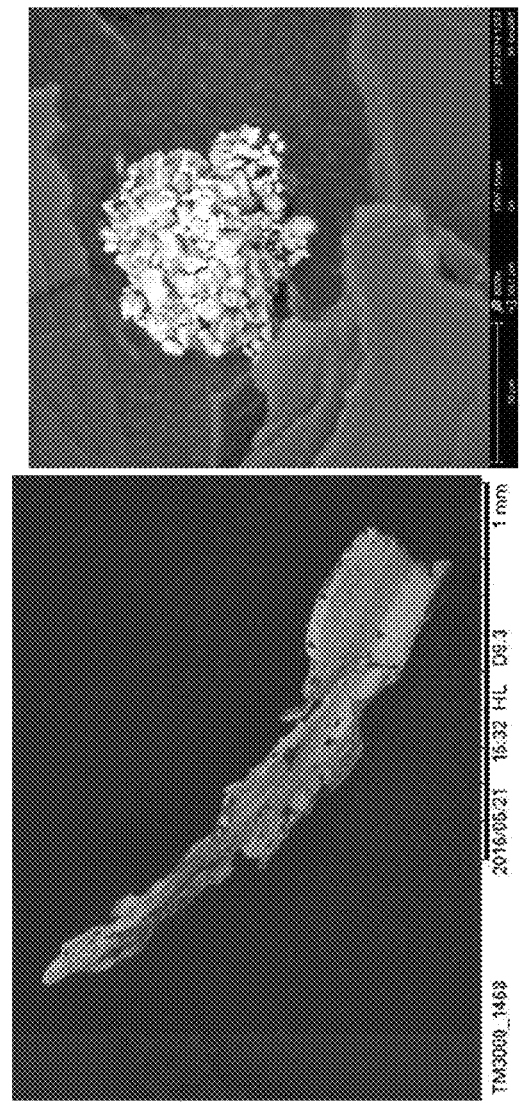
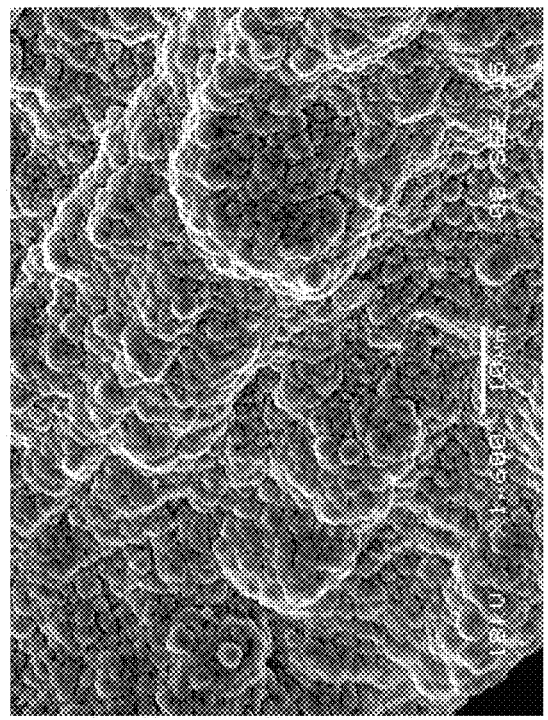
FIG. 9A  FIG. 9B  FIG. 9C  FIG. 9D  FIG. 9E

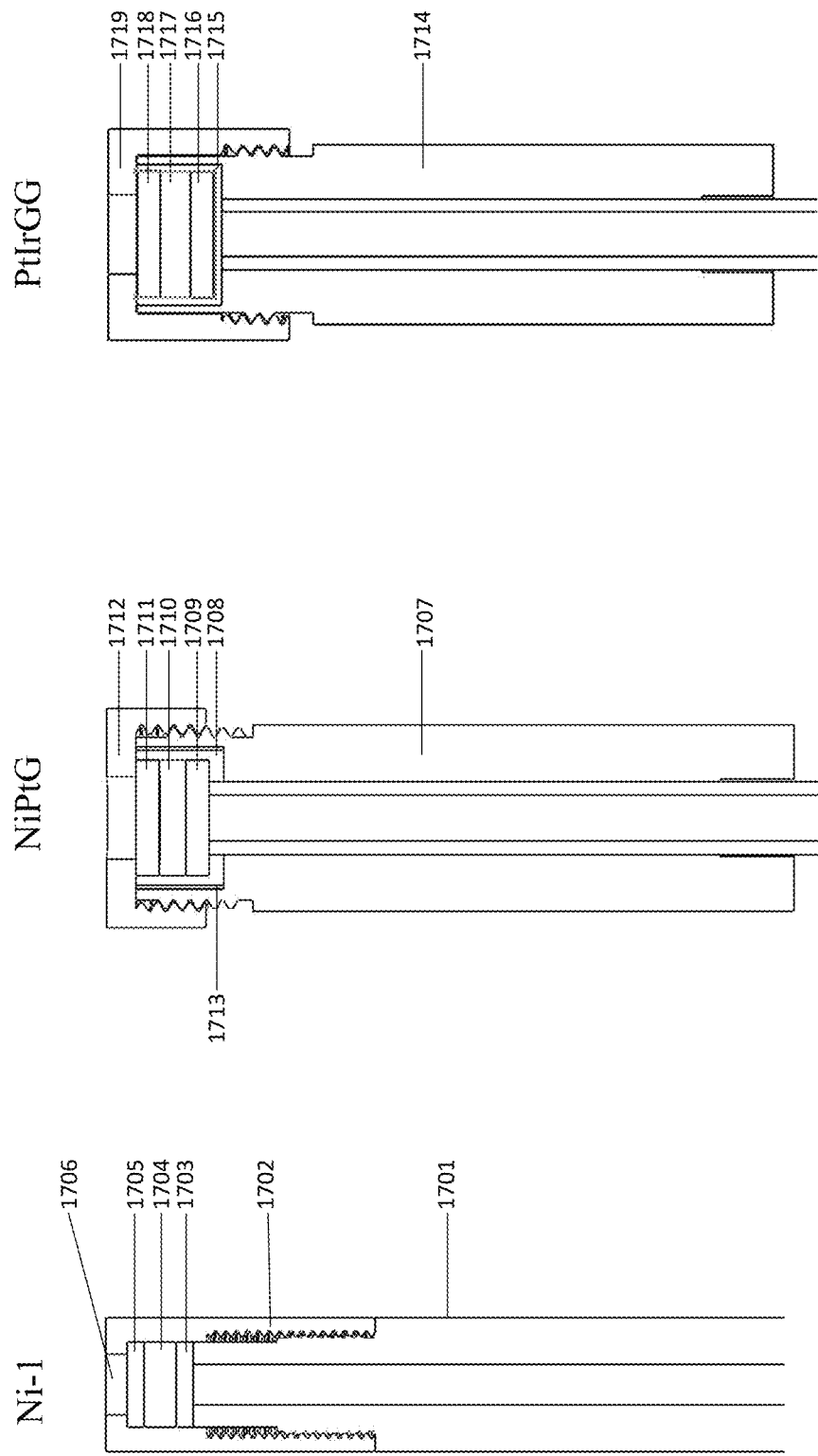

QUANTUM PRINTING NANOSTRUCTURES WITHIN CARBON NANOPORES

RELATED APPLICATIONS

This application is a continuation of U.S. application Ser. No. 17/723,915, filed Apr. 19, 2022, which is a continuation of U.S. application Ser. No. 17/408,821, filed Aug. 23, 2021, now U.S. Pat. No. 11,345,995, which is a continuation of U.S. application Ser. No. 17/122,355, filed Dec. 15, 2020, now U.S. Pat. No. 11,332,825, which is related to and claims the benefit of priority under 35 USC 119(e) to provisional application U.S. Ser. No. 62/948,450, by Christopher J. Nagel, filed on Dec. 16, 2019. The entire teachings of the above applications are incorporated herein by reference.

BACKGROUND OF THE INVENTION

The detection of metals and other elements in materials subjected to harmonic electromagnetic fields in metal baths and other environments has been documented. See, for example, U.S. Pat. Nos. 7,238,297 and 9,790,574 to Christopher Nagel, which are incorporated herein by reference.

The present invention relates to the discovery that carbon matrices can be used to produce nano-deposits, nanostructures, nanowires and nuggets comprising metals using the processes described herein. The processes of the invention include the application of electromagnetic radiation, directly and/or indirectly, to gases, nano-porous carbon, or compositions and combinations thereof, thereby pre-treating the gas, and exposing a carbon matrix to pre-treated gas in an apparatus of the invention to cause metal instantiation, nucleation, growth and/or deposition within the carbon matrix.

SUMMARY OF THE INVENTION

The invention relates to methods of quantum printing and/or instantiating materials, such as metals (e.g., copper, platinum, platinum group metal (PGMs) or precious metals), in nanoporous carbon matrices to form nanowires and other macrostructures, and apparatuses adapted for the methods.

The invention includes processes comprising the steps of contacting a bed comprising nanoporous carbon with an activated gas while applying electromagnetic radiation to the nanoporous carbon for a time sufficient to cause instantiation, including but not limited to nucleation, growth deposition and/or agglomeration, of elemental metal nanoparticles within and/or from carbon nanopores and nano-pore networks and matrices. The process results in nanoporous carbon compositions or matrices characterized by elemental metals deposited within carbon nanopores and agglomerated elemental nanoparticles, creating elemental metal nuggets, nanowires and other macrostructures that can be easily separated from the nanoporous carbon. The processes of the invention have broad applicability in producing elemental metal composition and macrostructures. The invention further relates to the nanoporous carbon compositions, elemental metal nanoparticles and elemental macrostructures produced by the methods of the invention.

The invention further relates to elemental macrostructures and elemental microstructures harvested from such carbon compositions. For example, the invention includes platinum and platinum group metal compositions. The compositions typically comprise internal carbon.

More specifically, the invention includes a process of quantum printing a metal, such as copper, within a nanoporous carbon powder comprising the steps of:
 (i) adding a nanoporous carbon powder into a reactor assembly (RA), as described below,
 (ii) adding a gas free of metal salts and vaporized metals to the reactor assembly;
 (iii) powering the one or more RA coils to a first electromagnetic energy level;
 (iv) subjecting the nanoporous carbon powder to harmonic patterning to deposit elemental metal (e.g., copper) nanostructures.

The process contemplates one or more RA frequency generators in RA coils surrounding a nanoporous carbon bed to establish a harmonic electromagnetic resonance in ultramicropores of the nanoporous carbon powder. The gas can be, for example, air, oxygen, hydrogen, helium, nitrogen, neon, argon, krypton, xenon, carbon monoxide, carbon dioxide or mixtures thereof. Preferably, the nanoporous carbon powder comprises graphene having at least 99.9% wt. carbon (metals basis), a mass mean diameter between 1 μm and 5 mm, and an ultramicropore surface area between about 100 and 3000 $m^2/g$.

The process deposits metal (e.g., copper) atoms in a plurality of discrete rows on the nanoporous carbon powder, thereby forming a carbon-metal interface, which can be $sp^2$ carbon. The ordered nano-deposit array can comprise discrete rows of nano-deposits, wherein the nano-deposits are characterized by a diameter of between about 0.1 and 0.3 nm, and the space between copper deposit rows is less than about 1 nm. The ordered nano-deposit array can be characterized by a carbon rich area and a copper rich area adjacent to the array and the discrete rows can be spaced to form a gradient.

More specifically, the invention includes a reactor assembly comprising:
 (a) A reactor chamber containing a nanoporous carbon material;
 (b) A second porous frit defining the ceiling of the reactor chamber; wherein each porous frit has a porosity that is sufficient to allow a gas to permeate into the reactor chamber and contain a nanoporous carbon material;
 (c) A reactor head space disposed above the reactor cap;
 (d) 2, 3, 4, 5 or more (preferably 5) RA coils surrounding the reactor chamber and/or reactor head space operably connected to one or more RA frequency generators and one or more power supplies;
 (e) 2, 3, 4, 5 or more pairs of RA lamps wherein the pairs of RA lamps are disposed circumferentially around the RA coils and define a space between the pairs of RA lamps and the RA coils;
 (f) An x-ray source configured to expose the reactor chamber to x-rays;
 (g) One or more lasers configured to direct a laser towards (e.g., through or across) the reactor chamber or the gas within the reactor assembly; and
 (h) A computer processing unit (CPU) configured to control the power supply, frequency generator, x-ray source and one or more lasers.

As will be described in more detail below, the gas inlet of the reactor assembly can be in fluid connection with at least one gas supply selected from the group consisting of air, oxygen, hydrogen, helium, nitrogen, neon, argon, krypton, xenon, carbon monoxide, carbon dioxide and mixtures thereof; wherein the gas supply is free of metal salts and vaporized metals; and/or (iii) the gas supply is directed through a gas manifold controlled by mass flow meters.

As will be described in more detail below, the nanoporous carbon powder charged to the reactor assembly can comprise graphene having at least 95% wt. carbon (metals basis), a mass mean diameter between 1 μm and 5 mm, and an ultramicropore surface area between about 100 and 3000 m$^2$/g. The nanoporous carbon powder is preferably characterized by acid conditioning, wherein the acid is selected from the group consisting of HCl, HF, HBr, HI, sulfuric acid, phosphoric acid, carbonic acid, and nitric acid, and a residual water content of less than that achieved upon exposure to a relative humidity (RH) of less than 40% RH at room temperature.

As will be described in more detail below, the reactor assembly comprises a plurality of devices that can impart electromagnetic fields, including x-ray sources, coils, lasers and lamps or lights, including pencil lamps, short wave and long wave lamps. The wavelengths generated by each device (e.g., lamps or lasers) can be independently selected.

As will be described in more detail below, the RA coils can be made from the same or different electrically conducting materials For example, a first RA coil comprises a copper wire winding, a second RA coil comprises a braiding of copper wire and silver wire, and a third RA coil is a platinum wire winding and each RA coil is configured to create a magnetic field and wherein each power supply independently provides AC and/or DC current.

As will be described in more detail below, the reactor assembly is preferably characterized by (i) a first pair of RA lamps configured in a first plane defined by a center axis and a first radius of the reactor chamber, (ii) a second pair of RA lamps configured in a second plane defined by the center axis and a second radius of the reactor chamber and (iii) a third pair of RA lamps configured in a third plane defined by the center axis and a third radius of the reactor chamber. Preferably, each RA lamp is a pencil lamp characterized by a tip substantially equidistant from the central axis and each pair of RA lamps comprises a vertical RA lamp and a horizontal RA lamp. Preferably each pair of lamps is equidistantly spaced around the circumference of the reactor chamber.

As will be described in more detail below, the reactor assembly further comprises an electromagnetic embedding enclosure (E/MEE or EMEE), as defined more specifically below. The E/MEE is typically located along a gas line upstream of the reactor assembly gas inlet. Typically, an electromagnetic embedding enclosure located upstream of the gas inlet comprises:
(a) a gas inlet;
(b) at least one E/MEE pencil lamp positioned below the internal gas line, at least one E/MEE pencil lamp positioned above the internal gas line and at least one E/MEE pencil lamp positioned to the side of the internal gas line;
wherein each E/MEE pencil lamp is independently rotatably mounted, located along the length of the internal gas line, and
the lamps and/or coil(s) are powered by a power supply, preferably the power supply of the reactor assembly;
the gas flow, lamps and/or coil(s) are preferably independently controlled by one or more central processing units, preferably the central processing unit (CPU) of the reactor assembly. Typically, a CPU independently controls powering each E/MEE pencil lamp and a rotation position of each E/MEE pencil lamp.

As will be described in more detail below, the E/MEE housing can be typically closed and opaque, the internal gas line can be transparent and external gas line in fluid connection with the housing outlet and gas inlet can be opaque. Typically, the internal gas line is between 50 cm and 5 meters or more and has a diameter between 2 mm and 25 cm or more.

As will be described in more detail below, the apparatus can have at least 5 E/MEE pencil lamps located along the internal gas line. Each E/MEE pencil lamp can be independently placed such that its longitudinal axis is (i) parallel to the internal gas line, (ii) disposed radially in a vertical plane to the internal gas line, or (iii) perpendicular to the plane created along the longitudinal axis of the internal gas line or along the vertical axis of the internal gas line. Each E/MEE pencil lamp can be independently affixed to one or more pivots that permit rotation between about 0 and 360 degrees with respect to the x, y, and/or z axis wherein (i) the x-axis is defined as the axis parallel to the gas line and its vertical plane, (ii) the y-axis defining the axis perpendicular to the gas line and parallel to its horizontal plane, and (iii) the z-axis is defined as the axis perpendicular to the gas line and parallel to its vertical plane.

As will be described in more detail below, at least one E/MEE pencil lamp can be a neon lamp, at least one E/MEE pencil lamp can be a krypton lamp, and at least one E/MEE pencil lamp can be an argon lamp. It can be desirable to match, or pair, one or more E/MEE pencil lamps with one or more (e.g., a pair) of RA lamps. Accordingly, at least one pair of RA pencil lamps can be selected from the group consisting of a neon lamp, a krypton lamp and an argon lamp.

As will be described in more detail below, the invention includes a process of producing a nanoporous carbon composition comprising the steps of:
(a) initiating a gas flow in a reactor assembly as described herein;
(b) independently powering each RA coil to a first electromagnetic energy level;
(c) powering the one or more RA frequency generators and applying a frequency to each RA coil;
(d) independently powering each RA lamp;
(e) independently powering each laser;
(f) powering the x-ray source; and
(g) subjecting the nanoporous carbon powder to harmonic electromagnetic resonance in ultramicropores of the nanoporous carbon powder to instantiate an elemental metal nanostructure in a nanopore.

The invention also includes a process of producing a nanoporous carbon composition comprising the steps of:
(a) initiating a gas flow in a reactor assembly further comprising an E/MEE, as described herein;
(b) independently powering each RA coil to a first electromagnetic energy level;
(c) powering the one or more RA frequency generators and applying a frequency to each RA coil;
(d) independently powering each RA lamp;
(e) independently powering each laser;
(f) powering the x-ray source; and
(g) subjecting the nanoporous carbon powder to harmonic electromagnetic resonance in ultramicropores of the nanoporous carbon powder to instantiate an elemental metal nanostructure in a nanopore.

The invention also includes a process of instantiating an elemental metal within an ultramicropore of a nanoporous carbon powder comprising the steps of:
(a) initiating a gas flow in a reactor assembly further comprising an E/MEE, as described herein;
(b) independently powering each RA coil to a first electromagnetic energy level;

(c) powering the one or more RA frequency generators and applying a frequency to each RA coil;
(d) independently powering each RA lamp;
(e) independently powering each laser;
(f) powering the x-ray source; and
(g) subjecting the nanoporous carbon powder to harmonic electromagnetic resonance in ultramicropores of the nanoporous carbon powder to instantiate an elemental metal nanostructure in a nanopore.

The invention also includes a process of quantum printing an elemental metal within a nanoporous carbon powder comprising the steps of:
(a) initiating a gas flow in a reactor assembly further comprising an E/MEE, as described herein;
(b) independently powering each RA coil to a first electromagnetic energy level;
(c) powering the one or more RA frequency generators and applying a frequency to each RA coil;
(d) independently powering each RA lamp;
(e) independently powering each laser;
(f) powering the x-ray source; and
(g) subjecting the nanoporous carbon powder to harmonic electromagnetic resonance in ultramicropores of the nanoporous carbon powder to instantiate an elemental metal nanostructure in a nanopore.

As will be described in more detail below, the invention also includes nanoporous carbon powder compositions and metal compositions produced in accordance with the claimed methods and processes.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 3A, FIG. 3B, FIG. 3C, FIG. 3D and FIG. 3E provides five views of coils which can be used in a reactor assembly.

FIG. 6A illustrates a Composite Reactor with a copper body, carbon graphite cup and a carbon graphite cap. FIG. 6B illustrates a Composite Reactor with a carbon graphite body and cap and metal foil boundary.

FIGS. 9A and 9B illustrate macrostructure comprising agglomerated nanoparticles with a nugget morphology. FIGS. 9A and 9B are predominantly copper with a significant amount of surface platinum (Illustration 2). FIG. 9C is an SEM of a platinum-containing macrostructure and clearly depicts instantiation from a carbon pore produced in Illustration 31. FIG. 9D is a copper-containing wire. Ytterbium was also identified in this run. FIG. 9E clearly illustrates the agglomerated nanostructures in a macrostructure.

In FIG. 10E, copper is identified in a bottom banner while carbon is in the top banner. At the interface, the assembly and condensation of copper within the carbon can be seen.

Figure 16B:
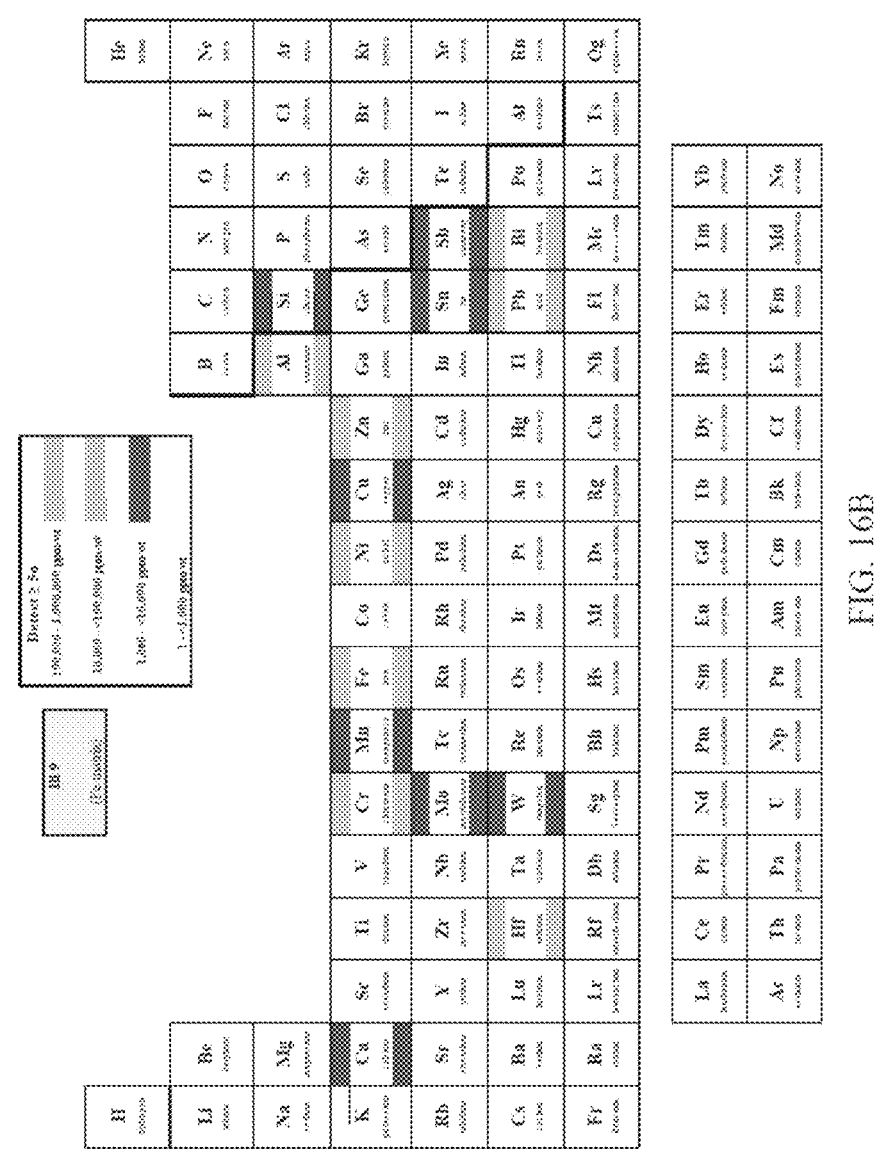
Figure 16C:
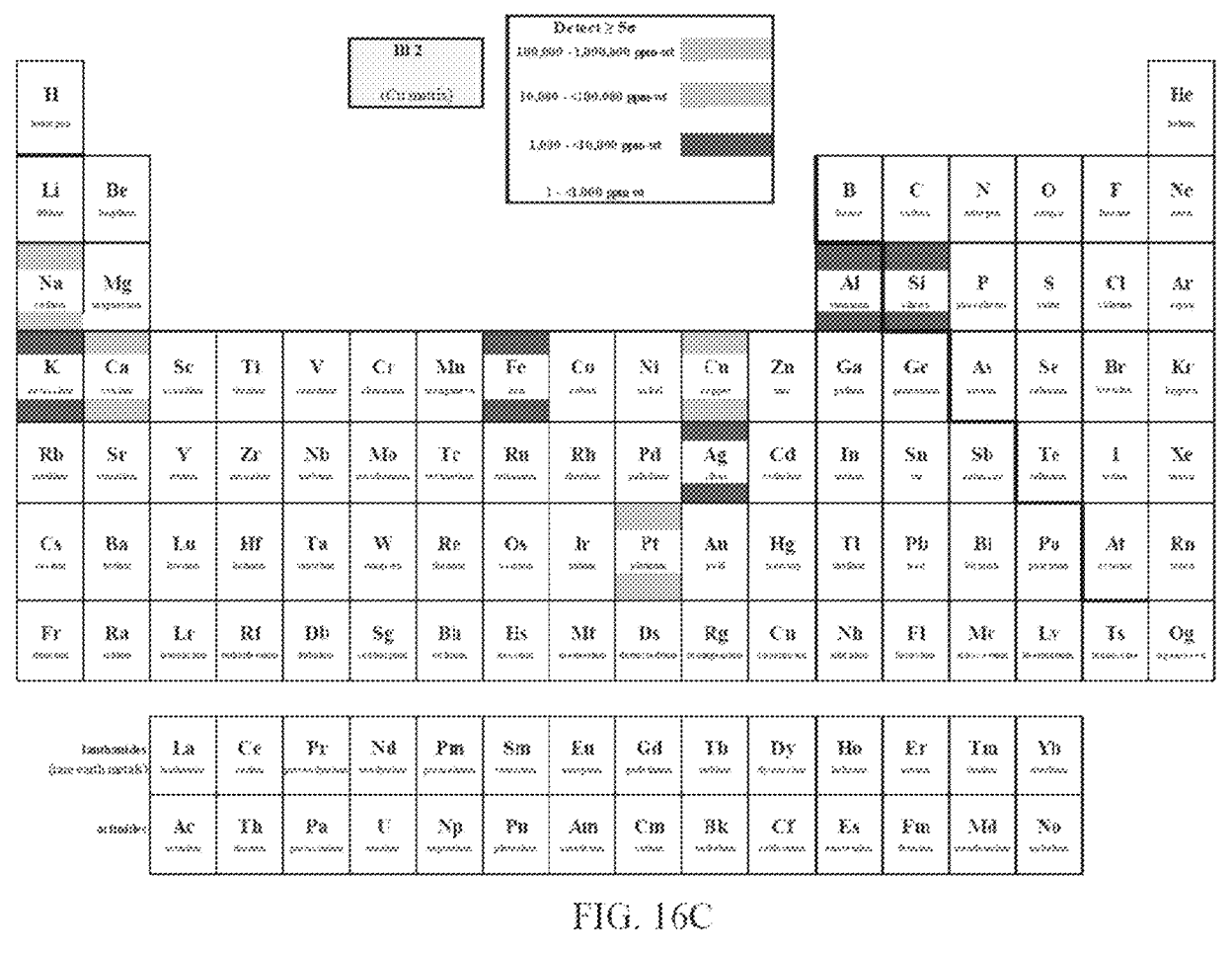
Figure 16D:
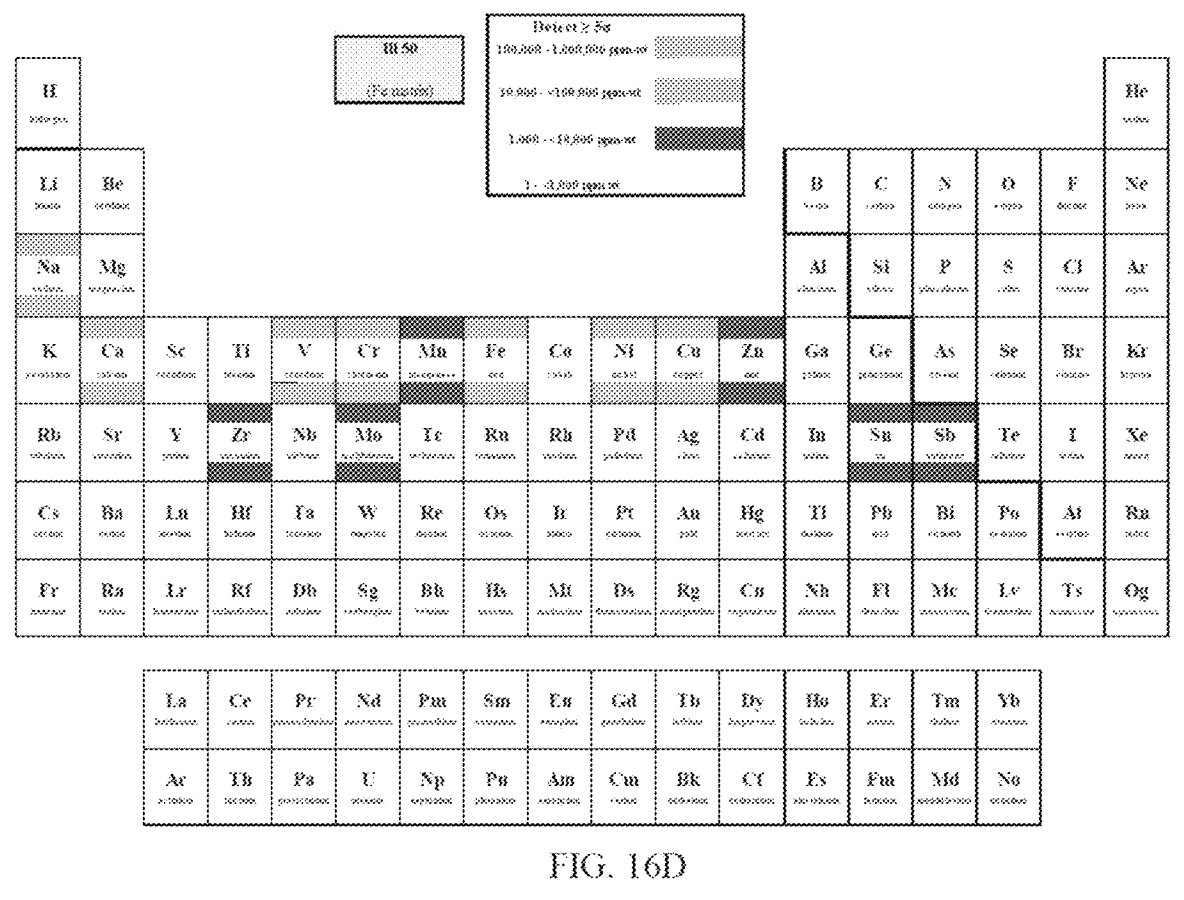
Figure 16E:
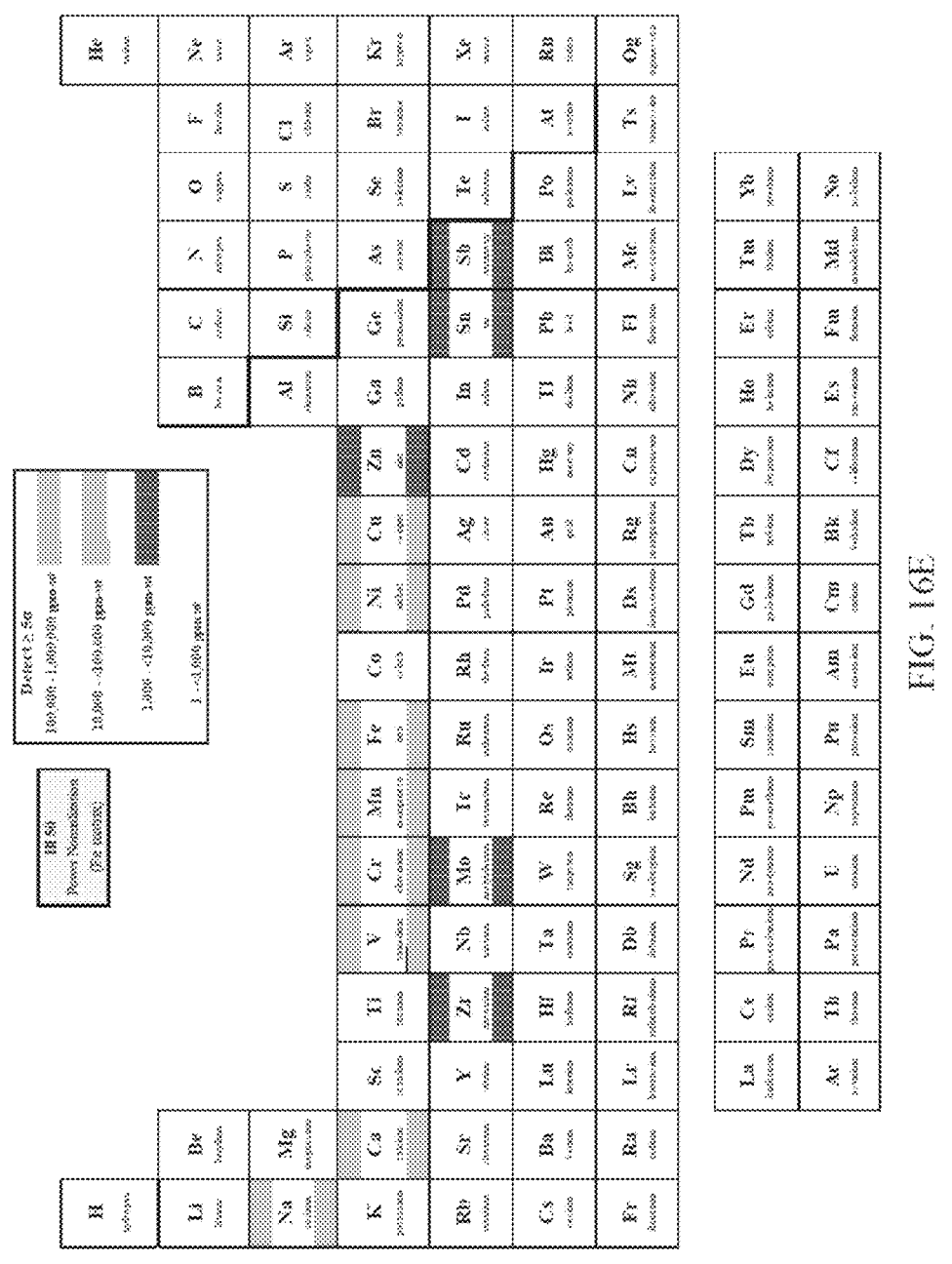

FIG. 16A, FIG. 16B, FIG. 16C, FIG. 16D and FIG. 16E are periodic tables illustrating elements detected in the carbon matrices produced by the processes of the invention and exemplified herein.

FIG. 17A, FIG. 17B and FIG. 17C are illustrations of reactor variations.

DETAILED DESCRIPTION

Figure 1:
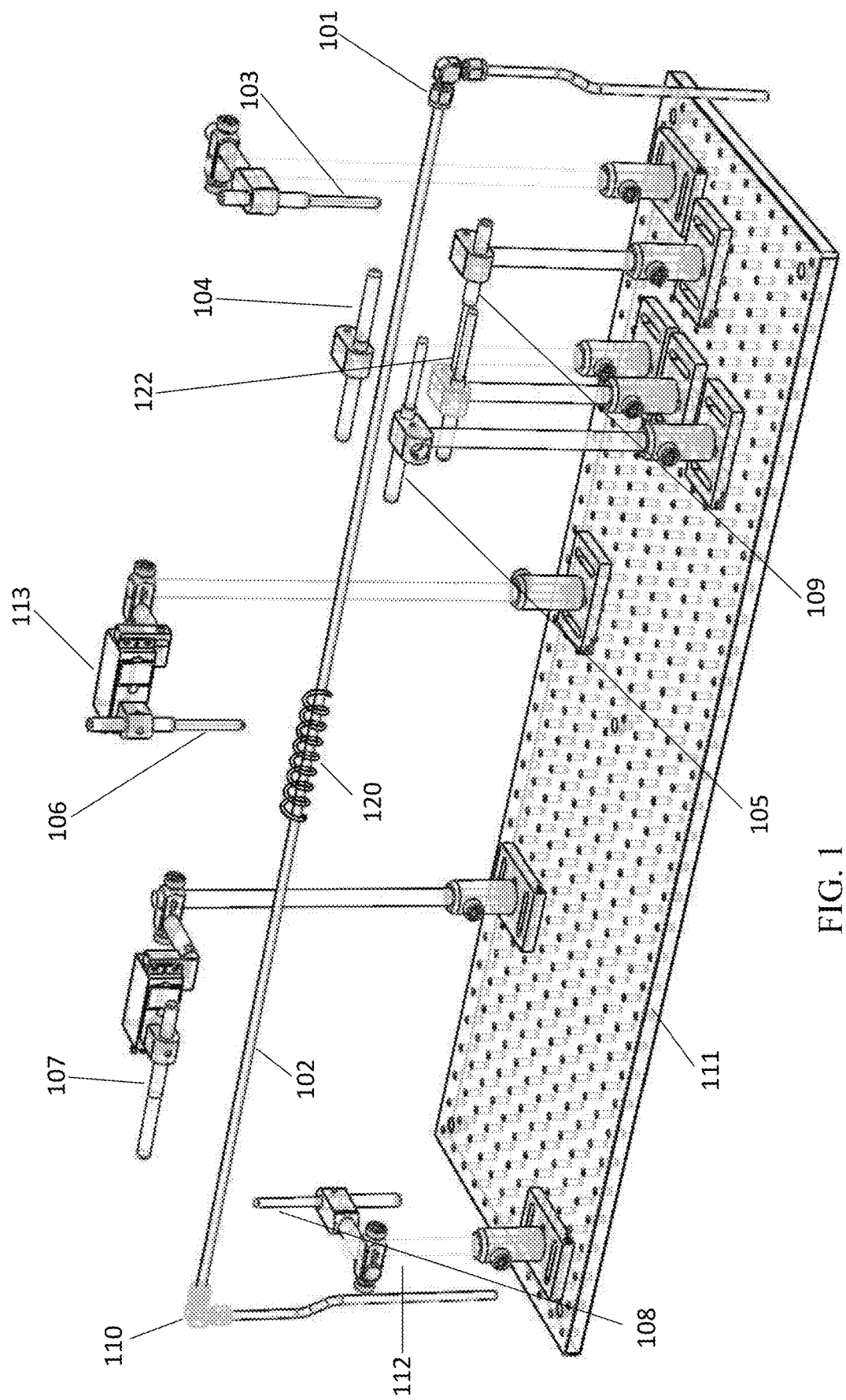
FIG. 1 is a perspective view of an E/MEE of the invention.

The invention relates to methods of instantiating materials, such as metals, in nanoporous carbon powders. The invention includes methods comprising the steps of contacting a bed comprising a nanoporous carbon powder with a gas, and optionally an electromagnetically activated gas, while applying electromagnetic radiation to the nanoporous carbon powder for a time sufficient to cause instantiation, including nucleation and agglomeration, of elemental metal nanoparticles within and/or from carbon nanopores. The process results in a composition comprising a nanoporous carbon powder characterized by (i) elemental metal nanoparticles deposited within carbon nanopores and/or (ii) agglomerated, or aggregated, elemental metal nanoparticles, creating macrostructures such as elemental metal nuggets, nanowires and other macrostructures that can be easily separated from the nanoporous carbon powder. The processes of the invention have broad applicability in producing elemental metal macrostructures. The invention further relates to the nanoporous carbon compositions, elemental metal nanoparticles and elemental metal macrostructures produced by the methods of the invention.

The use of the terms agglomeration and aggregation is not intended to infer a specific order of assembly of the macrostructures. That is, it is not assumed that discrete nanoparticles are formed and then relocate and assemble to form an aggregate, as may be considered common in powder handling with electrostatically assembled products. Rather, without being bound by theory, it is believed that the agglomeration or aggregation occurs as nanoparticles are formed in ultramicropores.

The invention contemplates compositions comprising a nanoporous carbon powder comprising (a) nanopores having disposed therein elemental metal nanostructures and (b) an elemental metal macrostructure wherein the elemental metal macrostructure further comprises internal carbon.

Nanoporous Carbon Powders

Nanoporous carbon powders or nanostructued porous carbons can be used in the processes and methods of the invention. Nanoporous carbon powders or nanostructued porous carbons are also referred to herein as "starting material" or "charge material". The carbon powder preferably provides a surface and porosity (e.g., ultra-microporosity) that enhances metal deposition, including deposit, instantiation and growth. Preferred carbon powders include activated carbon, engineered carbon, graphite, and graphene. For example, carbon materials that can be used herein include graphene foams, fibers, nanorods, nanotubes, fullerenes, flakes, carbon black, acetylene black, mesophase carbon particles, microbeads and, grains. The term "powder" is intended to define discrete fine, particles or grains. The powder can be dry and flowable or it can be humidified and caked, such as a cake that can be broken apart with agitation. Although powders are preferred, the invention contemplates substituting larger carbon materials, such as bricks and rods including larger porous carbon blocks and materials, for powders in the processes of the invention.

The examples used herein typically describe highly purified forms of carbon, such as >99.995% wt. pure carbon (metals basis). Highly purified forms of carbon are exemplified for proof of principal, quality control and to ensure that the results described herein are not the result of cross-contamination or diffusion within the carbon source. However, it is contemplated that carbon materials of less purity can also be used. Thus, the carbon powder can comprise at least about 95% wt. carbon, such as at least about 96%, 97%, 98% or 99% wt. carbon. In a preferred embodiment, the carbon powder can be at least 99.9%, 99.99% or 99.999% wt. carbon. In each instance, purity can be determined on either an ash basis or on a metal basis. In another preferred embodiment, the carbon powder is a blend of different carbon types and forms. In one embodiment, the carbon bed is comprised of a blend of different nano-engineered porous carbon forms. Carbon powders can comprise dopants. Dopants can be measured in the carbon powder starting materials by the same techniques as can measure the elemental metal nanostructures as described below. Applicants believe that metal, semi-metal and non-metal dopants can impact the formation of elemental metal nanostructures.

The carbon powder preferably comprises microparticles. The volume median geometric particle size of preferred carbon powders can be between less than about 1 μm and 5 mm or more. Preferred carbon powders can be between about 1 μm and 500 μm, such as between about 5 μm and 200 μm. Preferred carbon powders used in the exemplification had median diameters between about 7 μm and 13 μm and about 30 μm and 150 μm.

The dispersity of the carbon particle size can improve the quality of the products. It is convenient to use a carbon material that is homogeneous in size or monodisperse. Thus, a preferred carbon is characterized by a polydispersity index of between about 0.5 and 1.5, such as between about 0.6 and 1.4, about 0.7 and 1.3, about 0.8 and 1.2, or between about 0.9 and 1.1. The polydispersity index (or PDI) is the ratio of the mass mean diameter and number average diameter of a particle population. Carbon materials characterized by a bimodal particle size can offer improved gas flow in the reactor.

The carbon powder is preferably porous. The pores, or cavities, residing within the carbon particles can be macropores, micropores, nanopores and/or ultra-micropores. A pore can include defects in electron distribution, compared to graphene, often caused by changes in morphology due to holes, fissures or crevices, corners, edges, swelling, or changes in surface chemistry, such as the addition of chemical moieties or surface groups, etc. For example, variation in the spaces that may arise between layers of carbon sheets, fullerenes or nanotubes are contemplated. It is believed that deposit instantiation preferentially occurs at or within a pore or defect-containing pore and the nature of the surface characteristics can impact the deposit. For example, Micromeritics enhanced pore distribution analysis (e.g., ISO 15901-3) can be used to characterize the carbon. It is preferred that the carbon powder is nanoporous. A "nanoporous carbon powder" is defined herein as a carbon powder characterized by nanopores having a pore dimension (e.g, width or diameter) of less than 100 nm. For example, IUPAC subdivides nanoporous materials as microporous (having pore diameters between 0.2 and 2 nm), mesoporous materials (having pore diameters between 2 and 50 nm) and microporous materials (having pore diameters between 50 nm and 1000 nm). Ultramicropores are defined herein as having pore diameters of less than about 1 nm.

Uniformity in pore size and/or geometry is also desirable. For example, ultramicropores in preferred carbon materials (e.g., powders) account for at least about 10% of the total porosity, such as at least about 20%, at least about 30%, at least about 40%, at least about 50%, at least about 60%, at least about 70%, at least about 80%, or at least about 90%. Preferred carbon materials (e.g., powders) are characterized with a significant number, prevalence or concentration of ultra-micropores having the same diameter, thereby providing predictable electromagnetic harmonic resonances and/or standing wave forms within the pores, cavities, and gaps. The word "diameter" in this context is not intended to require a spherical geometry of a pore but is intended to embrace a dimension(s) or other characteristic distances between surfaces. Accordingly, preferred carbon materials (e.g., powders) are characterized by a porosity (e.g., nanopores or ultramicropores) of the same diameter account for at least about 10% of the total porosity, such as at least about 20%, at least about 30%, at least about 40%, at least about 50%, at least about 60%, at least about 70%, at least about 80%, or at least about 90%.

Measuring adsorption isotherm of a material can be useful to characterize the surface area, porosity, e.g., external porosity, of the carbon material. Carbon powders having a surface area between about 1 $m^2/g$ and 3000 $m^2/g$ are particularly preferred. Carbon powders having an ultramicropore surface area of at least about 50 $m^2/g$, preferably at least about 300 $m^2/g$, at least about 400 $m^2/g$, at least about 500 $m^2/g$ or higher are particularly preferred. Activated or engineered carbons, and other quality carbon sources, can be obtained with a surface area specification. Surface area can be independently measured by BET surface adsorption technique.

Figure 7:
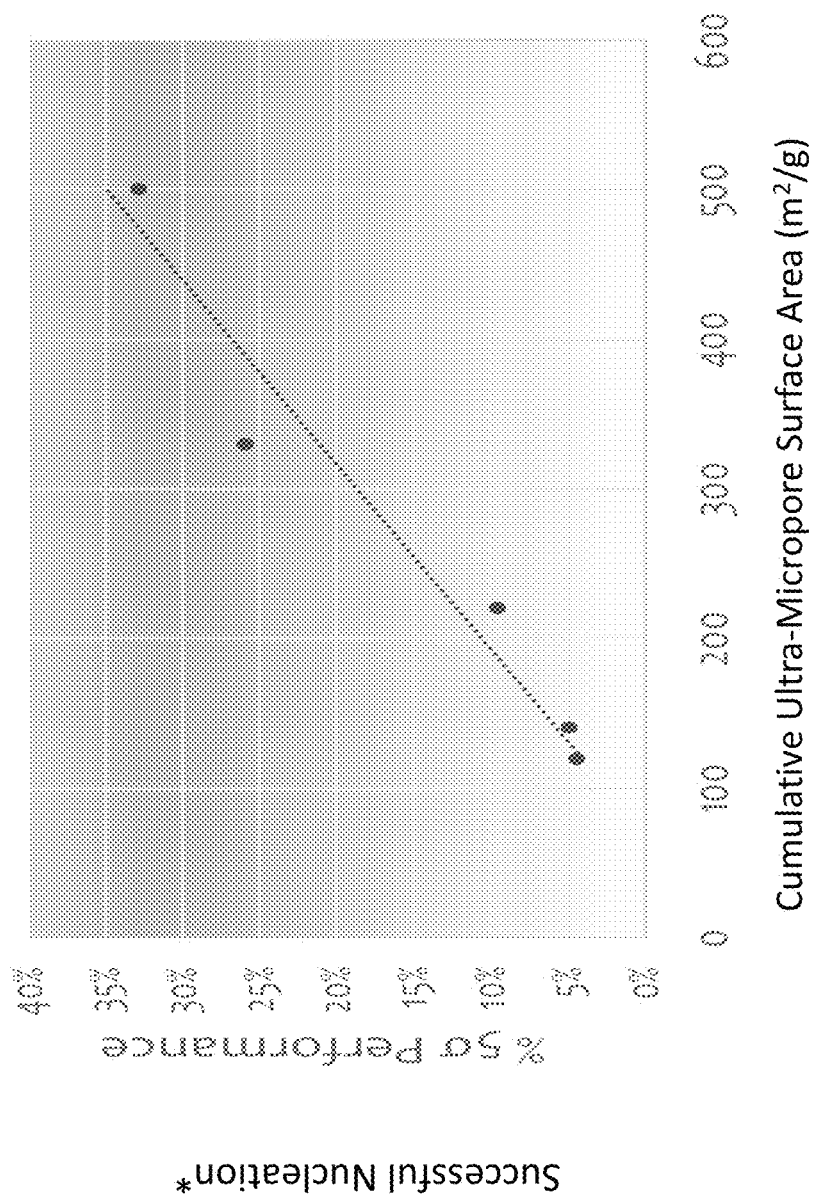
FIG. 7 is a graph illustrating process performance as a function of ultra-micro pore surface area. Performance is defined as a post condition having greater than 5 sigma change in instantiation/nucleation production compared to the pre-condition.

Surface area correlation with metal deposition was explored in a number of experiments. Classical pore surface area measurements, using Micromeritics BET surface area analytical technique with nitrogen gas at 77K (−196.15 C) did not reveal a substantial correlation in the deposition of elements at ≥5σ confidence level, or probability of coincidence. However, a correlation with ultramicropores (pores having a dimension or diameter of less than 1 nm) was observed. Carbon dioxide adsorption at 273K (0 C) was used to assess ultra-microporosity. As shown in FIG. 7, performance, as measured by successful nucleation or instantiation, correlated with ultra-microporosity. Without being bound by theory, instantiation is believed to be correlated to resonating cavity features of the ultra-micropore and ultra-micropore network such as the distance between surfaces or walls. Features of the ultramicropore, can be predicted from ultramicropore diameter as measured by BET, augmented by density function theory (DFT) models, for example. With the aid of machine learning, more precise relationships between ultramicropore size, distribution, turbostratic features, wall separation and diameter and elemental metal nucleation can be established.

Carbon materials and powders can be obtained from numerous commercial providers. MSP-20X and MSC-30 are high surface area alkali activated carbon materials with nominal surface areas of 2,000-2,500 $m^2/g$ and >3,000 $m^2/g$ and median diameters of 7-13 μm and 60-150 μm respectively (Kansai Coke & Chemicals Co). Norit GSX is a steam-washed activated carbon obtained from Alfa Aesar. The purified carbon forms used in the experimental section all exceed ≥99.998$_{wt}$ % C (metals basis).

Modifying the surface chemistry of the carbon can also be desirable. For example, improved performance was observed when conditioning the carbon with an acid or base. Contacting the carbon with a dilute acid solution selected from the group consisting of HCl, HF, HBr, HI, sulfuric acid, phosphoric acid, carbonic acid, and nitric acid followed by washing with water (such as deionized water) can be beneficial. The acid is preferably in an amount less than about 30%, less than about 25%, less than about 20% less than about 15%, less than about 10%, or less than about 5%, preferably less than or equal to 1% vol. The preferred acid for an acid wash is an acid having a pKa of less than about 3, such as less than about 2. After washing, it can be beneficial to subject the carbon to a blanket of an inert gas, such as helium, hydrogen or mixtures thereof. Alternative gases include carbon monoxide, carbon dioxide, nitrogen, argon, neon, krypton, helium, ammonia and hydrogen. The carbon can also be exposed to a base, such as KOH before or after an acid treatment.

Controlling residual water content in the carbon which may include moisture can improve performance. For example, the carbon material can be placed in an oven at a temperature of at least about 100° C., preferably at least about 125° C., such as between 125° C. and 300° C. for at least 30 minutes such as about an hour. The oven can be at ambient or negative pressure, such as under a vacuum. Alternatively, the carbon material can be placed in an oven with high vacuum at a temperature of at least about 250° C., preferably at least about 350° C., for at least one hour, such as at least 2, 3, 4, 5, or 6 hours. Alternatively, the carbon material can be placed in an oven with high vacuum at a temperature of at least about 700° C., preferably at least about 850° C., for at least one hour, such as at least 2, 3, 4, 5, or 6 hours. Alternatively, the water or moisture can be removed by vacuum or lyophilization without the application of substantial heat. Preferably, the water, or moisture, level of the carbon is less than about 35%, 30%, 25%, 20%, 15%, 10%, 5%, such as less than about 2%, by weight carbon. In other embodiments, the carbon can be exposed to a specific relative humidity (RH) such as 5%, 12% RH or 40% RH or 70% RH or 80% RH or 90% RH, for example, at 22° C.

Pre-treatment of the carbon material can be selected from one or more, including all, the steps of purification, humidification, activation, acidification, washing, hydrogenation, drying, chemistry modification (organic and inorganic), and blending. For example, the carbon material can be reduced, protonated or oxidized. The order of the steps can be as described, or two or more steps can be conducted in a different order.

For example, MSP-20X was exposed to an alkali (C:KOH at a molar ratio of 1:0.8), activated at 700° C. for 2 hours, washed with acid and then hydrogenated to form MSP-20X Lots 1000 when washed with HCl and 105 when washed with HNO3. MSP-20X was washed with acid and then hydrogenated to form MSP-20X Lots 1012 when washed with HCl and 1013 when washed with HNO3. Activated carbon powder developed for the storage of hydrogen was HCl acid washed, then subjected to HNO3 washing and hydrogenation to form APKI lots 1001 and 1002, as substantially described in Yuan, *J. Phys. Chem. B*20081124614345-14357]. Poly(ether ether ketone) (PEEK, Victrex 450P) and poly(ether imide) (PEI, Ultem® 1000) was supplied by thermally oxidized in static air at 320° C. for 15 h, and carbonized at the temperature range of 550-1100° C. in nitrogen atmosphere, at the carbon yield of 50-60 wt %. These carbons were then activated by the following procedures: (1) grind the carbonized polymer with KOH at KOH/carbon~1/1-1/6 (w/w), in the presence of alcohol, to form a fine paste; (2) heat the paste to 600-850° C. in nitrogen atmosphere for 2 h; (3) wash and rinse with DI water and dry in vacuum oven. PEEK/PEI (50/50 wt) blend was kindly supplied by PoroGen, Inc. Likewise, the acid washing sequence of Lots 1001 and 1002 was reversed to form APKI lots 1003 and 1004. Universal grade, natural graphite, ~200 mesh was purchased from Alfa Aesar, product number 40799. Graphite lots R and Z were HCl washed and hydrogenated to form R lot 1006 and Z lot 1008, respectively. Alfa Aesar graphite R and Z were nitric acid washed and hydrogenated to form R lot 1007 and Z lot 1009, respectively. MSC-30 (Kansai Coke and Chemicals) was acid washed and then hydrogenated to form MSC30 lots 1010 when washed with HCl and 1011 when washed with HNO3. MSC-30 was exposed to an alkali (C:KOH at a molar ratio of 1:0.8), activated at 700 C for 2 hours, HCl or nitric acid washed and then hydrogenated to form MSC-30 lots 1014 (HCl washed) and 1015 (HNO3 washed), respectively. MSP-20X, MSC-30, Norit GSX and Alfa Aesar R were subjected to purification by MWI, Inc. for MSP-20X Lots 2000 and 2004, MSC-30 Lots 2001, 2006 and 2008, Norit GSX Lots 2005 and 2007, and Alfa Aesar R Lot 2009 respectively. MSP-20X Lot 2000 and MSC-30 2001 were HCl washed and hydrogenated to form MSP-20X Lot 2002 and MSC-30 Lot 2003, respectively. Alfa Aesar R was washed with 1%, 5%, 10%, 15%, 20%, 25%, and 30% HCl (vol.) and then hydrogenated to for R Lot Graphite n % vol HCl, respectively. Purified MSP-20X (Lot 2006) was similarly washed by HCl, nitric acid, HF or $H_2SO_4$ to form MSP-20X 1% HCl, MSP-20X 1% HNO3, MSP-20X 0.4% HF, MSP-20X 0.55% $H_2SO_4$ (Lot 1044), respectively. Purified Norit GSX (Lot 2007) was similarly washed by nitric acid, HF or $H_2SO_4$ to form Norit GSX 1% HNO3 (Lot 1045), Norit-GSX 0.4% HF, Norit-GSX 0.55% $H_2SO_4$, respectively. Purified MSC30 (Lot 2008) was similarly washed by HCl and $H_2SO_4$ to form MSC30 1% HCl, and MSC30 5% $H_2SO_4$. Purified MSP20X (Lot 2006), Norit GSX (Lot 2007) and MSC30 (Lot 2008) were hydrogenated. Purified MSP-20X, Norit GSX and MSC30 were washed with 1% HCl using methanol as a wetting agent. APKI-S-108 Lots 1021-1024 were recycled. The Ref-X Blend is a 40% Alfa Aesar R:60% MSP-20X (lot 2006) 850° C. desorb then $CO_2$ exposure at 138 kPa (20 psi) for 5 days.

The carbon can be recycled or reused after the metal deposit has been recovered from the process. In recycling the carbon, the carbon can optionally be subjected to an acid wash and/or water removal one or more times. In this embodiment, the carbon can be reused one or more times, such as 2, 3, 4, 5, 10, 15, 20, or about 25 or more times. The carbon can also be replenished in whole or in part. It has been discovered that recycling or reusing the carbon can enhance metal nanostructure yields and adjust nucleation characteristics enabling change in element selectivity and resultant distributions. Thus, an aspect of the invention is to practice the method with recycled nanoporous carbon powder, e.g., a nanoporous carbon powder that has been previously subjected to a method of the invention one or more times.

Nanoporous Carbon Compositions and Metal Deposits

The nanoporous carbon compositions produced by the processes described herein possess several surprising and unique qualities. The nanoporosity of the carbon powder is generally retained during processing and can be confirmed, for example, visually with a scanning electron microscope or by BET. Visual inspection of the powder can identify the presence of elemental nanostructures residing within and surrounding the nanopores. The nanostructures are typically elemental metals. Visual inspection of the powder can also identify the presence of elemental macrostructures residing within and surrounding the nanopores. The macrostructures are typically elemental metals and often contain interstitial and/or internal carbon.

The metal nanostructures and/or metal macrostructures (collectively, "metal deposits") produced by the process can be isolated or harvested from nanoporous carbon compositions. The metal deposits of the invention also possess several surprising and unique qualities.

Typically, the porosity of the nanoporous carbon compositions will be at least about 70% of the porosity attributed to ultramicropores of the nanoporous carbon powder starting, or charge, material and having a total void volume that is about 40% or more of the bulk material volume. The pores, or cavities, residing within the carbon particles can be macropores, micropores, nanopores and/or ultra-micropores. A pore can include defects in electron distribution, compared to graphene, often caused by changes in morphology due to holes, fissures or crevices, edges, corners, swelling, dative bonds, or other changes in surface chemistry, such as the addition of chemical moieties or surface groups, etc. For example, the spaces that may arise between layers of carbon sheets, fullerenes, nanotubes, or intercalated carbon are contemplated. It is believed that deposit and instantiation preferentially occurs at or within a pore and the nature of the surface characteristics can impact the deposit. For example, Micromeritics enhanced pore distribution analysis (e.g., ISO 15901-3) can be used to characterize the carbon. It is preferred that the carbon powder is nanoporous.

The products can also be characterized by uniformity in pore size and/or geometry. For example, ultramicropores can account for at least about 10% of the total porosity, such as at least about 20%, at least about 30%, at least about 40%, at least about 50%, at least about 60%, at least about 70%, at least about 80%, or at least about 90%. Carbon materials (e.g., particles or powders) can be characterized with a significant number, prevalence or concentration of ultramicropores having the same dimension (e.g., width or diameter) or the same distribution of pore dimensions or dimensions characterizing the pore network, thereby providing predictable electromagnetic harmonic resonances within the pores. Accordingly, carbon materials (e.g., powders) can be characterized by a porosity (e.g., nanopores or ultramicropores)) of the same diameter or diameter distribution account for at least about 10% of the total porosity, such as at least about 20%, at least about 30%, at least about 40%, at least about 50%, at least about 60%, at least about 70%, at least about 80%, or at least about 90%.

Measuring surface area of a material can be useful to characterize the porosity, e.g., external porosity, of the carbon material. The carbon powder preferably is characterized by a high surface area. For example, the nanoporous carbon powder can have a general surface area of at least about 1 $m^2/g$ or at least about 200 $m^2/g$, at least about 500 $m^2/g$ or at least about 1000 $m^2/g$. The ultra-micropore surface area can be at least about 50 $m^2/g$, such between 100 $m^2/g$ and 3,000 $m^2/g$. The ultramicropore surface area of at least about 50 $m^2/g$, preferably at least about 300 $m^2/g$, at least about 400 $m^2/g$, at least about 500 $m^2/g$ or higher are particularly preferred. Activated carbons, and other quality carbon sources, can be obtained with a surface area specification. Surface area can be independently measured by BET surface adsorption technique.

Carbon materials (e.g., powders and particles) include activated carbon, engineered carbon, natural and manufactured graphite, and graphene. For example, carbon materials that can be used herein include microparticles, graphene foams, fibers, nanorods, nanotubes, fullerenes, flakes, carbon black, acetylene black, mesophase carbon particles, microbeads and, grains. Typically, a powder can be sufficiently dry to be flowable without substantial aggregation or clumping or it can be humidified and caked, such as a cake that can be broken apart with agitation. Although powders are preferred, the invention contemplates substituting larger carbon materials, such as bricks and rods, for powders in the processes of the invention.

Typically, the $sp^2$-$sp^3$ character of the carbon composition (e.g., the internal carbon) changed as carbon rich to metal rich structures was traversed, as determined by TEM-EELs (transition electron microscopy-electron energy loss spectroscopy).

The nanoporous carbon compositions are typically characterized by the presence of "detected metals," or a "reduced purity," as compared to the nanoporous carbon powder starting material, as determined by X-ray fluorescence spectrometry (XRF) using standardized detection methods. ED-XRF and WD-XRF can be used. In addition, Energy Dispersive Spectroscopy (EDS or EDX or HR-Glow Discharge Mass Spectrometry (GD-MS) as well as Neutron Activation Analysis (NAA), Parr Bomb Acid Digestion with ICP-MS, PIXE and GD-OES can be used in addition, in the alternative or in any combination. For example, in the experimentation described below, carbon materials with a purity of at least 99.9% by weight was used as an initial starting material and most typically at least 99.99% by weight on a metals basis. Such carbon materials can comprise small (e.g., <1% by weight) metals, or dopants. Such pre-existing metals, including dopants, are not included within the "detected metals" definition. Products of the invention were characterized by deposited elemental metal nanostructures and nano-deposits that were detected by XRF, EDS/EBSD and other methods. The resulting carbon powder products characterized by such metal deposits can be characterized as having a "reduced purity." The term, "detected metals," is defined herein to exclude any element or material introduced by the carbon starting material, gas supply, gas line, or reactor assembly, including the reactor frits, cup and/or cap (collectively "reactor components"). By way of an example, where the reactor is selected from a copper cup which contains the carbon material, and the process results in a mass reduction of 1 μg of copper from the cup, then a "detected metal" excludes 1 μg copper. In addition, the elemental composition(s) of the reactor components and reactor feed gas can be compared to the detected metals. Where the reactor components differ in elemental composition, the detection of one or more metals not present in any of the reactor components supports the conclusion that the detected metal is not derived from the reactor components. For example, where the detected metal contains 5 ppm wt Mo or 4 ppm wt W in addition to copper within an elemental metal macrostructure, and the reactor cup is 99.999% copper with no detectable Mo or W, the copper identified within the detected metal can also be attributed to the total detected metals. Typically, at least about 1% of the total non-carbon elements contained within the carbon composition are detected metals or components, on a mass basis. Preferably, detected metals are at least about 2%, 3%, 4%, 5%, 6%, 7%, 8%, 9%, 10%, 20%, 30%, 40%, 50%, 60% or 70% or more of the total non-carbon elements contained within the carbon composition on a mass basis.

In a preferred embodiment, the nanoporous carbon composition comprises at least 0.1 ppm detected metal, preferably between about 0.1 ppm-100 ppm, such as between about 50 ppm-5000 ppm, or between about 0.1% wt-20% wt, such as at least about >0.1% wt detected metals. Preferably the detected metals are at least 1 ppm of the nanoporous carbon composition. The detected metals can be, or include, the elemental metal nanostructures (or, simply metal nanostructures). The detected metals exclude metal ions or salts.

Carbon compositions subjected to the methods of the invention result in an altered carbon isotopic ratio. Thus, the invention includes methods of altering the carbon isotopic ratio comprising eh steps described below and compositions wherein the carbon isotopic ration has shifted.

The nanoporous carbon composition preferably comprises elemental metal nanostructures. The metal nanostructures preferably comprise one or more metals selected from the group consisting of transition metals (Group Sc, Y, Lu; Group IVB: Ti, Zr, Hf; Group VB: V, Nb, Ta; Group VIB: Cr, Mo, W; Group VIIB: Mn, Re Group VIIIB: Fe, Ru, Os, Co, Rh, Ir, Ni, Pd, Pt; Group IB: Cu, Ag; Group IIB: Zn, Cd, Hg), alkaline earth metals (Group Ia: Li, Na, K, Rb, Cs), alkali metals (Group IIA: Be, Mg, Ca, Sr, Ba), lanthanides (La, Ce, Pr, Nd, Sm, Eu, Gd, Tb, Dy, Ho, Er, Tm and Yb), and light metals (B, Al, Si, S, P, Ga, Ge, As, Se, Sb, Te, In, Tl, Sn, Pb, Bi). Platinum group metals and rare earth elements are preferred. Precious metals and noble metals can also be made. Other nanostructures comprising Li, B, Si, P, Ge, As, Sb, and Te can also be produced. Typically, the elemental metal nanostructures exclude metal ions.

Figure 10A:
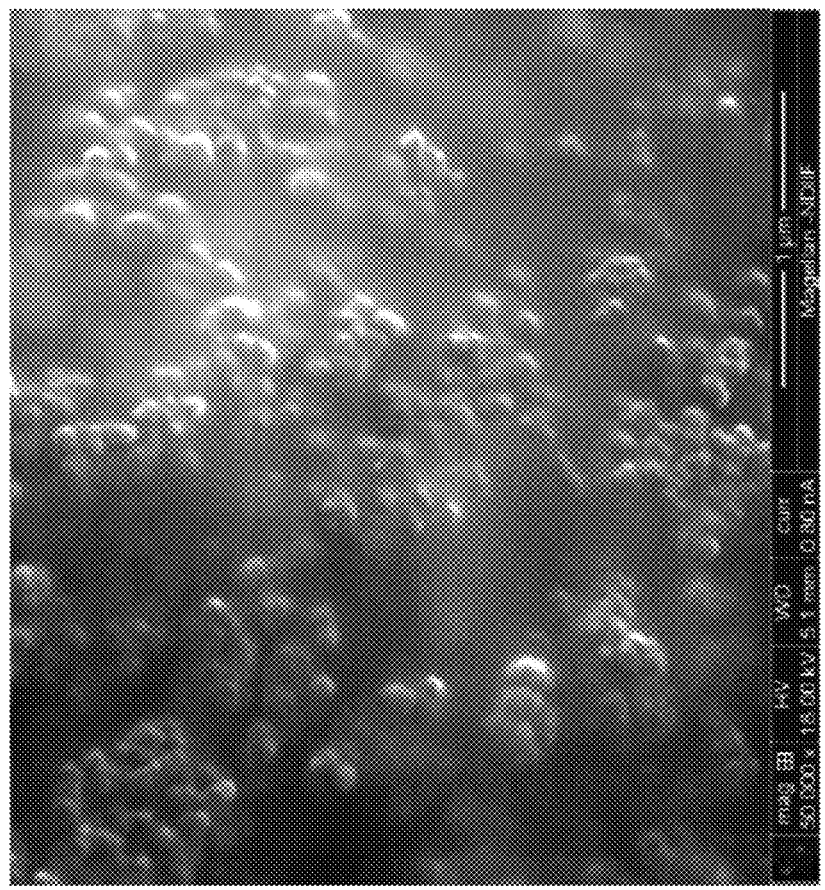
FIG. 10A illustrates agglomeration.
Figure 10B:
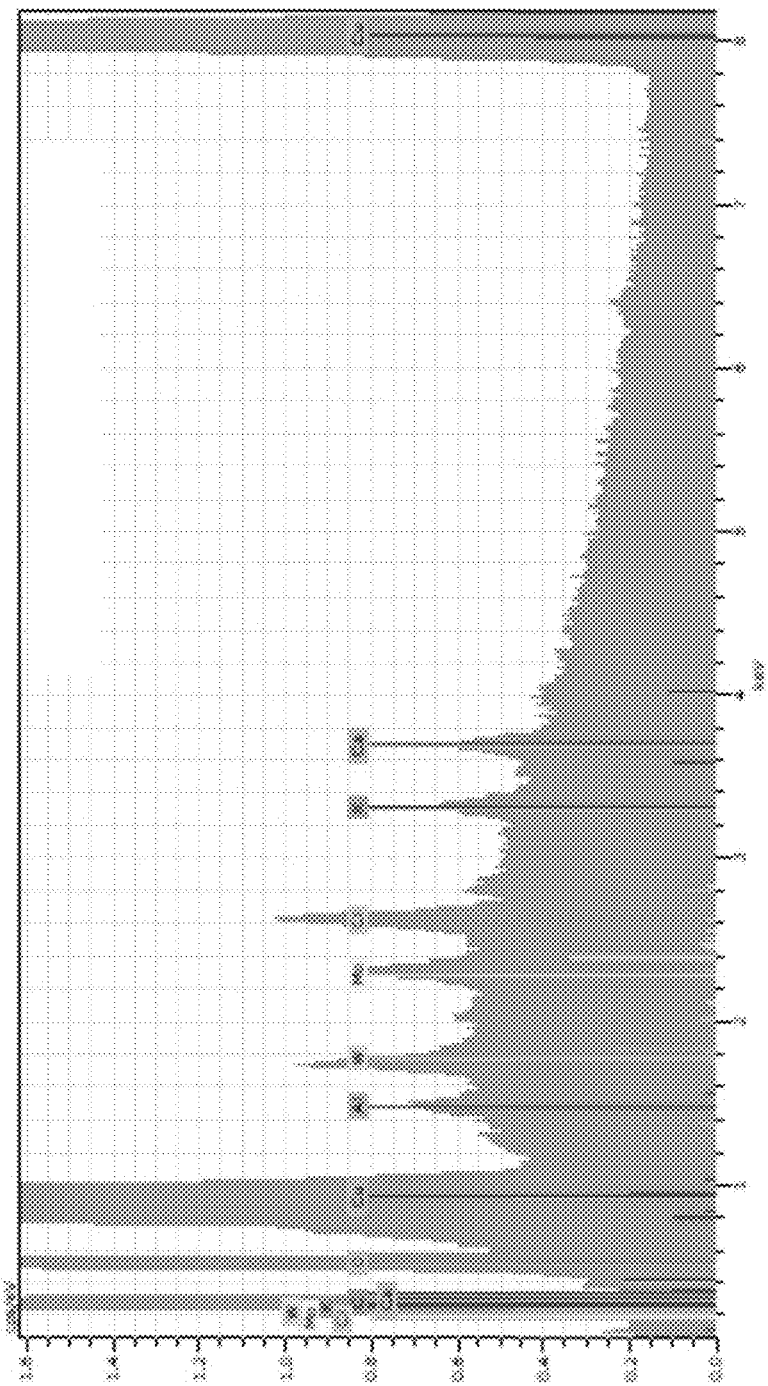
FIG. 10B illustrates the diversity of elemental metals that can be detected in a metal macrostructure. This sample was isolated from Illustration 2.

The nanoporous carbon composition can also comprise non-metal nanostructures and/or macrostructures. For example, the processes of the invention can instantiate or quantum print gases, such as hydrogen, oxygen, helium, neon, argon, krypton and xenon. Additionally or alternatively, the invention can instantiate or quantum print materials containing carbon, oxygen, nitrogen, sulfur, phosphorous, selenium, hydrogen, and/or halides (e.g., F, Cl, Br and I). Nanoporous carbon compositions further comprising metal oxides, nitrides, hydrides, and sulfides such as copper oxide, molybdenum sulfide, aluminum nitride have been identified. Therefore, small inorganic molecules or compounds (e.g., molecules comprising several metal atoms, e.g., 2, 3, 4, 5, 6, 7, 8, 9 or 10 atoms) can be instantiated or printed using the processes of the invention. Examples of such small molecules include carbides, oxides, nitrides, sulfides, phosphides, halides, carbonyls, hydroxides, hydrates including water, clathrates, clathrate hydrates, and metal organic frameworks (FIG. 14A, FIG. 14B, FIG. 14C, FIG. 14D). FIG. 10A is an SEM close-up of a macrostructure isolated from Illustration 2. FIG. 10B provides an example of the detected elemental diversity of the macrostructure typical of products produced by the processes. Thus, the invention relates to metal macrostructures characterized by 3, 4, 5, 6, 7, 8, 9, 10 or more elemental metals. Preferred metal macrostructures comprise a preponderance of an elemental metal. A metal is "preponderant" within a macrostructure where the elemental weight content is substantially greater than one, two or more, or all of the other detected metals. For example, at least about 50%, 60%, 70%, 80%, 90% or more of the macrostructure comprises a preponderant elemental metal. Macrostructures with a preponderance of copper, nickel, iron, and molybdenum, have been isolated. Preferred macrostructures comprise a preponderance of a single element such as >95% copper, >95% Ni, >90% Mo, >90% Pt, and the like. Preferred macrostructures can also comprise a preponderance of 2 or more additional elemental metals. As also can be seen from FIG. 10B, the main, or preponderant, metal is copper. Preferred macrostructures comprise a preponderance of nickel, molybdenum and 3 or more additional elemental metals. Preferred macrostructures comprise a preponderance of iron and molybdenum and 3 or more additional elemental metals. Preferred macrostructures comprise a preponderance of copper and tungsten and 3 or more additional elemental metals. Preferred macrostructures comprise preponderance of nickel, tungsten and 3 or more additional elemental metals. Preferred macrostructures comprise (i) platinum and 3 or more additional elemental metals, (ii) palladium and 3 or more additional elemental metals, (iii) osmium and 3 or more additional elemental metals, or (iv) rhodium and 3 or more additional elemental metals. It can be desirable, for the purposes of characterizing the elemental composition of a macrostructure to normalize the data against the preponderant metal. For example, XRF-spectra reported in this application are typically normalized against the preponderant metal (e.g., copper, nickel, iron or molybdenum). Accordingly, it is an aspect of the invention to characterize the elemental composition of a metal macrostructure normalized against the most preponderant metal.

FIG. 10A is an SEM close-up of a macrostructure isolated from Illustration 2. FIG. 10B provides the elemental diversity of the macrostructure. FIG. 10B provides an XRF spectra that is typical of the invention.

Figure 10C:
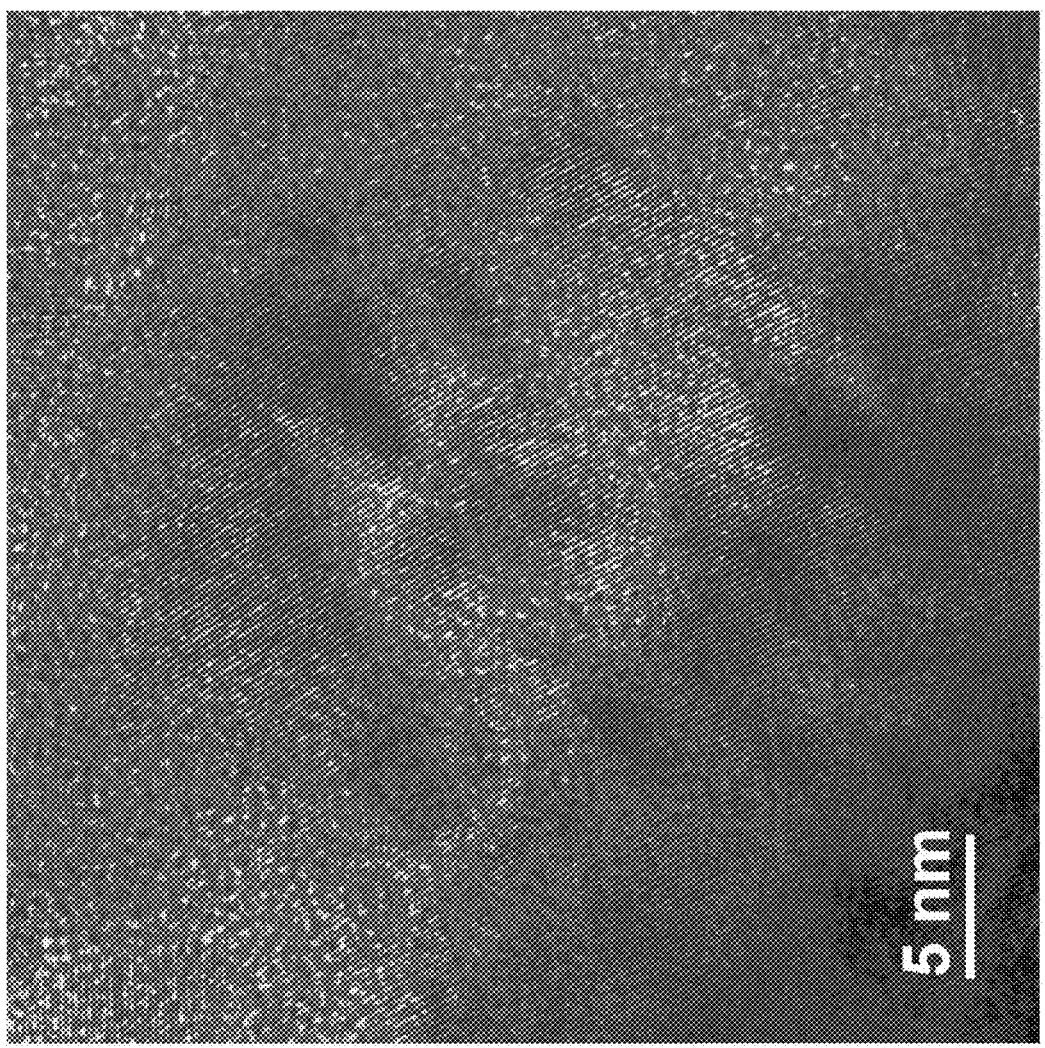
FIG. 10C is an image of the macrostructure product isolated from Illustration 2. The entire image is approximately 40 nm by 40 nm. The yellow, or lighter areas, at the top of the figure are predominantly carbon (internal to the macrostructure) while the blue or darker areas at the lower left corner are predominantly copper. The image suggests assembly and condensation of copper on and within the carbon.

FIG. 10C is a Titan TEM image showing sub-nanoscale structures, unique to the methods. Evidence of anisotropic copper growth originating from a carbon nano-reactor cavity (circle). Note the finger-like tendrils near the carbon/copper interface. These patterns are not found in typical oxygen-free high-conductivity copper (OFHC). Thus, the invention includes a nanoporous carbon composition and metal deposits comprising a copper characterized by anisotropic tendril morphology at a carbon-copper interface.

Figure 10D:
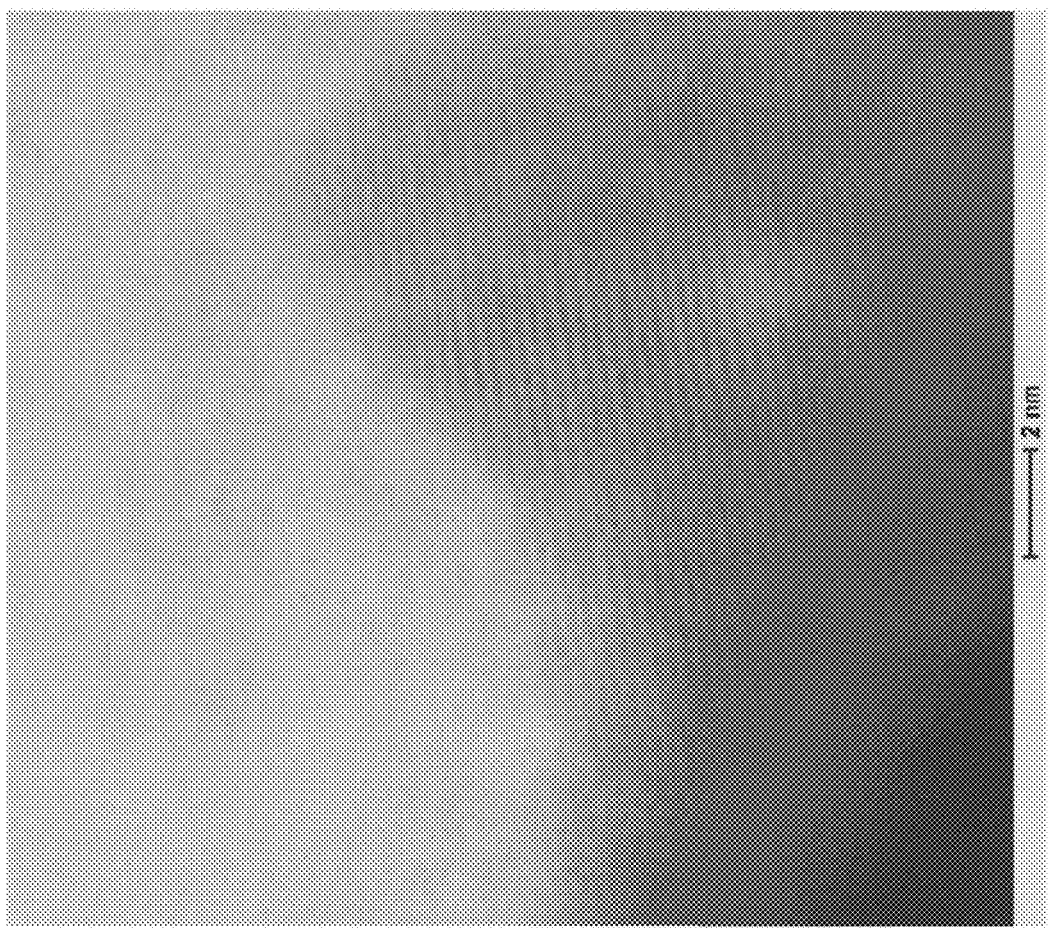
FIGS. 10D and 10E are Titan TEM images of the carbon copper interface. Note the scales. Yellow or the lightest color depicts carbon. Rows of red (or medium gray) copper atoms can be identified in the center of the image in FIG. 10D and a lighter carbon "hole" can be identified in the lower right quadrant. Copper rich carbon regions can be seen in red (medium grey), for example in the lower left quadrant of FIG. 10D. The bottom left corner is blue (or dark grey) and detects high purity copper in a macrostructure of the invention.
Figure 10E:
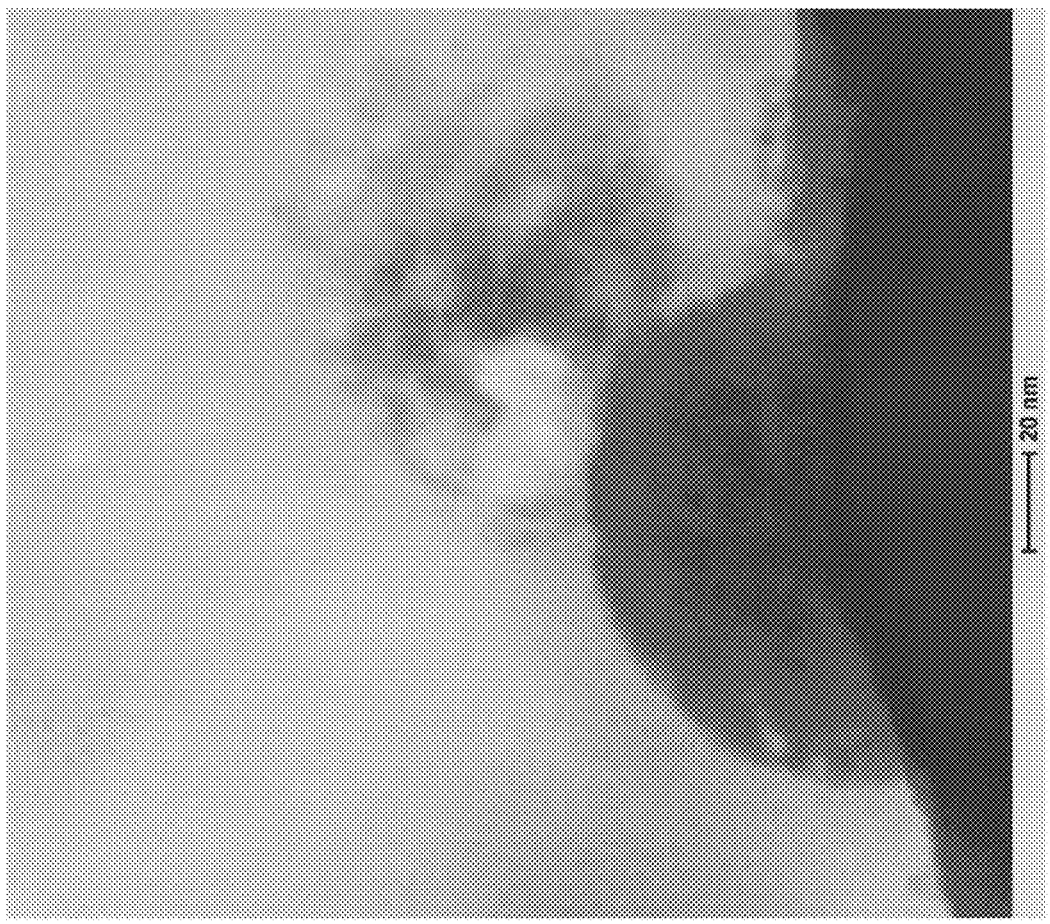

FIGS. 10D and 10E are Titan TEM images of a carbon-copper interface of this copper macrostructure. Note the nanometer scales. Yellow, or the lightest color in black and white, depicts carbon. Rows of red copper atoms can be identified in the center of the image in FIG. 10D and a lighter carbon "hole" can be identified in the lower right quadrant. Copper-rich carbon regions can be seen in red, or a grayer shade in black and white, for example in the lower left quadrant of FIG. 10D. The bottom left corner is blue, or black in black and white, and detects high purity copper. In FIG. 10E, copper is identified in a bottom banner while carbon is in the top banner and a gradient of carbon and copper appears in the center. At the interface, the assembly and condensation of copper within the carbon can be seen. It is clear from these images that the metal nanostructures comprise internal carbon. Therefore, the invention includes elemental metal nanostructures and macrostructures comprising internal carbon. It has been found that the carbon in the metal- or copper-rich regions (or otherwise at the carbon-metal interface) are $sp^2$ carbon or graphite-like. The carbon appears to be more amorphous in other regions, as detected by EELS and a K2 Summit camera (Gatan). It is also clear from these images that ordered rows, or an array, of metal or copper atoms are deposited in the carbon, much like one would see from a printer. Thus, the invention further includes methods of quantum printing elements within a nanoporous carbon powder and a nanoporous carbon powder characterized by discrete rows of elemental metal atoms, such as copper. The copper island region that is shown in FIG. 10E was aligned with a CuO standard. Thus, the invention further includes elemental metal (e.g., copper, platinum, platinum group metal or precious metal) nanostructures further comprising CuO and carbon, particularly $sp^2$ carbon.

The processes of the invention result in a nanoporous carbon composition comprising an ordered metal nano-deposit array wherein the metal nano-deposits are characterized by a diameter of less than 1 nm, preferably between about 0.1 and 0.3 nm, and the space between the metal deposit rows is less than about 1 nm, preferably between about 0.1 and 0.3 nm. The nanoporous carbon composition comprising the ordered array is preferably characterized by a carbon rich area and/or a metal (e.g., copper) rich adjacent to the array. For example, the array can be located between a carbon-metal (e.g., copper) interface. The array can be identified and characterized by tunneling electron microscopy (TEM). Typically, the TEM, and other microscopy devices, are used in accordance with the manufacturer's instructions. The metal nano-deposit array is presented (or located) on a carbon substrate wherein the carbon substrate preferably comprises $sp^2$ carbon. The term "nano-deposits" is intended to embrace nanostructures of less than about 1 nm and includes discrete atoms.

The processes of the invention result in a nanoporous carbon composition comprising a carbon-metal (e.g., copper) gradient wherein metal (e.g., copper) nanostructures are deposited on a carbon substrate in gradient at a carbon-metal interface. The carbon substrate preferably comprises $sp^2$ carbon. The gradient is preferably about 100 nm, or about 50 nm or less in width, such as less than about 10 nm in width. The gradient is defined by an increasing concentration of metal from a substantially pure carbon region to a substantially carbon-free region. The metal region can be characterized by an elemental composition consistent with the metal nano-deposits described herein.

Figure 10F:
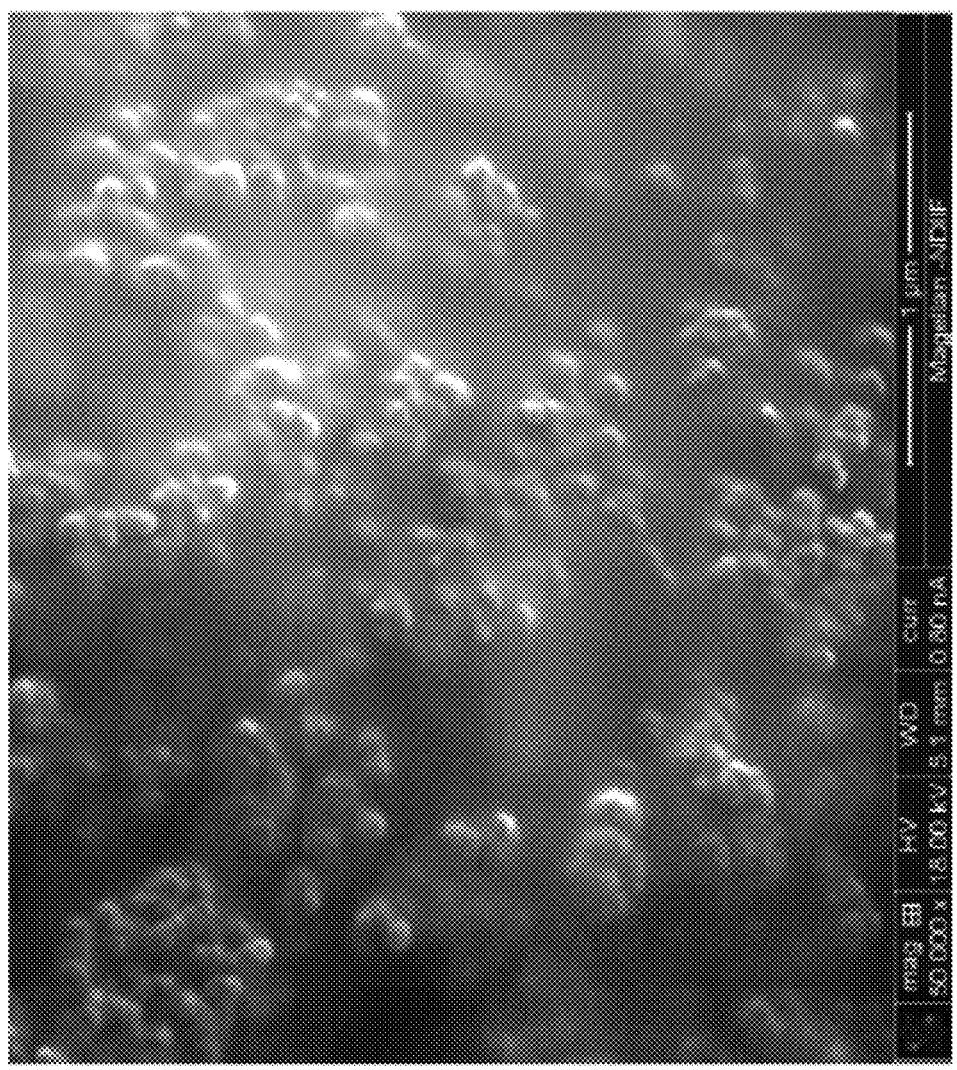
FIG. 10F is a Focused Ion Beam (FIB) slice of a copper nugget isolated from Illustration 2. Note the internal voids.

FIG. 10F is an image of a slice of a nugget isolated from Illustration 2. Note the internal voids, carbon structures and nucleation sites (the pocket in the lower left quadrant along the nugget boundary).

Figure 10G:
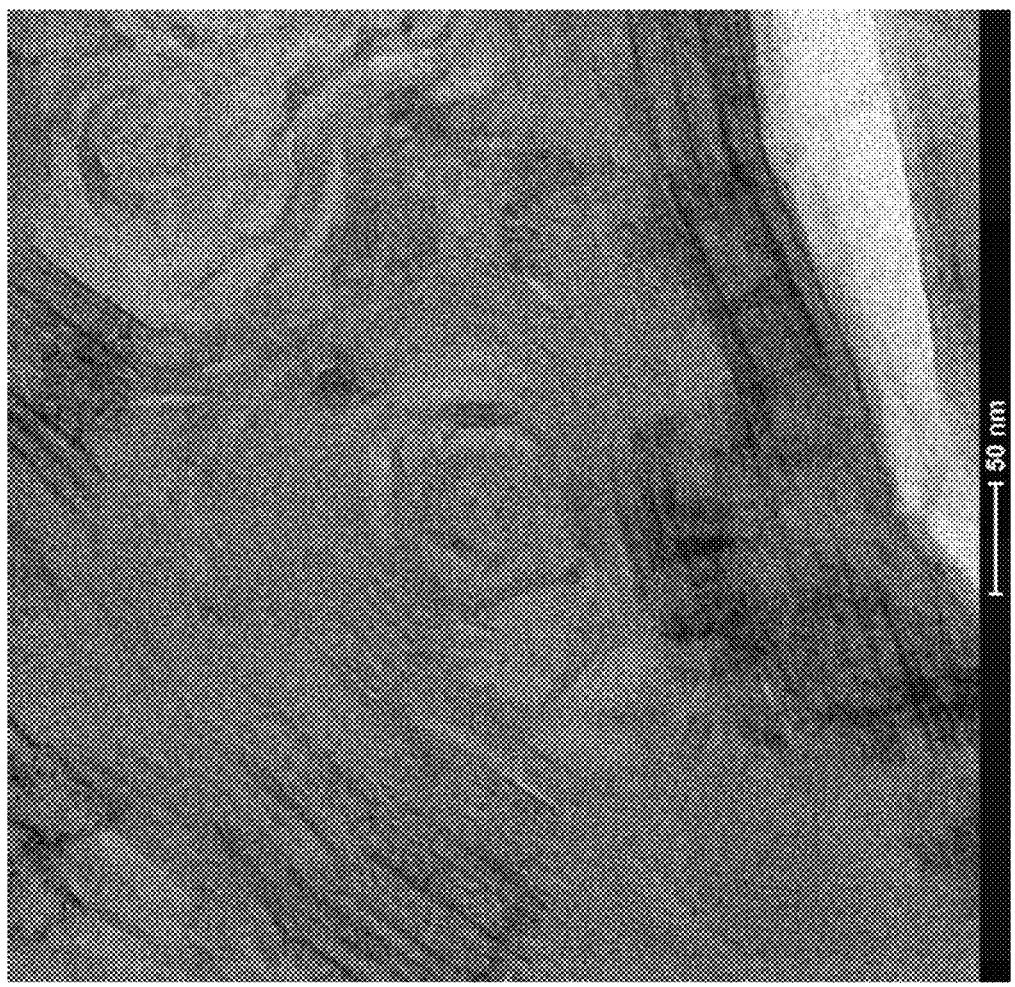
FIG. 10G illustrates patterned growth, e.g., rows, contours, rings and/or circles, the latter resembling rings on a cut tree stump, on a macroscale. Note the patterning of the morphology deposited in the center, resembling a rose.
Figure 11:
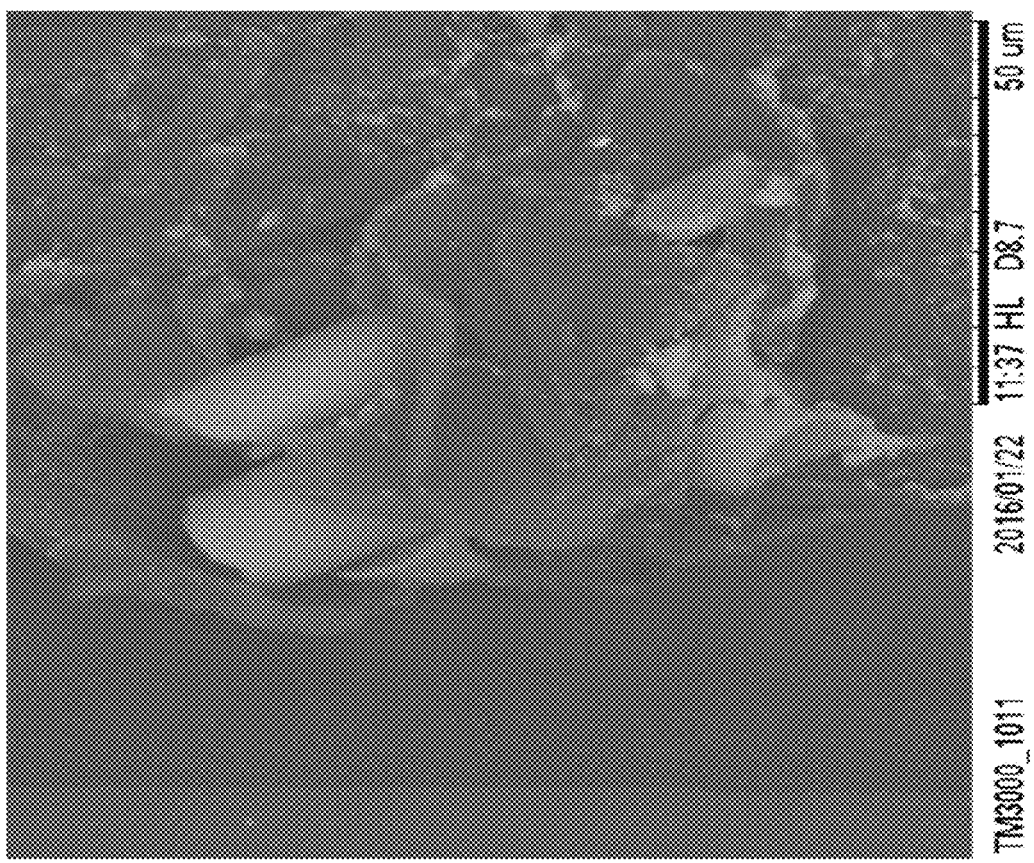
FIG. 11 illustrates the nucleation of elemental nanostructures. The photograph clearly shows graphite like and graphene sheets and rods protruding from within a graphene pore. The rods are silicon calcium in this photo. To the right of the photograph, titanium nanospheres in light grey can be identified.

FIG. 10G illustrates the growth of rows or layers from a center. Growth can emanate from a center, for example, resembling a rose, sphere or similar recursive structure. The elemental metal macrostructures produced from quantum printing, therefore, can be further characterized by a central domain surrounded by alternating nanolayers of carbon and elemental metal. For example, the carbon and elemental metal nanolayers can independently be less than about 20 nm in thickness, such as less than about 10 nm in thickness, for example, less than about 5 nm in thickness. The macrostructure can be characterized by at least about 5 elemental metal nanolayers, such as at least about 10 elemental metal nanolayers emanating from an elemental metal center.

The nanostructures can be spherical, as determined by visual inspection and SEM. An example of spheroid copper nanostructures can be viewed in FIGS. 8A and 8B. The diameters of the nanostructures can be observed to be less than 5 microns, such as between 50 and 800 nm, such as between 100 and 200 nm. Nanostructures having a flake, scale or chip morphology have also been observed. Nanostructures characterized by a highly smooth surface (or, a surface substantially free of rugosity) have been observed. Rugosity is a measure of small-scale variations of amplitude in the height of a surface and can be characterized by the ratio of the true surface area divided by the geometric surface area. For example, a perfect sphere would have a rugosity of 1. Thus, nanostructures of the invention where the rugosity of each structure, as visually observed by STEM or TEM, is less than about 2, preferably less than about 1.5 such as less than about 1.2.

In addition, nanostructures of the invention can be characterized by an unusually high roundness. Roundness is used herein to define the ratio of the averaged radius of curvature of the convex regions to a circumscribed circle of the particle (or a surface defined by at least 40% of the visible perimeter of the particle, in the case of an ellipsoid), as visually observed by STEM, SEM or TEM.

$$\text{Roundness} = \frac{\sum_{i=1}^{n}\left(\frac{r_i}{R}\right)}{n}$$

Wherein R is the radius of a circumscribed circle, $r_i$ is the radius an inscribed circle at a convex corner i and n is the number of inscribed circles measured. A roundness of 1 indicates the inscribed circle overlays the circumscribed circle. The invention includes nanostructures having a roundness of at least about 0.3, preferably at least about 0.4, 0.5, 0.6, 0.7, 0.8 or 0.9 as visually observed STEM, SEM or TEM.

The following table provides the reproducibility of the experimentation.

|  | Element | #Runs | #Runs (>5σ) | Percent (>5σ) | Max (ppm) |
| --- | --- | --- | --- | --- | --- |
| Nanosphere Formation | Ni | 66 | 47 | 70% | 14,000 |
| Nanosphere Growth/ Germination Elements | Si | 66 | 55 | 80% | 17,000 |
|  | Ta | 42 | 10 | 25% | 80 |
|  | Mo | 65 | 13 | 25% | 17 |
|  | Rh, Pd, Pt | 5 | N/A | — | 1.4, 6.2, 0.9 |
|  | Sc | 152 | N/A | — | 35 |
|  | Y | 179 | N/A | — | 7.4 |
|  | Ce | 258 | 48 | 18% | 12 |
|  | Pr | 63 | N/A | — | 4.6 |
|  | Nd | 98 | N/A | — | 36 |
|  | Sm | 39 | N/A | — | 0.59 |
|  | Gd | 29 | N/A | — | 0.39 |
|  | Tb | 7 | N/A | — | 5.2 |
|  | Dy | 19 | N/A | — | 0.29 |
|  | Er | 17 | N/A | — | 17 |
|  | Yb | 10 | N/A | — | 1.8 |

Figure 13A:
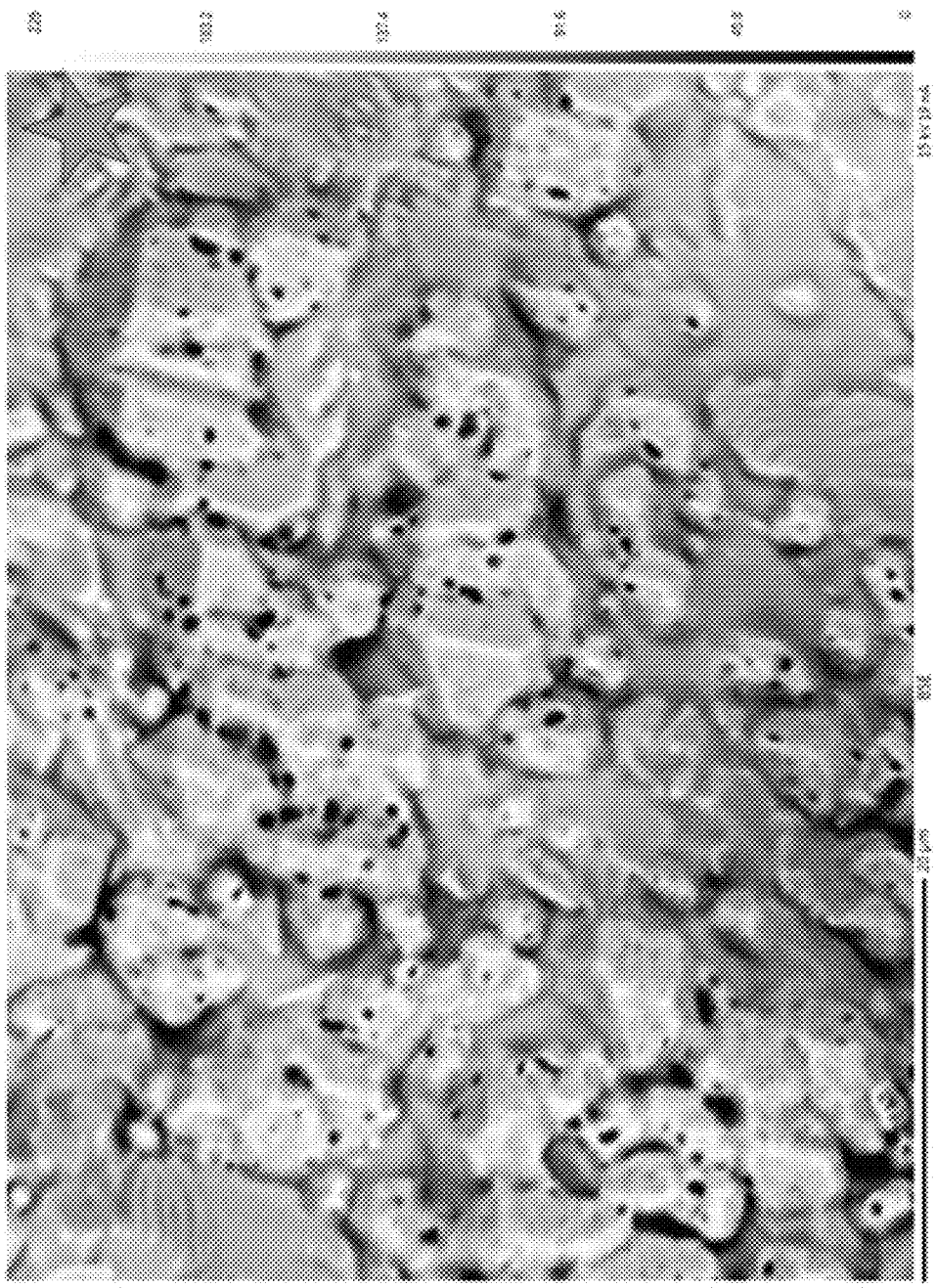
FIG. 13A, FIG. 13B and FIG. 13C show images of internal voids of a metal deposit or metal macrostructure of the invention.

N/A: In some instances, the element was a non- detect in the starting material, confounding statistical comparisons The elemental metal nanostructures of the invention can further comprise internal voids and nanopores. FIG. 13A provides an excellent image of internal voids typical of the elemental metal nanostructures of the invention. Agglomerated nanostructures can be seen. These nanostructures have apparent diameters or characteristic dimension of less than 1 micron. Within the nanostructures, can be seen nanopores with apparent pore diameters of less than about 0.1 micron. Thus, the invention includes elemental metal porous nanostructures characterized by a numerical average diameter of less than about 10 µm, preferably less than about 1 micron and a numerical average pore diameter of less than about 1 µm, such as less than about 500 nm, less than about 200 nm or less than about 100 nm, as calculated visually from an TEM image of an elemental metal macrostructure.

Figure 8B:
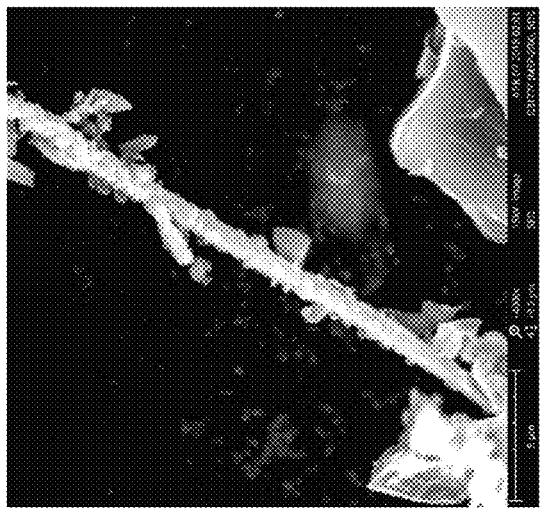
FIGS. 8A, 8B, 8C and 8D are SEMs of a metal macrostructure comprising agglomerated metal nanostructures and illustrate nanowires, threads and coils.
Figure 8D:
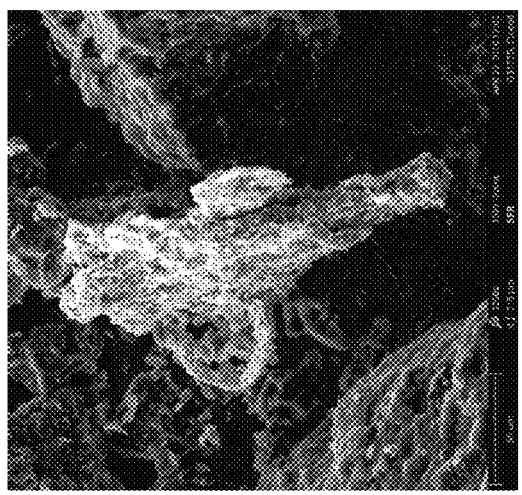
Figure 8A:
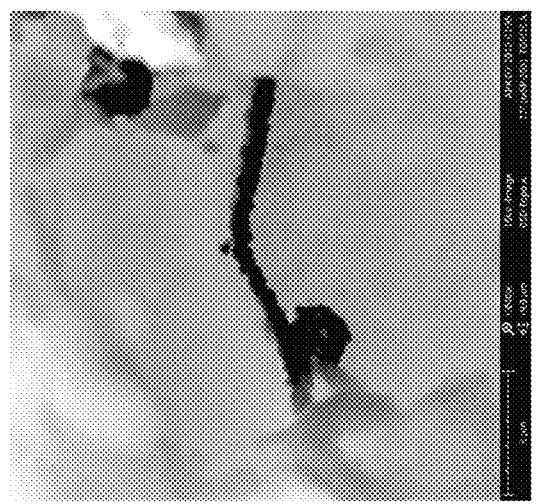
Figure 8C:
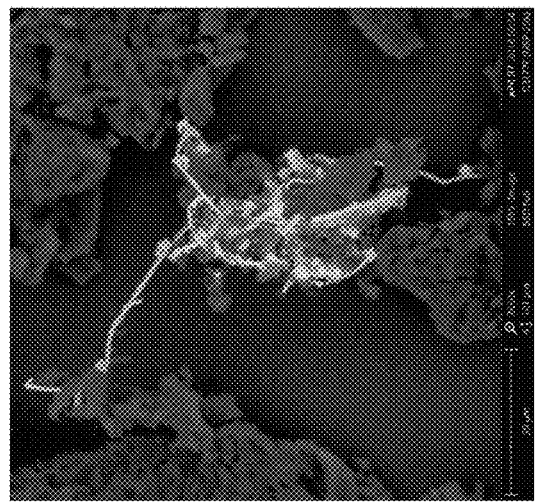

The nanostructures further agglomerate or aggregate to form macrostructures within the carbon powder. Macrostructures are defined herein to include agglomerates or aggregates of nanostructures as well as structures visible to the naked human eye. The macrostructures can have a variety of morphologies, including a nanowire or thread having a width of less than about 1 micron, as shown in FIG. 8A. FIG. 8B illustrates a nanowire with branching. A nanowire is defined herein to include a linear agglomeration of nanostructures characterized by an aspect ratio of at least about 5, such as at least about 10, preferably at least about 25. Aspect ratio is the ratio of the length to the diameter of the nanowire as determined by visual inspection with an SEM. See FIG. 8C.

Macrostructures characterized by coiled nanostructures have also been observed. For example, FIG. 8D illustrates one such coil on the left hand side of a copper macrostructure made in accordance with the invention.

Figure 13B:
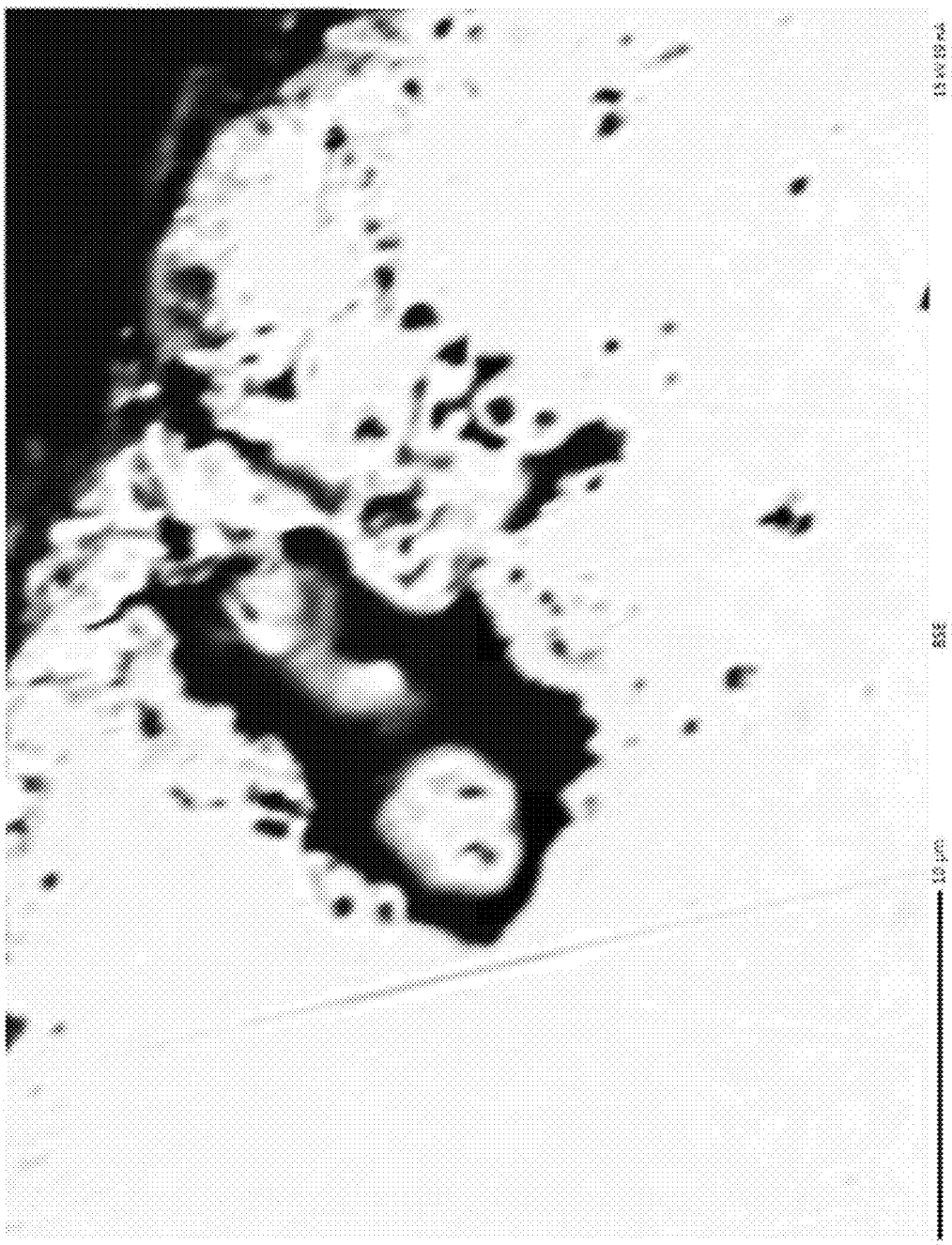
Figure 13C:
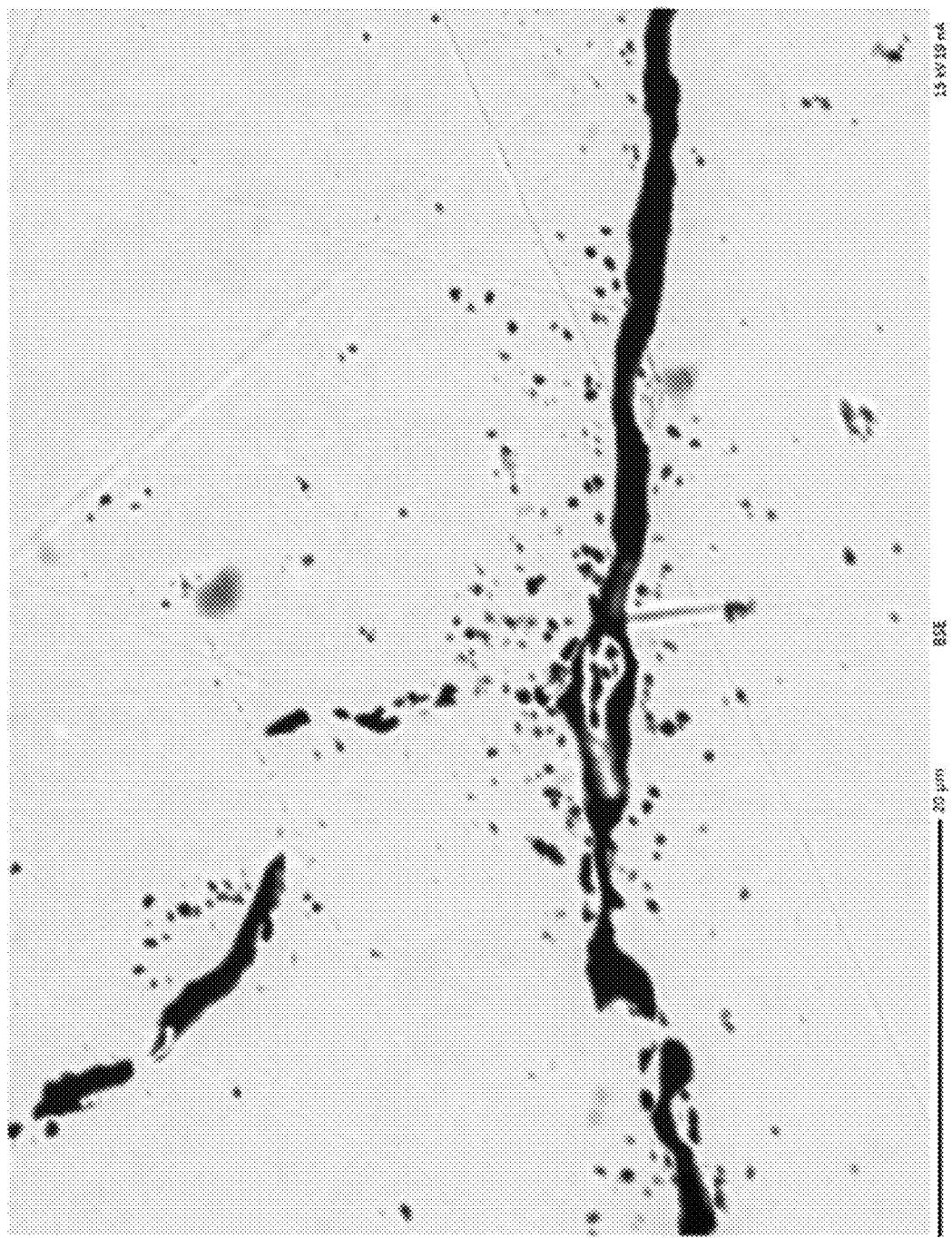
Figure 13D:
FIG. 13D is a photograph of a macrostructure obtained from Illustration 12. The photograph was obtained using an optical microscope.
Figure 14C:
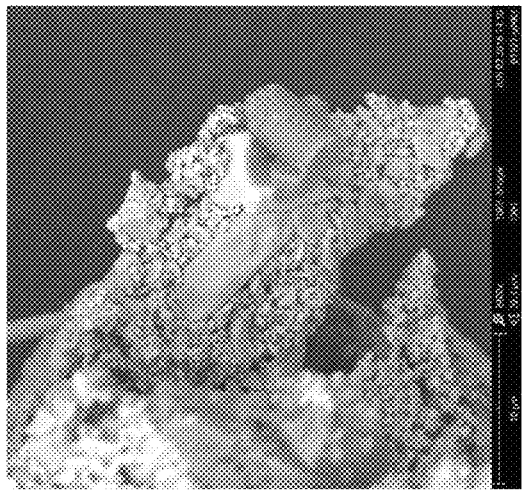
FIG. 14A, FIG. 14B, and FIG. 14C shows SEM images of clathrates.
Figure 14D:
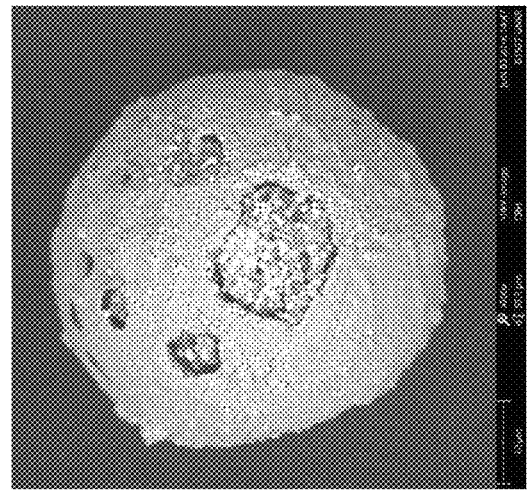
FIG. 14D shows a SEM image of a metal organic framework.
Figure 14A:
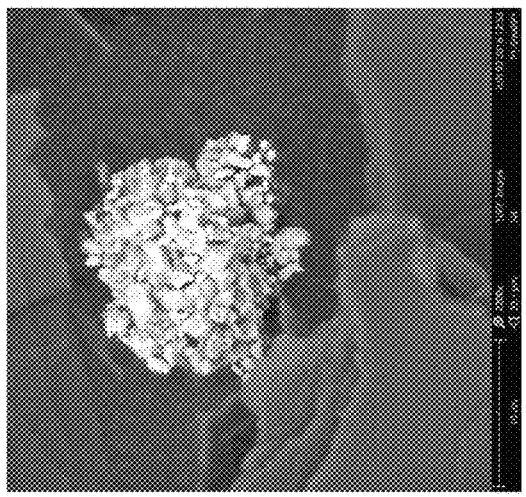
Figure 14B:
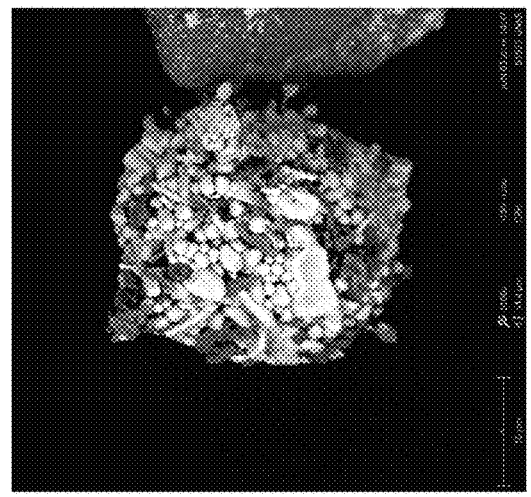

Large macrostructures that have also been observed. For example, the larger particle in FIG. 9A is approximately 1.6 millimeters in length and has the appearance of a nugget. This particle is visible to the naked eye. FIG. 9D is a copper-containing nanowire of larger dimensions, with a length of about 400 microns. In contrast to the threads described above, this macrostructure has a hollow or annular appearance. FIGS. 13B and 13C illustrate internal voids typical of elemental metal macrostructures of the invention from a product of Illustration 1. FIG. 13B shows an internal void, or micropore, about 10 microns in diameter. Without being bound by theory, it is believed that such micropores, whether located internally or on the surface of the macrostructure, can be used as further nucleation sites in the present method for additional instantiation. For example, Illustration 1 resulted in a metal macrostructure characterized by an elemental nanostructure protruding from such a micropore. Thus, the invention includes elemental macrostructures characterized by at least one micropore protruding therefrom an elemental metal nanostructure wherein the nanostructure has a different metal composition than the macrostructure. FIG. 13C illustrates an internal fissure characterized by a length of at least about 20 nm and width of at least about 5 nm and an aspect ratio of at least 4. FIG. 13D illustrates the macrostructure which has the appearance of a thick wire or rod. This macrostructure is characterized by a length of at least about 1 mm and a diameter of at least about 100 microns. This macrostructure is preponderantly copper. While this represents a single scan at a single point, more than 50 scans were taken along the length and cross section of this macrostructure with similar results. Tungsten, molybdenum, platinum, silicon and neodymium were detected.

Figure 12:
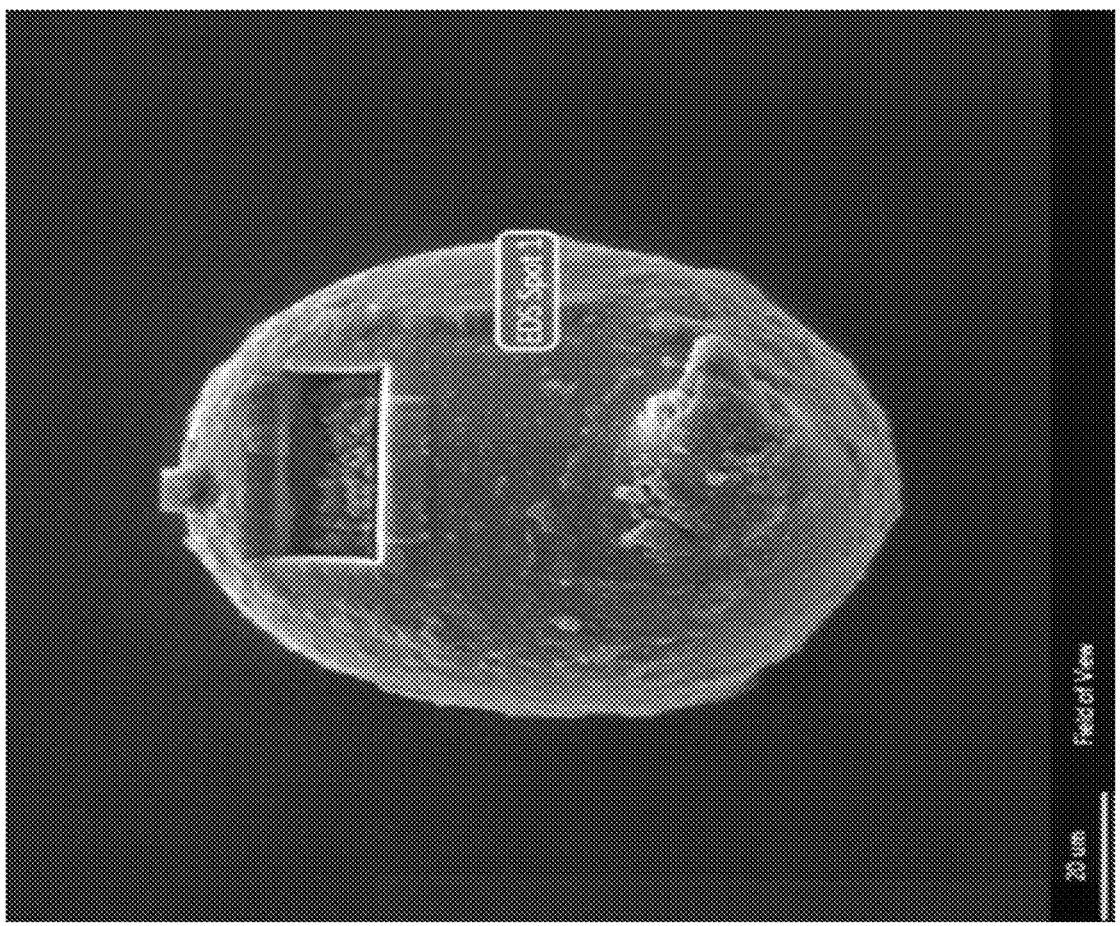
FIG. 12 shows a silicon dioxide particle identified in a nanoporous carbon composition. A rectangle was removed from the particle surface, exposing aggregated nanostructure.

FIG. 12 illustrates a silicon microsphere. Elemental analysis suggests that the microsphere is a preponderance of silicon dioxide. A rectangle was removed from the surface of the microsphere, exposing aggregated nanospheres. Iron, aluminum, and sodium were also detected. Similar metal matrix spheres have been observed containing elemental nanospheres.

As discussed above, macrostructures can be agglomerated nanostructures. The nanostructures can comprise the same or different elements. Typically, detection methods observe the nanostructures can be individually substantially pure.

The nanoporous carbon compositions described herein and made according to the present invention can be used as catalysts and electrodes. The elemental metal macrostructures described herein can be isolated from the nanoporous carbon compositions. For example, sieving the carbon powder with a porous sieve that will capture metal nanostructures of the desired size can be beneficial. The elemental metal macrostructures can be used, for example, in processes typical of mined metals.

Platinum and Other Precious Metal Deposits

Nanoporous carbon compositions and elemental metal macrostructures have been isolated that detect precious metals, such as gold and silver, and platinum group metals, such as platinum, palladium, osmium, rhodium, iridinium and ruthenium. Thus, the invention includes elemental macrostructures and nanostructures that comprise precious metals, such as gold and silver, and platinum group metals, such as platinum, palladium, osmium, rhodium, iridinium and ruthenium. The macrostructures comprising one or more of these elements can have internal carbon, such as amorphous or $sp^2$ carbon, as discussed in more detail above.

Macrostructures can preferably comprise at least 500 ppm platinum, such as at least about 1000 ppm platinum, preferably at least 10,000 ppm platinum. Such a macrostructure was made using the GSA protocol, using a Z carbon starting material, a CuG reactor, and nitrogen gas (see, Illustration 2) and with the Electromagnetic Light Combing protocol, using a PEEK carbon starting material, a GG graphite reactor and CO gas (see Illustration 1 substituting CO for helium).

Carbon compositions can preferably comprise platinum nanostructures having a concentration of at least about 500 ppb platinum, such as at least about 1000 ppb, preferably at least about 10,000 ppb platinum. Such carbon compositions were made using the GSA protocol, helium gas, the GPtIr reactor, which lines the cup with a platinum foil and a variety of nanoporous carbon starting materials.

The target metal (e.g., precious metals, such as gold and silver, and platinum group metals, such as platinum, palladium, osmium, rhodium, iridinium and ruthenium) can be extracted from the carbon composition and other metals in the macrostructure by methods routinely used in the mining industry.

Four illustrations, representative of platinum containing compositions, with third party characterizations, are set forth in the following table:

|  |  | Sample Number | | | |
| --- | --- | --- | --- | --- | --- |
|  |  | Example 2 | Example 12 | Example 9 | Example 50 |
|  |  | | Illustration No. | | |
|  |  | 2 | 1 | 1 | 6 |
| Experimental Protocol |  | GSA | E/LC | E/LC | QPP |
| Rx Assembly |  | CuG | GG | $G_gF$ | CuG |
| Gas Composition |  | $N_2$ | Co | Kr | He—$H_2$ |
| Carbon Type |  | Z-Lot | APK-800 | APKI-108 | MSP-20X |
| Temperature, $T_{ops}$ |  | 180° C. | 450° C. | 450° C. | 25° C. |
| Elements (Instantiated) |  |  |  |  |  |
| Category-1 |  | 1 | 1 | 2 | 1 |
|  | Elements | Cu | Cu | Fe, Cr | Fe |
| Category-2 |  | 3 | 3 | 6 | 7 |
|  | Elements | Na, Ca, Pt | SI, W, Re | Al, Ni, Zn, Hf, Pb, Bi | Na, Ca, V, Cr, Mn, Ni, Cu |
| Category-3 |  | 5 | 14 | 8 | 5 |
|  | Elements | Al, Si, K, Fe, Ag | Na, Al, K, Ca, Ti, Cr, Fe, Ni, Mo, Sn, Ba, Ta, Os, Pb | Si, Ca, Mn, Cu, Mo, Sn, Sb, W | Zn, Zr, Mo, Sn, Sb |
| Category-4 |  | 46 | 46 | 33 | 18 |
|  | Elements | Be, B, Mg, P, Sc, Ti, V, Cr, Mn, Co, Ni, Zn, Ga, Ge, As, Se, Rb, Sr, Y, Zr, Nb, Mo, Ru, Cd, Sn, Sb, Te, Cs, Ba, La, Nd, Sm, Gd, Eu Hf, W, Re, Os, Ir, Au, Hg, Tl, Pb, Bi, Th, U | Li, Be, B, Mg, P, Sc, V, Mn, Co, Zn, Ga, Ge, Se Rb, Sr, Y, Zr, Nb, Ru, Ag, Cd, Sb, Te La, Ce, Pr, Nd, Sm, Eu, Gd, Tb, Dy, Ho, Er, Tm, Yb, Lu Hf, Ir, Pt, Au, Hg, Tl, Bi, Th, U | Li, B, Na, Mg, P, K, Sc, Ti, V, Co, Ga, Ge, Se Rb, Sr, Y, Zr, Nb, Ru, Pb, Ag, Cd, Te Ba, Ce, Nd, Gd, Yb Re, Os, Pt, Hg, Tl | Ti, Co Nb Ce, Pr, Nd, Sm, Eu, Gd, Tb, Dy, Ho, Er, Tm. Yb, Lu Hf, W |
|  | Instantiated Elements | 55 | 64 | 49 | 31 |
| Analysis |  |  |  |  |  |
| Internal |  | ED-XRF, EBD-SEM, optical microscopy | ED-XRF, EBD-SEM, optical microscopy | ED-XRF, EBD-SEM, optical microscopy | ED-XRF, EBD-SEM, optical microscopy |
| External |  | LA-ICP-MS, EBD-SEM, optical TEM, STEM, SEM, EELS | LA-ICP-MS, EBD-SEM, optical CAMECA SX5 Electron Microprobe | LA-ICP-MS, EBD-SEM, optical TEM, STEM, SEM, Gamma Spectroscopy | LA-ICP-MS, EBD-SEM, optical |

Methods and Apparatus

Conceptually, the apparatus for baseline experimentation can be broken into two primary areas: Gas Processing and Reactor Assembly.

Gas Processing:

The gas processing section controls gas composition and flow rate, with the optional embedding of electromagnetic (e.g. light) information or electromagnetic gas pre-treatment to the reactor. The invention includes an electromagnetic embedding enclosure (E/MEE or EMEE), or apparatus, for processing a gas comprising or consisting of:

- a central processing unit and power supply;
- one or more gas supplies;
- a housing having a housing inlet and housing outlet;
- an upstream gas line that is in fluid connection with each gas supply and the housing inlet;
- an internal gas line in fluid connection with the housing inlet and housing outlet;
- a downstream gas line in fluid connection with the housing outlet;
- at least one pencil lamp positioned below the internal gas line, at least one pencil lamp positioned above the internal gas line and/or at least one pencil lamp positioned to the side of the internal gas line;
- a short wave lamp and/or a long wave lamp; and
- an optional coil wrapped around the internal gas line, operably connected to a frequency generator;
- wherein each lamp is independently rotatably mounted, located along the length of the internal gas line, and powered by the power supply; and
- wherein the central processing unit independently controls powering the frequency generator, if present, and each lamp and the rotation position of each lamp.

Feed gases can preferably be research grade or high purity gases, for example, as delivered via one or more gas supplies, such as a compressed gas cylinder. Examples of gases that can be used include, for example, air, oxygen, nitrogen, hydrogen, helium, neon, argon, krypton, xenon, ammonium, carbon monoxide, carbon dioxide and mixtures thereof. Preferred gases include nitrogen, helium, argon, carbon monoxide, carbon dioxide and mixtures thereof. Nitrogen and helium are preferred. The gases can be free of metal salts and vaporized metals.

One or more gases (e.g., 2, 3, 4, 5, or more gases) can optionally pass through a gas manifold comprising mass flow meters to produce a gas composition, also called the reactor feed gas. The reactor feed gas may then either by-pass an electromagnetic (EM) embedding enclosure (E/MEE) or pass through one or more E/MEEs. The E/MEE exposes the reactor feed gas to various electromagnetic field (EMF) sources. Flow rates, compositions, and residence times can be controlled. The rate of flow of the reactor feed gas can be between 0.01 standard liters per minute (SLPM) and 10 SLPM, or 100 SLPM or more. A constant flow of gas can maintain a purged environment within the reactor. The schematics shown in FIG. 1 depicts a flow path for the gases through a sample E/MEE. The sample E/MEE comprises a series of lights and coils that can optionally expose the reactor feed gas to EM radiation. EMF sources within the E/MEE can be energized simultaneously or in sequence or a combination thereof.

FIG. 1 is an illustration of an E/MEE of the invention. Gas enters the E/MEE via the inlet 101, or entrance, in line 102 and exits at the outlet, or exit, 110. The inlet 101 and outlet 110 may optionally have valves.

Line 102 can be made of a transparent or translucent material (glass is preferred) and/or an opaque or non-translucent material, such as stainless steel or non-translucent plastic (such as TYGON® manufactured by Saint-Globain Performance Plastics) or a combination thereof. Using an opaque material can reduce or eliminate electromagnetic exposure to the gas as the gas resides within the line. The length of line 102 can be between 50 cm and 5 meters or longer. The inner diameter of line 102 can be between 2 mm and 25 cm or more. Line 102 can be supported on and/or enclosed within a housing or substrate 111, such as one or more plates, with one or more supports 112. For example, substrate 111 can be configured as a plane or floor, pipe or box. Where the substrate is a box, the box can be characterized by a floor, a ceiling and side walls. The box can be closed to and/or insulated from ambient EM radiation, such as ambient light.

One or more lamps (such as 2, 3, 4, 5, 6, 7, 8, 9, 10 lamps or more) can be configured within the E/MEE. Lamps (numbered individually) are preferably pencil lamps characterized by an elongated tube with a longitudinal axis. The pencil lamps can independently be placed such that its longitudinal axis is (i) parallel to the line 102, (ii) disposed radially in a vertical plane to the line 102, or (iii) perpendicular to the plane created along the longitudinal axis of the line 102 or along the vertical axis of the line 102.

Each lamp can, independently, be fixed in its orientation by a support 112. Each lamp can, independently, be affixed to a pivot 113 to permit rotation from a first position. For example, the lamps can be rotated between about 0 and 360 degrees, such as about 45, 90, 135, 180, 225 or 270 degrees, preferably about 90 degrees relative to a first position. The rotation can be with respect to the x, y, and/or z axis wherein (i) the x-axis is defined as the axis parallel to the gas line and its vertical plane, (ii) the y-axis defining the axis perpendicular to the gas line and parallel to its horizontal plane, and (iii) the z-axis is defined as the axis perpendicular to the gas line and parallel to its vertical plane.

Referring to the specific pencil lamps within an E/MEE, line 102 is configured along the E/MEE with gas flowing from the inlet 101 and exiting at the outlet 110. Lamp 103, a neon lamp, is first and is shown above line 102 oriented to be along the z-axis and perpendicular to line 102, with the tip of the lamp pointed towards line 102. Lamp 109, a krypton lamp, is shown below line 102 oriented to be parallel to the x-axis, with the tip pointing towards the outlet 110. Lamps 104 and 105, a long wave and short wave lamp, respectively, are shown parallel to line 102 oriented to be along the x-axis with the tips pointing towards the inlet. Lamp 122, an argon lamp, is shown to be below line 102 oriented to be parallel to the x-axis, with the tip pointing towards the inlet 101 at approximately the same distance from the inlet as lamps 104 and 105. Lamp 106, a neon lamp, is downstream at about the midpoint of the E/MEE, is above line 102 with the tip pointing down. Lamp 107, a xenon lamp, is shown downstream of lamp 106 above line 102, parallel to the x axis of line 102 and points toward the outlet 110. Lamp 108, an argon lamp, is below line 102 and the tip is pointing toward line 102 along the z-axis. Optional coil 120 is wrapped around line 102. Each of these lamps can be independently rotated, for example, 90 degrees along any axis. Each lamp is connected to a power supply or power source to turn on or off the power. Each lamp can be independently rotated 1, 2, 3, 4 or more times during the process. For convenience, each lamp is held by a pivot that can be controlled by a central processing unit, such as a computer programmed to rotate the pivot and provide power to each lamp. For the ease of describing the experimental procedures, each orientation of each lamp is called "position n" wherein n is 0, 1, 2, 3, 4, or more. As the procedure is conducted, each lamp can be powered for specific periods of time at specific amperage(s) and positioned or repositioned.

In the exemplification described below, the initial bulb position for each lamp is described with a degree. A zero degree (0°) reference point is taken as the 12 o'clock position on the glass pipe when looking down the gas pipe in the direction of intended gas flow (e.g., when looking at the E/MEE exit). The length of the glass pipe or line is taken as the optical length (e.g., in this instance 39 inches). For example, 6 inches from the end is defined as 6 inches from the optical end of pipe.

The lamps can be placed above, below, or to the side (for example, level with the longitudinal axis or a plane parallel to (above or below) the longitudinal axis), for example, of line 102. The lamps can be independently placed between 5 and 100 cm from the center of the line 102 in the vertical plane, as measured from the tip of the lamp to the center of line 102. One or more lamps can be placed in the same vertical plane along line 102, as illustrated by lamps 122, 104, and 105. Two lamps are in the same vertical plane if they (as defined by the tip or base of the lamp) are the same distance from the inlet 101. Preferably, lamp 105 can be placed in a plurality of (e.g., 2, 3, 4, 5 or more) vertical planes along the length of line 102 within the E/MEE. Further, one or more lamps can be placed in the same horizontal plane above, below or through line 102, as shown with lamps 104 and 105. Two lamps are in the same horizontal plane if they (as defined by the tip or base of the lamp) are the same distance from the center of line 102. Preferably, lamps can be placed in a plurality of (e.g., 2, 3, 4, 5 or more) horizontal planes along the length of line 102 within the E/MEE, as generally illustrated.

It is understood that "pencil lamps," as used herein, are lamps filled with gases or vapor that emit specific, calibrated wavelengths upon excitation of the vapor. For example, pencil lamps include argon, neon, xenon, and mercury lamps. For example, one or a plurality of lamps can be selected from argon, neon, xenon or mercury or a combination thereof. Preferably, at least one lamp from each of argon, neon, xenon and mercury are selected. Wavelengths between 150 nm and 1000 nm can be selected. One example of a pencil lamp is a lamp characterized by an elongated tube having a tip and a base.

Long wave and/or short wave ultraviolet lamps can also be used. Pencil lamps used in the E/MEE were purchased from VWR™ under the name UVP Pen_Ray® rare gas lamps, or Analytik Jena in the case of the UV short wave lamps.

A power supply is operably connected to independently to each lamp, E/MEE coil, and frequency generator. The power supply can be AC and/or DC.

The E/MEE can be open or enclosed. Where the E/MEE is enclosed, the enclosure is typically opaque and protects the gas from ambient light. The enclosure can be made of a plastic or resin or metal. It can be rectangular or cylindrical. Preferably, the enclosure is characterized by a floor support.

In baseline experimentation the gases by-pass the E/MEE section and are fed directly to the reactor assembly. The energy levels and frequencies provided by the EM sources can vary.

Figure 4A:
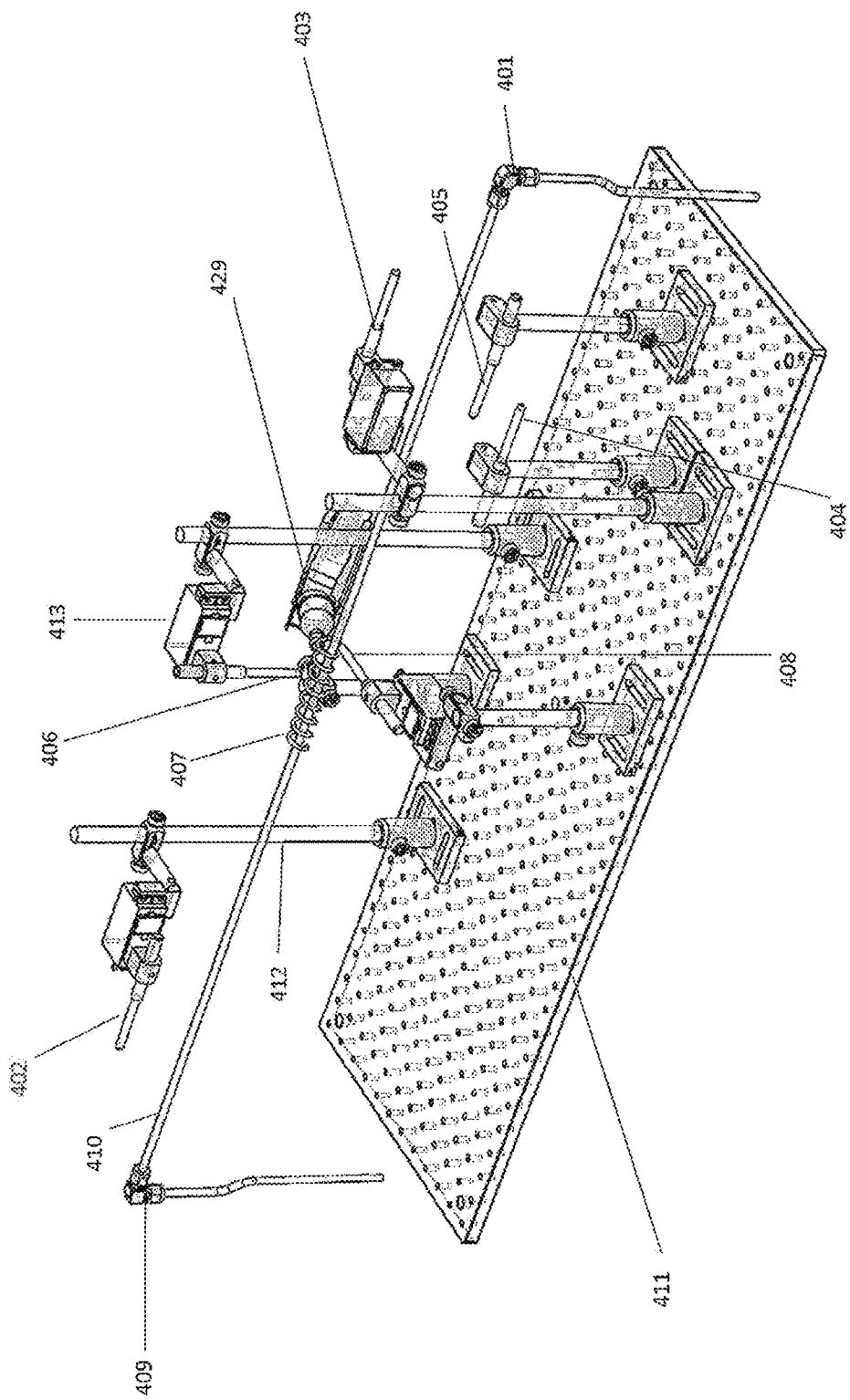
FIG. 4A is a perspective view of an E/MEE of the invention used in carbon pretreatment.

FIG. 4A provides a second illustration of an E/MEE of the invention. Gas enters the E/MEE at inlet 401 and exits at outlet 409 along line 410. Pencil lamp 402 and Pencil lamp 403 are shown parallel to and above line 410 along the vertical plane through line 410 axis. Pencil lamps 404 and 405 are parallel to and below line 410 in the same horizontal plane equidistant from the vertical plane through line 410. Pencil lamp 406 is shown above and perpendicular to line 410, positioned along the z axis. An optional coil 407 is a conductive coil wrapped around line 410. Pencil lamp 408 is shown below and perpendicular to line 410 along the y axis. Substrate 411 provides a base for supports 412. Pivots 413 control the position of each pencil lamp and permit rotation along axis x, y and z. An optional x-ray source 429 is also shown directed towards the coil 407.

The coil 407 is preferably made of conducting material and is connected to a power supply and, optionally, a frequency generator. The coil can comprise copper, aluminum, platinum, silver, rhodium, palladium or other metals or alloys (including braidings, platings and coatings) and can optionally be covered with an insulating coating, such as glyptal. It can be advantageous to use a braid of 1, 2, 3 or more metal wires. The coil can be manufactured from wire typically used in an induction coil and can vary in size and the number of turns. For example, the coil can comprise, 3, 4, 5, 6, 7, 8, 9, 10 or more turns. The inner diameter of the coil can be between 2 cm and 6 cm or more and preferably snugly fits the line 410. The wire used can have a diameter of between 5 mm and 2 cm.

An x-ray source 429 can included in the E/MEE. For example, the x-ray source can be directed at line 410 along the line between the inlet 401 and outlet 409. For example, it can be advantageous to direct the x-ray source at coil 407, where present.

Reactor Assembly (RA):

The invention further relates to a reactor assembly comprising:

A gas inlet and one or more gas outlets;
    A reactor chamber, preferably containing a nanoporous carbon material;
    A first porous fit defining a floor of the reactor chamber,
    A second porous frit defining the ceiling of the reactor chamber; wherein each porous frit has a porosity that is sufficient to allow a gas to permeate into the reactor chamber and contain a nanoporous carbon material;
    An optional reactor cup defining side walls of the reactor chamber;
    A reactor cap positioned above the second porous frit;
    A reactor body disposed below the first porous frit;
    A reactor head space disposed above the reactor cap;
    An optional foil disposed between the reactor chamber and reactor cup;
    A plurality of coils surrounding the reactor body and/or the reactor chamber operably connected to a power supply and frequency generator;
    An optional x-ray source configured to expose the reactor head space to x-rays;
    One or more optional lasers configured to direct a laser towards a frit and/or through the reactor chamber;
    A computer processing unit configured to control the power supply, frequency generator and the optional x-ray source and lasers.

The invention also includes a reactor assembly comprising:

A gas inlet and one or more gas outlets;
    A reactor chamber, preferably containing a nanoporous carbon material;
    A first porous frit defining a floor of the reactor chamber,
    A second porous frit defining the ceiling of the reactor chamber; wherein each porous frit has a porosity that is sufficient to allow a gas to permeate into the reactor chamber and contain a nanoporous carbon material;
    A reactor head space disposed above the reactor cap;

2, 3, 4, 5 or more RA coils surrounding the reactor chamber and/or reactor head space operably connected to an RA frequency generator and power supply;

2, 3, 4, 5 or more pairs of lamps wherein the pairs of lamps are disposed circumferentially around the RA coils and define a space between the pairs of lamps and the RA coils;

An optional x-ray source configured to expose the reactor chamber to x-rays;

One or more optional lasers configured to direct a laser through the reactor chamber; and A computer processing unit configured to control the power supply, frequency generator and the optional x-ray source and lasers.

Figure 2A:
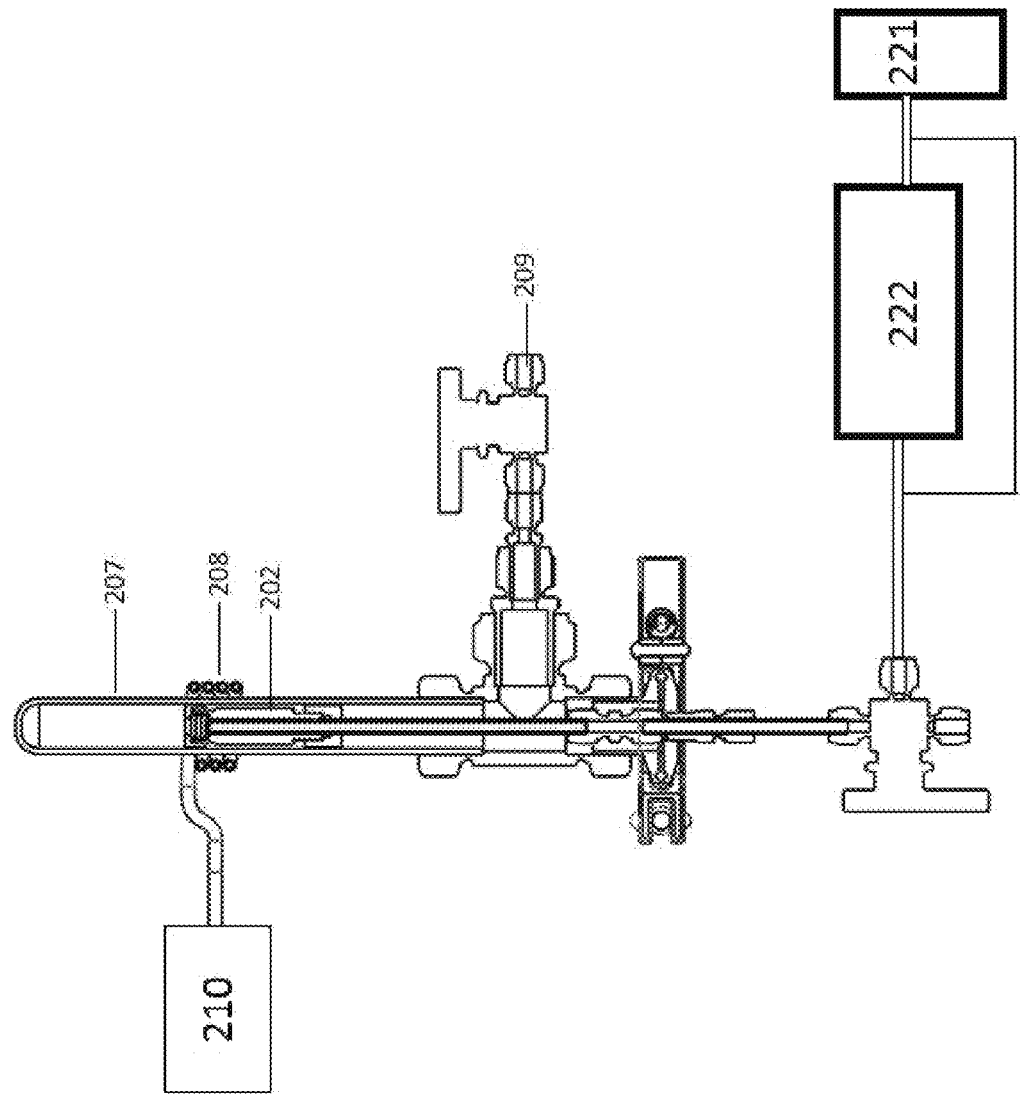
FIGS. 2A and 2C show reactor assembly components.
Figure 2B:
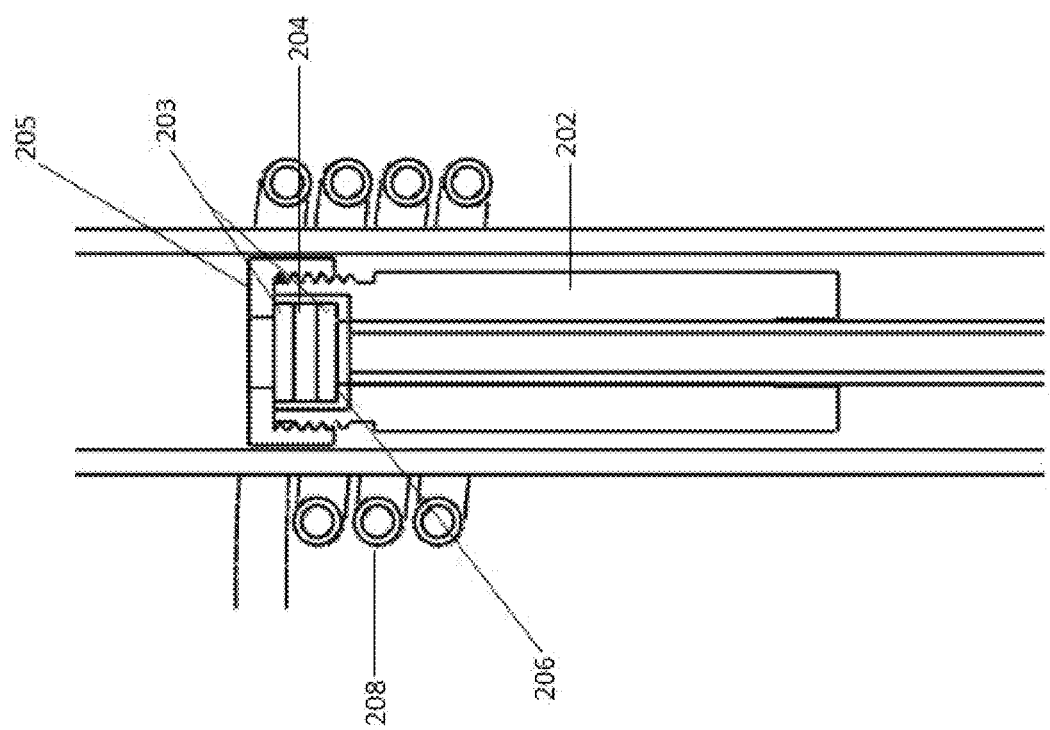
FIG. 2B is an expanded view of the reactor assembly components of FIG. 2A.

As shown in FIGS. 2A and 2B, the reactor assembly comprises a reactor body 202 and starting, or charge, material 204 (which is generally a nanoporous carbon powder) and is located downstream of the gas sources 221 and E/MEE 222, as shown in FIG. 2A. As described above, it is possible for reactor feed gas to bypass the E/MEE. The reactor body 202 can be a packed bed tubular micro-reactor surrounded by one or more conducting coils 208, as illustrated in FIG. 2B, a cross section of the reactor assembly.

The conducting coil 208 can be manufactured from electrically conducting material, such as copper, aluminum, platinum, silver, rhodium, palladium or other metals or alloys (including braidings, platings and coatings) and can optionally be covered with an insulating coating, such as glyptal. The coil can be manufactured from wire typically used in an induction coil and can vary in size and the number of turns. For example, the coil can comprise, 3, 4, 5, 6, 7, 8, 9, 10 or more turns. The inner diameter of the coil can be between 2 cm and 6 cm or more and preferably snugly fits the reactor body containment 207. The wire used can have a diameter of between 5 mm and 2 cm.

Figure 5A:
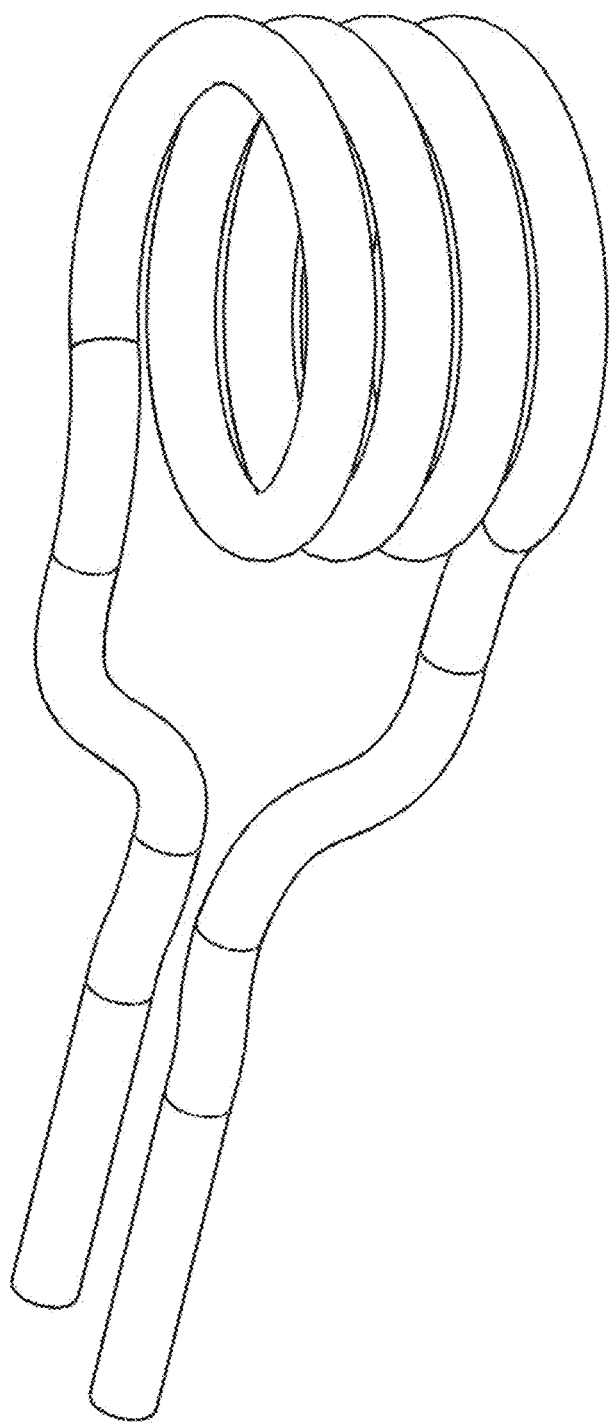
FIG. 5A illustrates one conformation for a standard coil.
Figure 5B:
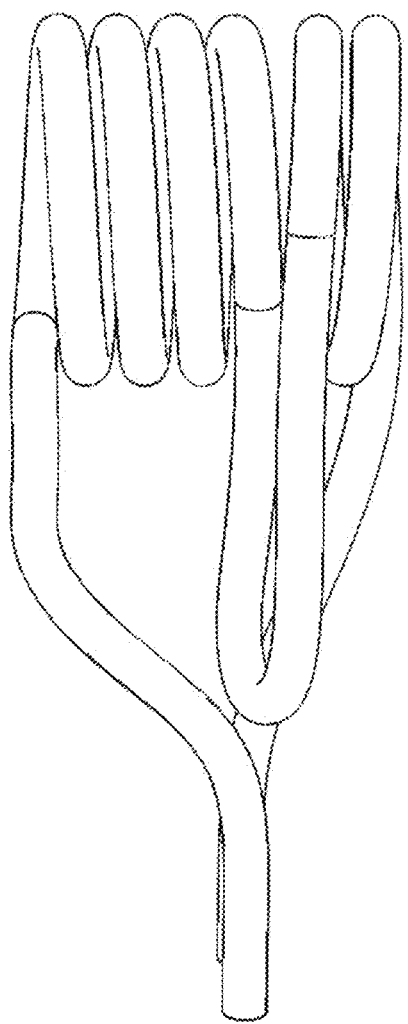
FIG. 5B illustrates one conformation for a reverse field coil.

Each conducting coil 208 (or coil) can generate inductive heat and, optionally, a magnetic field. Standard induction coils or reverse field induction coils (coils that have a lower and upper sections connected through an extended arm that allows the sections to be wound in opposite directions, thereby producing opposing magnetic fields) are preferred. The coil 208 can be water-cooled via a heat exchanger. The coil can be connected to a power flange 210, which can be water cooled as well and in turn can connect to a power supply, such as an Ambrell 10 kW 150-400 kHz power supply. In baseline experimentation a standard coil was used with simple copper windings. The windings can form a coil such that the connection to the power supply is at opposite ends of the coil FIG. 5A or the coil can return such that the connection to the power supply are adjacent, as shown in FIG. 5B.

The reactor assembly can optionally further comprise one or more coils 208, preferably surrounding the reactor body and its containment system. For example, the reactor assembly can comprise 1, 2, 3, 4, 5, 6, 7, 8, 9, or 10 or more coils, also called RA coils. As shown in FIG. 2B, one or more electromagnetic (E/M) coils can be used to provide magnetic fields. Preferably, 1, 2, 3, 4, or 5 or more E/M coils can be used, more preferably 3, 4, or 5 E/M coils. FIG. 3 shows groupings of three coils, for example, which can generally be numbered 1, 2, or 3, from top to bottom. A grouping of coils, as shown in FIG. 3A-3E, can be called a boundary. Where a plurality of groupings is used, the number of coils used is independently selected. Further, the groupings can be equidistantly spaced along or irregularly spaced.

Coils can be manufactured from electrically conducting materials, such as copper, platinum, silver, rhodium, palladium and, wire braids or coated wires of two or more materials. Each coil in a grouping may be made of the same material or different. For example, a grouping can be made such that each coil is made of a different material. For example, a braiding of copper wire and silver wire can be used. Silver plated copper wire can be used. A first RA coil can be made of a copper winding. A second RA coil can be a copper/silver braid. A third RA coil can be a platinum wire winding. An RA coil can be configured to create a magnetic field and wherein each power supply independently provides AC and/or DC current. Any one or all RA coils can be optionally lacquered.

The coils are preferably circular in geometry. However, other geometries, such as rounded shapes, ellipses and ovoids can be used. The wire diameter can be between about 0.05 mm (>about 40 gauge) and about 15 mm (about 0000 gauge) or more. For example, the wire diameter can be between about 0.08 mm (about 40 gauge) and about 0.8 mm (about 20 gauge) wire. Excellent results have been obtained using 0.13 mm (36 gauge) wire. Coils can be wire windings (e.g., the wire can be wound in 1, 2, 3, 4, 5, 6, 7, 8, 9, 20, or more turns or can be a single turn. When the coil is made with a single winding, the diameter or width of the wire can preferably be 10 mm or more in diameter. In this context, a "wire" can also be considered a band where the width of the material is greater than the depth. FIG. 3 provides illustrations or views of various coils and groupings of coils. A wire coil can be made of a single wire, a wire alloy or two or more wires. For example, two wires comprising different metals can be wound or braided together.

The inner diameter (or dimension(s) where the coil is not a circle) of each coil can be the same or different and can be between 2 and 200 cm.

Coils 208 can independently be connected to one or more power supplies, such as an AC or DC power supply or combination thereof. For example, an AC current can be supplied to alternating (1, 3, and 5, for example) or adjacent coils (1, 2 and/or 4, 5, for example) while DC current is supplied to the remaining coils. Current can be provided (independently) in a frequency, such as in a patterned frequency, e.g., triangle, square or sine pattern or combination thereof. The frequency supplied to each coil can be the same or different and between 0 to 50 MHz or higher. While the coils 208 can generate and transfer thermal energy, or heat, to the reactor feed gas they are predominantly used to create a magnetic field.

The power supply can be an AC and/or DC power supply or combination thereof. Current can be provided (independently) in a frequency, such as in a patterned frequency, e.g., triangle, square or sine pattern or combination thereof. The frequency supplied to each coil can be the same or different and between 0 to 50 MHz or higher, such as between 1 Hz to 50 Mhz.

As described above, the RA coils typically surround the reactor chamber and/or reactor head space. For example, a first RA coil can be aligned with the first (or bottom) frit. A second RA coil can be aligned with the reactor chamber or nanoporous carbon bed. A third RA coil can be aligned with the second (or top) frit. Where present, a fourth RA coil can be disposed between the first RA and the second RA coil. When present, a fifth RA coil can be disposed between the second RA coil and third RA coil. When two or more reactor chambers, or nanoporous carbon beds are present, it can be desirable to add additional RA coils, also aligned with a second or additional reactor chambers or nanoporous carbon beds. Additional RA coils can be added to align with additional frits, when present.

The RA coils can typically be supported in a support or stator to maintain a fixed distance between each coil. The support, when present, can be transparent. In one embodiment, the RA coils can be configured in a cartridge that can be removed or moved.

The RA coils can, additionally or alternatively, be aligned with the reactor headspace. The reactor headspace can typically be a volume above the second, or top, frit. It is understood that where the reactor assembly is positioned horizontally (or at some other angle than vertical), the geometry of the spaces is maintained, albeit rotated. The reactor headspace can typically be an enclosed volume. For example, the reactor assembly can be inserted into a closed ended transparent (e.g., glass) tube, vial or bottle. The reactor assembly can be movably engaged with the RA coils (or boundary), thereby permitting each RA coil to align to a different element within the reactor assembly. For example, the first RA coil can be realigned with the reactor chamber.

Reactor body 202 can also be a packed, moving or fluidized bed or other configuration characterized by one or more chambers that receive the charge material 204 and facilitates transfer of a reactor feed gas through the charge material 204 and can transfer thermal and/or electromagnetic energy to the charge material 204. The reactor body 202 is generally contained within a housing, e.g., closed end tube, 207 and frits 203, which function to contain the charge material 204. It can be advantageous to use a reactor within a translucent or transparent housing, such as quartz or other materials characterized by a high melting point. The volume of the reactor bed can be fixed or adjustable. For example, the reactor bed can contain about 1 gram, or less of starting material, between about 1 g to 1 kg of starting material or more. Where the reactor assembly comprises two or more reactor chambers, the reactor chambers are preferably directly or indirectly stacked, preferably having a common central axis and can be separated by one or two frits.

The reactor body 202 can be made of a thermally conductive material, such as graphite, copper, aluminum, nickel, molybdenum, platinum, iridium, cobalt, or niobium, or non-thermally conducting material, such as quartz, plastic (e.g., acrylic), or combinations thereof. An optional cup 206 capped with cap 205 can be advantageous. The cup and cap material can be independently selected. For example, a graphite cup can be combined with a graphite cap. A copper cup can be combined with a graphite cap. A graphite cup can be combined with a copper cap. A copper cup can be combined with a copper cap and so on.

The reactor assembly can also receive the gas line through the entrance, or inlet, 201 and to provide an exhaust through an exit, or outlet, 209, optionally controlled by valves. A head space defined by a closed end tube 207 can be configured above the reactor body. The reactor body is preferably made of graphite, copper, or other inorganic rigid material. The gas line is preferably made of an inert tubing, such as glass, acrylic, polyurethane, plexiglass, silicone, stainless steel, and the like can also be used. Tubing can, optionally, be flexible or rigid, translucent or opaque. The inlet is generally below the charge material. The outlet can be below, above or both.

Frits 203 used to define the chamber containing the charge material are also shown. The frits can be made of a porous material which permits gas flow. The frits will preferably have a maximum pore size that is smaller than the particle size of the starting material. Pore sizes of between 2 and 50 microns, preferably between 4 and 15 microns can be used. The thickness of the frits can range satisfactorily between 1 and 10 mm or more. The frits are preferably made of an inert material, such as silica or quartz. Porous frits from Technical Glass Products (Painesville Tp., Ohio) are satisfactory. On the examples below, fused quartz #3 porous frits (QPD10-3) with a pore size between 4 and 15 microns and a thickness of 2-3 microns and fused quartz frits with a pore size between 14 and 40 microns (QPD10-3) were used. The purity of the frits exemplified herein was very high, 99.99% wt, to ensure that the results obtained cannot be dismissed as the result of contamination. Frits of lower purity and quality can also be used. The diameter of the porous frit is preferably selected to permit a snug fit within the reactor interior, or cup. That is, the diameter of the porous frit is approximately the same as the inner diameter of the reactor or cup, if present.

Figure 6A:
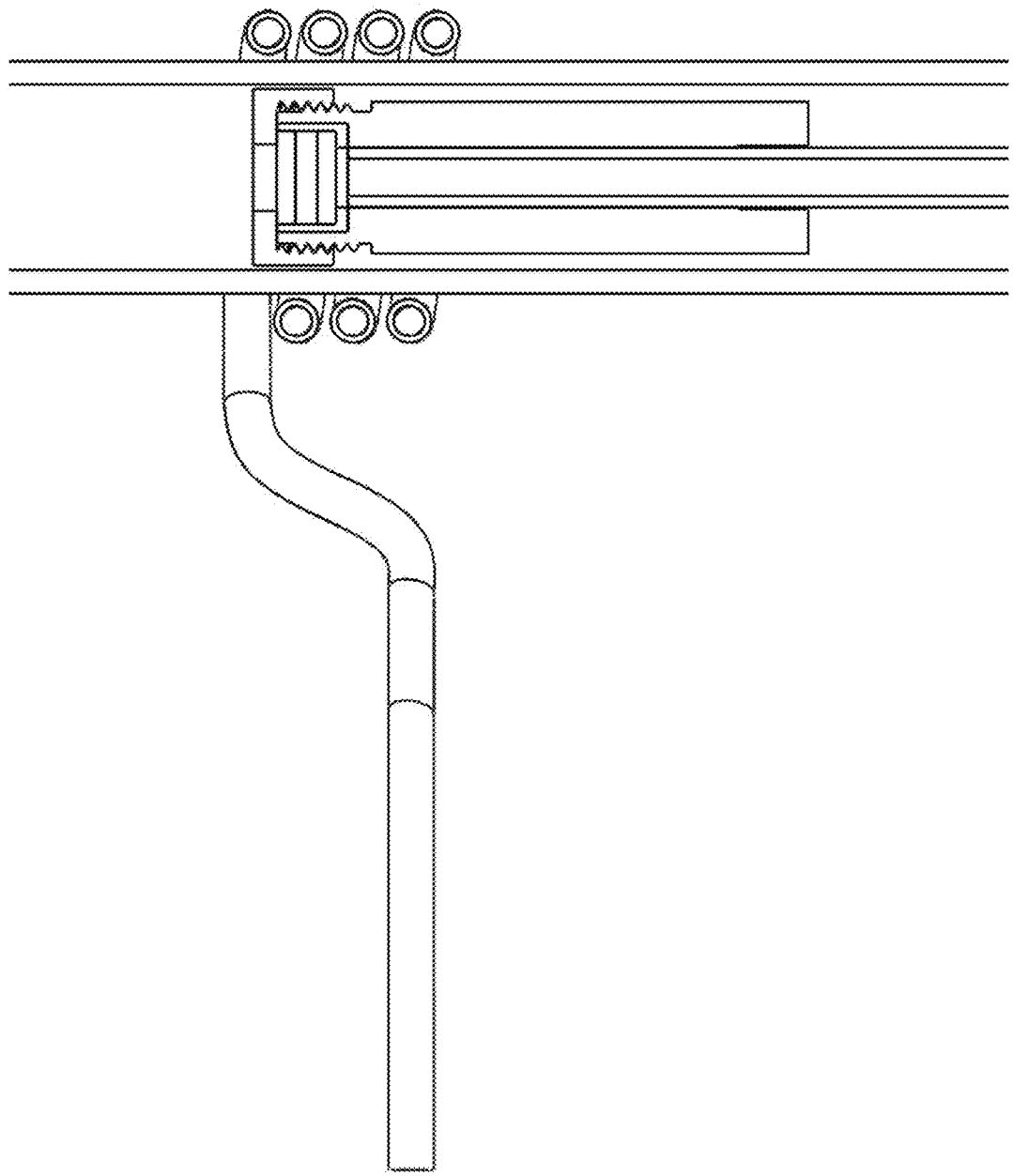
FIGS. 6A and 6B are illustrations of two examples of two composite reactor assemblies.
Figure 6B:
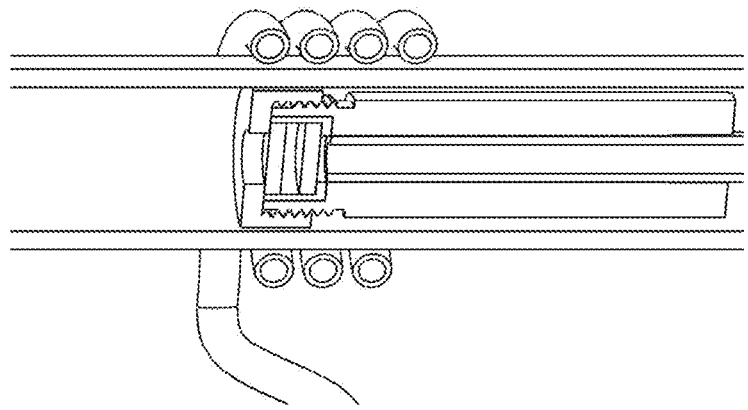

Referring to FIGS. 6A and 6B, a foil can optionally encase the chamber containing the charge material on the inside and/or outside of the frits and/or cup, thereby creating a metal boundary surrounding the starting material. The foil can be a metal, such as copper, platinum, niobium, cobalt, gold, silver, or alloys thereof. The foil can also be graphite or the like. The foil can be between 0 and 0.5 cm thick, preferably 1-10 mm. The profile of the reactor can be linear or it can be configured to contain a constriction below the lower frit, providing the general appearance of a lollipop. The gas line 102 is also shown.

The reactor chamber is sized to contain the desired amount of charge material 204. For the experiments described herein, the chamber is designed to contain between 20 mg to 100 grams of nanoporous carbon powder. Larger reactors can be scaled up.

Figure 4B:
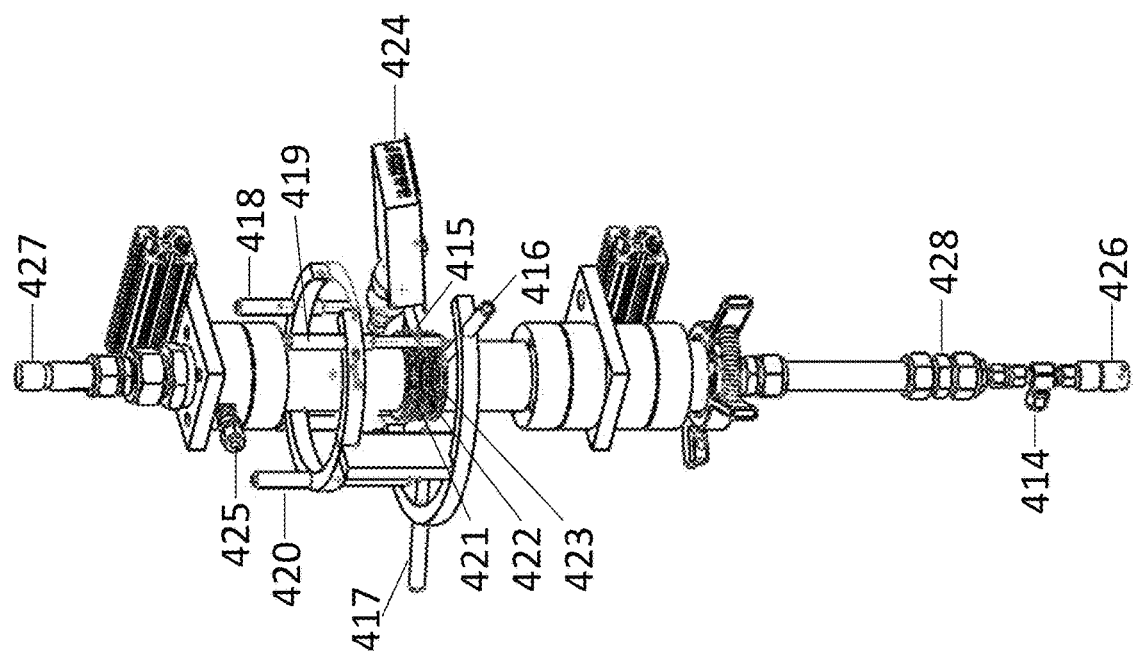
FIG. 4B shows reactor assembly components.

The reactor assembly may be augmented with additional forms of electromagnetic radiation, such as light. FIG. 4B exemplifies light sources 426 and 427 that generate light directed through the reactor housing 415 and starting material contained therein. Preferred light sources 426 and 427 can be lasers and/or can emit light in a wavelength between 10 nm and 1 mm. The light is optionally subjected to one or more filters 428, as shown in the use of light sources (beams) in FIG. 4B. Preferably, the reactor assembly comprises 2, 3, 4, 5 or more pairs of lamps disposed circumferentially around the RA coils. Pencil lamps, such as the lamps used within the E/MEE which is incorporated herein by reference from above, are preferred. The pairs of lamps preferably define a boundary surrounding the coil and are not touching or otherwise adjacent to the coils. Two lamps are considered paired where they are proximal to each other, such as within the same plane with the center axis of an RA coil. Paired lamps can be parallel or orthogonal to each other and the RA coil center axis. Lamps can be considered proximal to each other if the space between any two points between the lamp tip and base is within 10 cm, preferably within 5 cm. Lamps that are positioned orthogonally to the RA coil center axis are generally positioned along the line defined by the radius of one or more RA coils.

The RA lamps, e.g., the pencil lamps proximal to the reactor body, can be matched, or paired, to one or more E/MEE lamps, e.g., the pencil lamps residing within the E/MEE housing and proximal to the gas line. For example, where an E/MEE pencil lamp is a neon lamp, a pair of RA lamps can be neon pencil lamps. Additionally, where an E/MEE pencil lamp is a neon lamp, a pair of RA lamps can be neon pencil lamps. Such matched lamps can emit light characterized by substantially the same wavelength. This can be conveniently achieved by using lamps from the same manufacturer with the same specifications.

The reactor can be in a closed or open housing 415 and can be supported therein by reactor supports. The reactor feed gas is directed to the reactor inlet frit, or bottom frit, directed through the starting material contained within the housing 415 and exits the reactor at the reactor exit frit, or top frit. The reactor feed gas can then be exhausted or recycled, optionally returning to the E/MEE for further treatment.

The reactor can further comprise an x-ray source 211 (FIG. 2C) or 424 (FIG. 4B) and/or one or more lasers 212 (FIG. 2C) or 426 and 427 (FIG. 4B). Preferred x-ray sources include a mini-x. The x-ray is preferably directed through the reactor towards a gas headspace, or target holder 213, above the charge material. The x-ray can be directly or indirectly provided from the source, such as by reflecting the x-ray from a foil disposed above or below a frit.

Figure 15A:
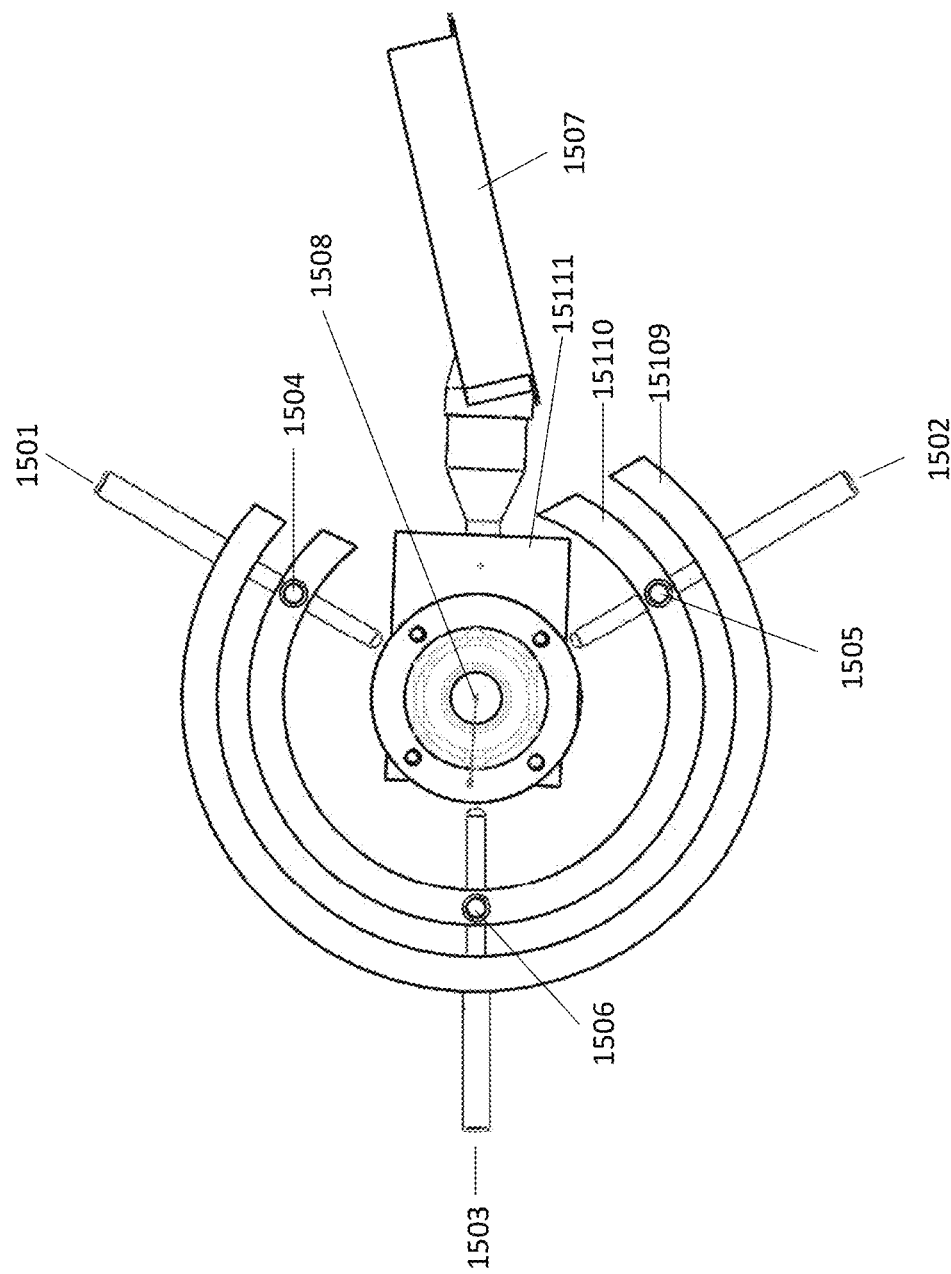
FIG. 15A, FIG. 15B, FIG. 15C, FIG. 15D, FIG. 15E, FIG. 15F, FIG. 15G, FIG. 15H and FIG. 15I illustrate various reactor assembly views according to the invention.

FIG. 15A illustrates a top view of a preferred reactor assembly. Pencil lamp 1501, pencil lamp 1502 and pencil lamp 1503 are shown with the tip directed towards a center axis of the reactor assembly along a radius of the reactor assembly. Pencil lamp 1504, pencil lamp 1505 and pencil lamp 1506 are shown directed parallel to a center axis of the reactor assembly and are disposed in a plane along a radius of the reactor assembly. Pencil lamp 1501, together with pencil lamp 1504, form a first RA lamp pair. Pencil lamp 1502, together with pencil lamp 1505, form a second RA lamp pair. Pencil lamp 1503, together with pencil lamp 1506, form a third RA lamp pair. As with the E/MEE pencil lamps, each RA lamp can be rotated along its x, y or z axis. Each pair can optionally reside within the same radial plane, as shown. Outer support 15109 provides support for the pencil lamps 1501, 1502 and 1503. Inner support 15110 provides support for the pencil lamps 1504, 1505 and 1506. The outer and inner supports are preferably made of non-conductive materials (such as polymers or resins) and are preferably transparent. An optional x-ray source 1507 is shown directing x-rays towards the center axis of the reaction chamber 1508. Reactor connector 15111 is also shown.

Figure 15B:
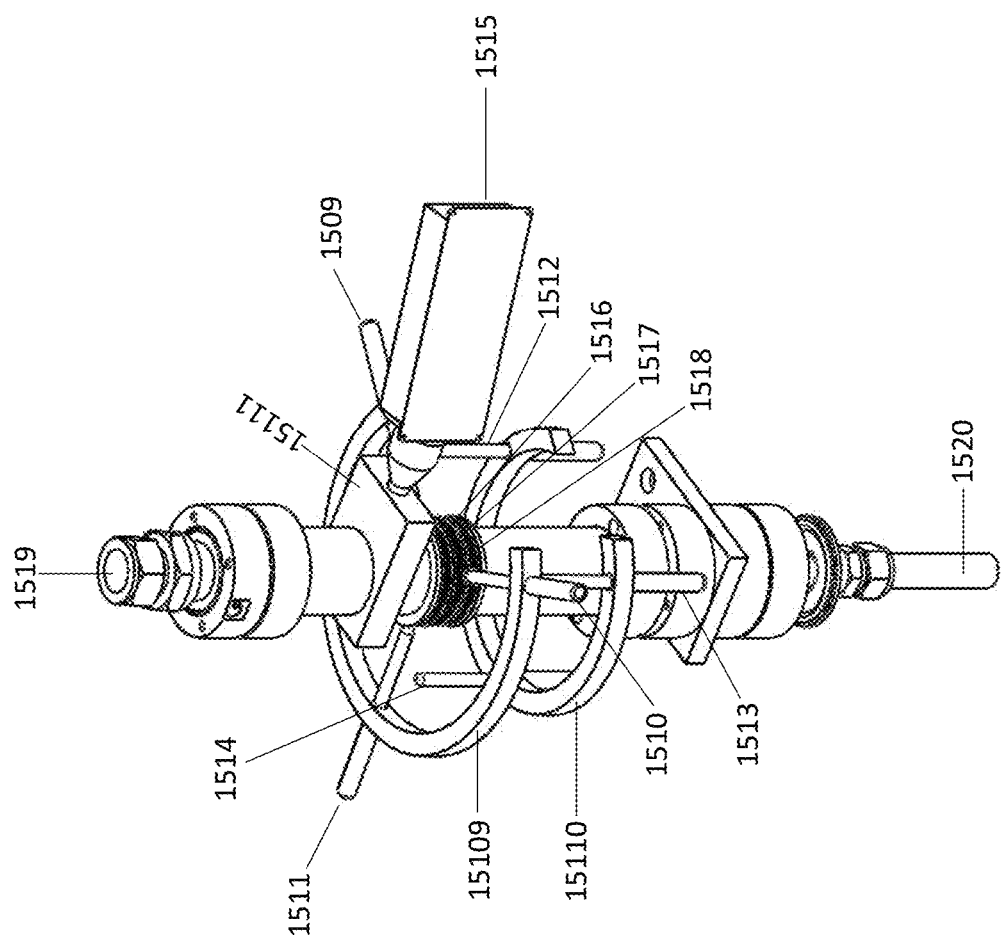

FIG. 15B is a perspective view of this reactor assembly. Pencil lamp 1509, pencil lamp 1510 and pencil lamp 1511 are shown directed with the tip towards a center axis of the reactor assembly along a radius of the reactor assembly. The tip of each lamp aligns with the center, or third, RA coil 1517 and is in the same horizontal plane. Pencil lamp 1512, pencil lamp 1513 and pencil lamp 1514 are shown directed parallel to a center axis of the reactor assembly, disposed in a plane along a radius of the reactor assembly and is characterized by a tip pointing towards top of the reactor, away from the gas inlet 1520. These lamps are illustrated above the horizontal pencil lamps. The length of each pencil lamp align with RA coils 1516, 1517 and 1518. Outer support 15109 and inner support 15110 support the pencil lamps. An optional x-ray source 1515 is shown directing x-rays towards the center axis of the reactor assembly above the third RA coil 1516. Disposed within the reactor assembly can be a reflecting plate to direct the x-ray towards the reaction chamber. Reactor connector 15111 is also shown, as well as other non-material connectors and spacers. Gas inlet 1520 and gas outlet 1519 are also shown.

Figure 15C:
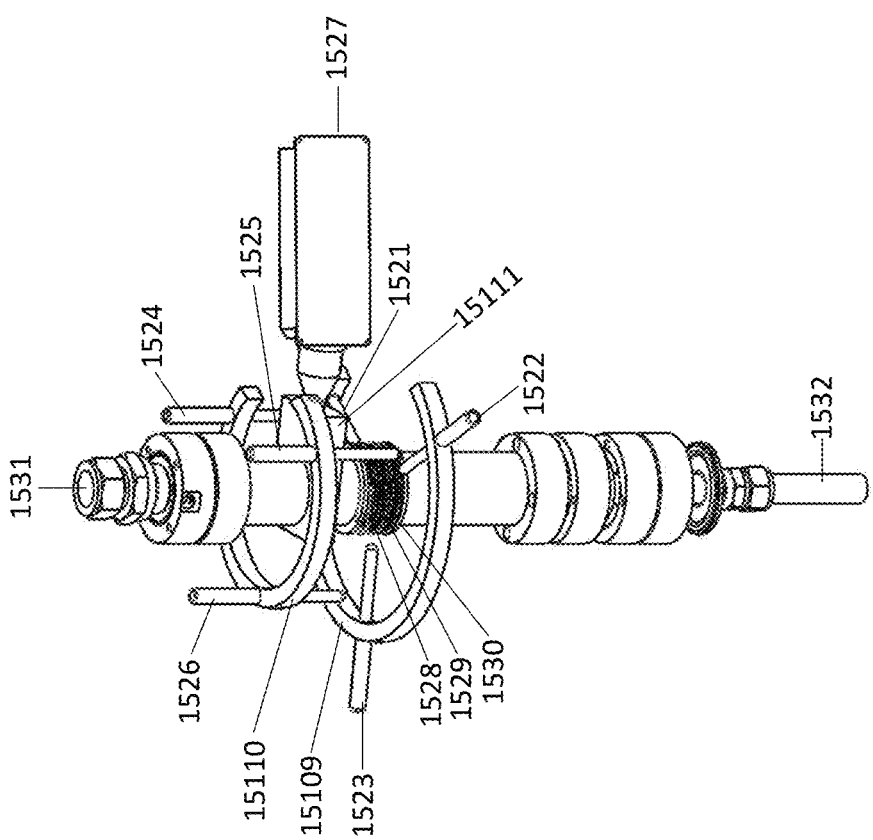

FIG. 15C is a second perspective view of a reactor assembly. Pencil lamp 1521, pencil lamp 1522 and pencil lamp 1523 are shown directed with the tip towards a center axis of the reactor assembly along a radius of the reactor assembly. Pencil lamp 1524, pencil lamp 1525 and pencil lamp 1526 are shown directed parallel to a center axis of the reactor assembly, disposed in a plane along a radius of the reactor assembly and is characterized by a tip pointing towards the bottom of the reactor, towards the gas inlet 1532. These vertical lamps are shown above the horizontal lamps and, again, each pair of lamps can optionally lie in the same radial plane. The tip of each pencil lamp aligns with the third RA coil 1528. Outer support 15109 and inner support 15110 support the pencil lamps. Three RA coils 1528, 1529 and 1530 are shown. An optional x-ray source 1527 is shown directing x-rays towards the center axis of the reactor assembly. Disposed within the reactor assembly can be a reflecting plate to direct the x-ray towards the reaction chamber. Reactor connector 15111 is also shown, as well as other non-material connectors and spacers. Gas inlet 1532 and gas outlet 1531 are also shown.

Figure 15D:
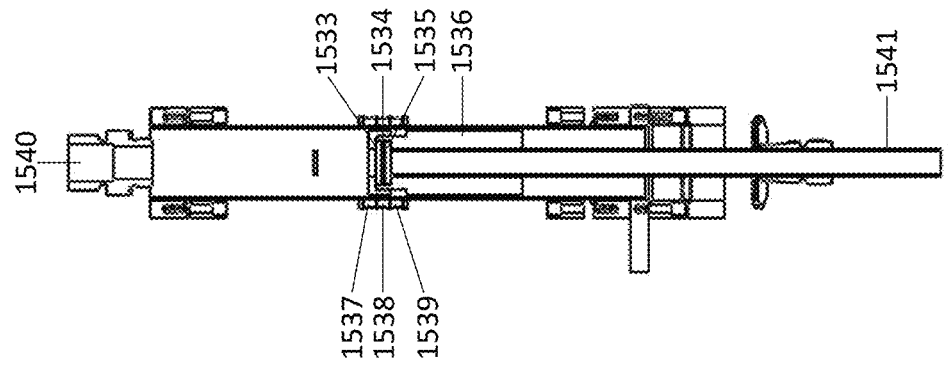

FIG. 15D is a cross sectional side view of the reactor assembly, stripped of the pencil lamps and x-ray source. Gas enters at the inlet 1541 and exits at the outlet 1540. RA coils 1537, 1538 and 1539 are shown. The first, or bottom, frit 1535 and the second, or top, frit 1533 contain the reaction chamber 1534, which can be charged with nanoporous carbon powder. The reactor body 1536 is also shown. Other non-material spacers and connectors remain unlabeled.

Figure 15E:
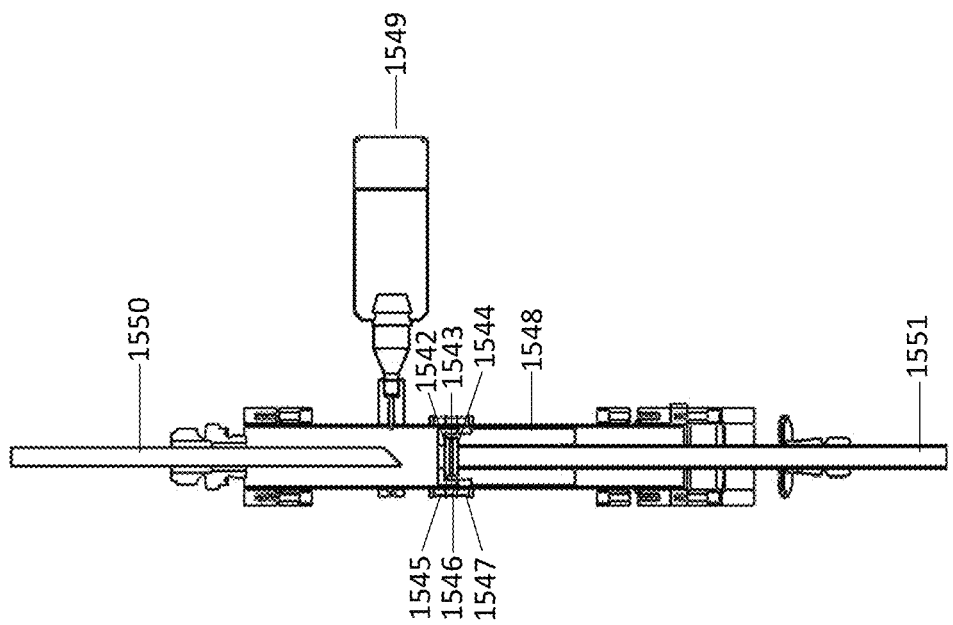

FIG. 15E is a second cross sectional side view of a reactor assembly, stripped of the pencil lamps and x-ray source. Gas enters at the inlet 1551. RA coils 1545, 1546 and 1547 are shown. The first, or bottom, frit 1544 and the second, or top, frit 1542 contain the reaction chamber 1543, which can be charged with nanoporous carbon powder. The reactor body 1548 is also shown. X-ray source 1549 directs x-rays towards the center axis of the reacto assembly which is then deflected towards the reactor chamber with element 1550. Other non-material spacers and connectors remain unlabeled.

Figure 15F:
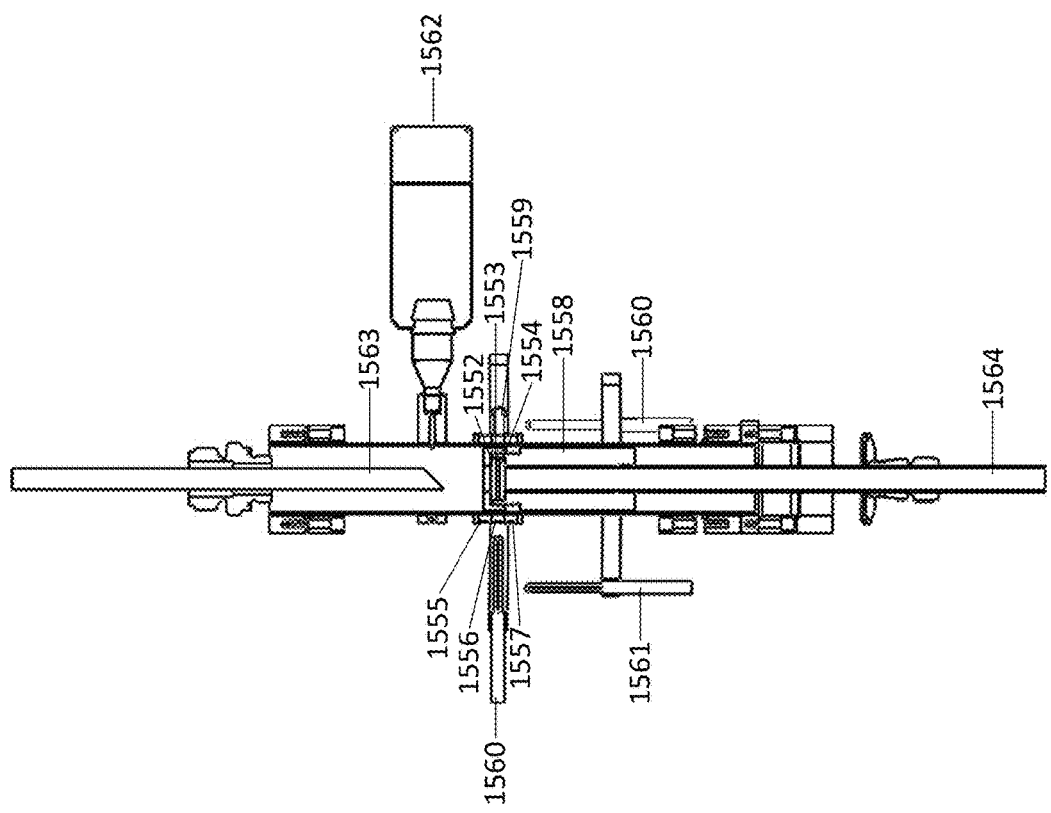

FIG. 15F is a second cross sectional side view of a reactor assembly with the pencil lamps and x-ray source. Gas enters at the inlet 1564. RA coils 1555, 1556 and 1557 are shown. The first, or bottom, frit 1554 and the second, or top, frit 1552 contain the reaction chamber 1553, which can be charged with nanoporous carbon powder. The reactor body 1558 is also shown. Vertical pencil lamps 1560 and 1561 are shown as are horizontal pencil lamps 1560 and 1559. X-ray source 1562 directs x-rays towards the center axis of the reacto assembly which is then deflected towards the reactor chamber with element 1563. Other non-material spacers and connectors remain unlabeled.

Figure 15G:
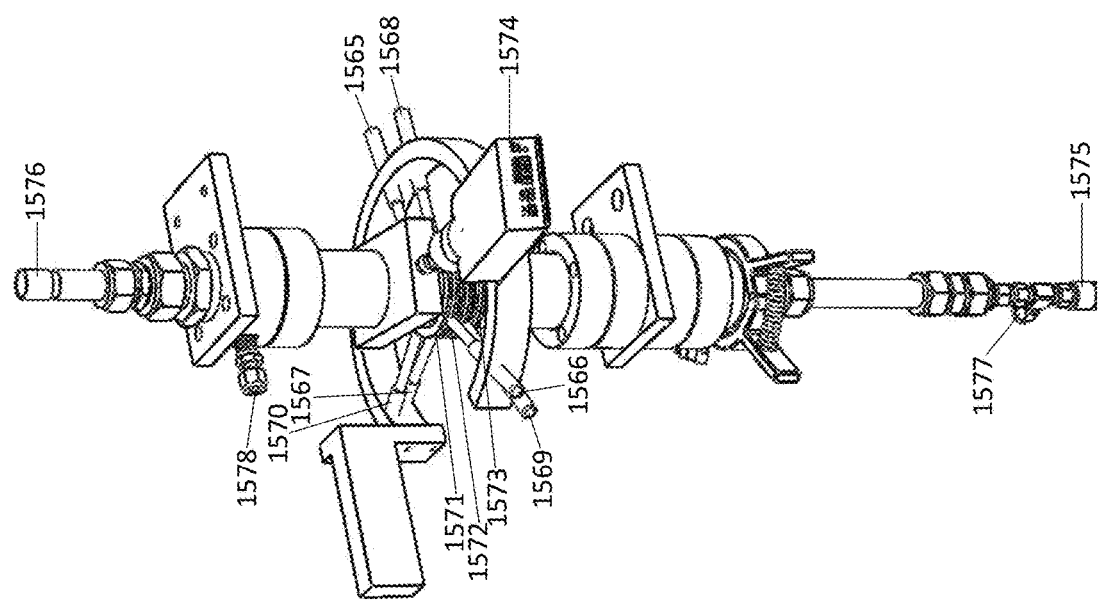

FIG. 15G is a perspective view of a reactor assembly with the pencil lamps and x-ray source. Gas enters at the inlet 1577 and exits at outlet 1578. A first laser 1575 and a second laser 1576 directing radiation towards the reaction chamber along the axis of the reactor assembly is shown. RA coils 1571, 1572 and 1573 are shown. In this embodiment pencil lamps 1565, 1566, 1567, 1568, 1569, and 1570 are all shown horizontally disposed in pairs along the radius towards the reactor assembly central axis. Tips are proximal to RA coils 1571, 1572 and 1573. X-ray source 1574 directs x-rays towards the center axis of the reactor assembly. Support 15109 supports all of the horizontal pencil lamps. Other non-material spacers and connectors remain unlabeled.

Figure 15H:
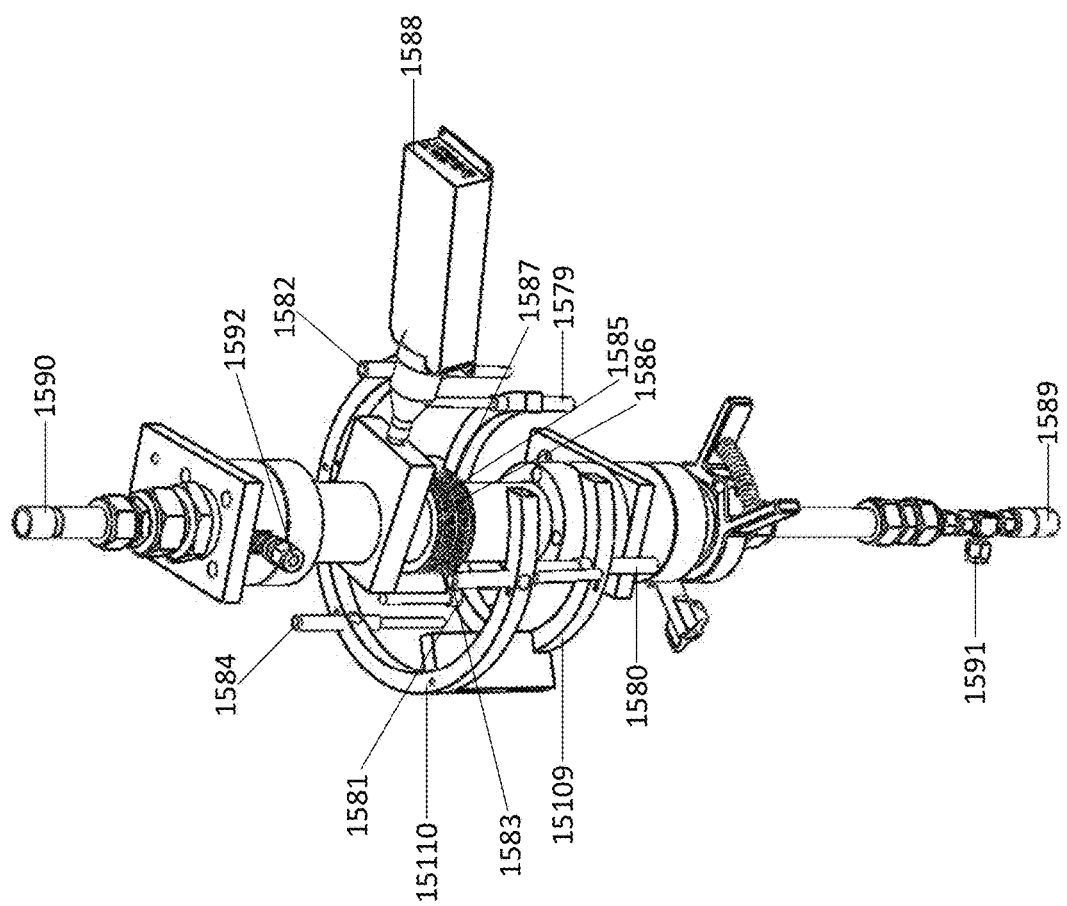

FIG. 15H is a perspective view of a reactor assembly with the pencil lamps and x-ray source. Gas enters at the inlet 1591 and exits at outlet 1592. A first laser 1589 and a second laser 1590 directing radiation towards the reaction chamber along the axis of the reactor assembly is shown. RA coils 1585, 1586 and 1587 are shown. In this embodiment pencil lamps 1579, 1580, 1581, 1582, 1583, and 1584 are all shown vertically disposed in pairs in radial planes aligned with the RA coils 1585, 1586 and 1587. Tips are proximal to RA coils 1585, 1586 and 1587. X-ray source 1588 directs x-rays towards the center axis of the reactor assembly. Supports 15109 and 15110 support the pencil lamps. Other non-material spacers and connectors remain unlabeled.

Figure 15I:
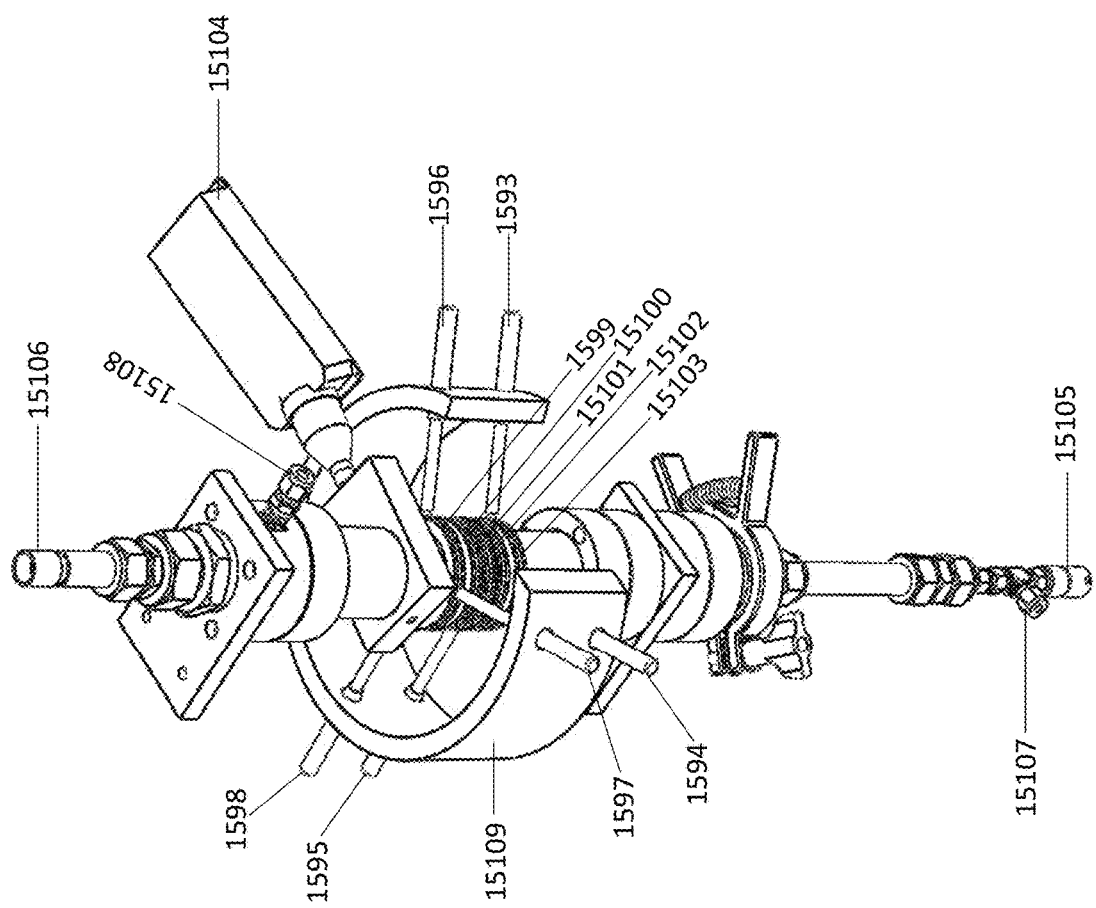
Figure 16A:
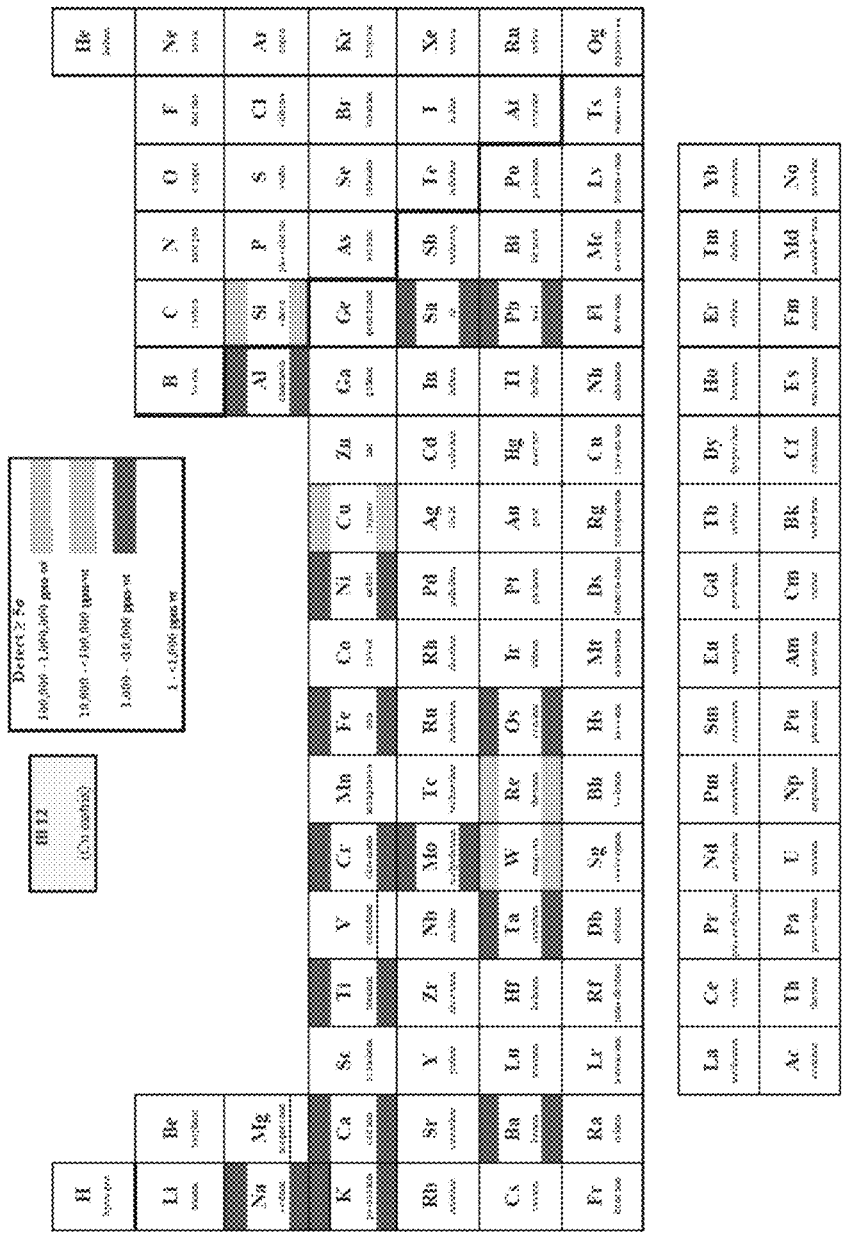
Figure 18A:
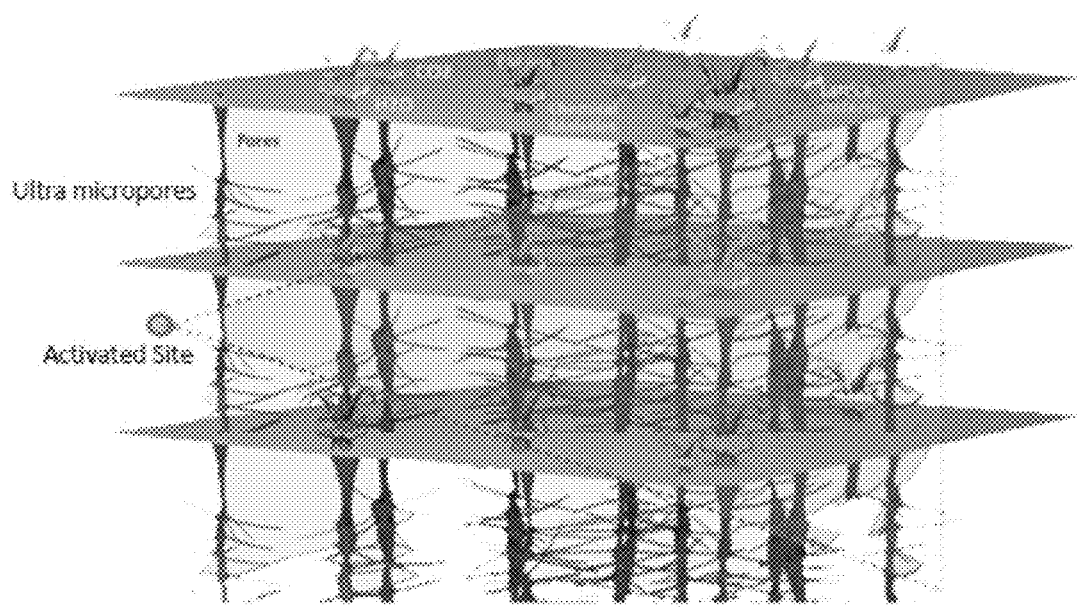
FIG. 18A and FIG. 18B are an artist's rendition of nanoporous carbon compositions. Interconnecting pores are shown as columns connecting layers while the ultramicropores are shown extending from the pores. Optional surface chemistry is illustrated as $CO_2$, $H_2O$ and Chemical Moieties. Electromagnetic (EM) jets are illustrated showing harmonic resonances established within the pores.
Figure 18B:
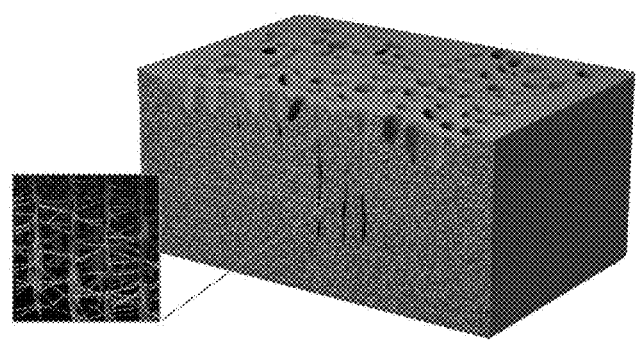

FIG. 15I is a perspective view of a reactor assembly illustrating 5 RA coils, horizontal pencil lamps and an x-ray source. Gas enters at the inlet 15107 and exits at outlet 15108. A first laser 15105 and a second laser 15106 directing radiation towards the reaction chamber along the axis of the reactor assembly is shown. RA coils 1599, 15100, 15101, 15102 and 15103, defining a cylindrical boundary, are shown. In this embodiment pencil lamps 1593, 1594, 1595, 1596, 1597, and 1598 are all shown horizontally disposed in pairs in radial planes aligned with the RA coils. Tips are proximal to RA coils 1599 and 15103. X-ray source 15104 directs x-rays towards the center axis of the reactor assembly. Support 15109 support the pencil lamps. Other non-material spacers and connectors remain unlabeled.

Ni-1 Reactor:

Referring to FIG. 17A, the reactor body (1702) is based on a high purity nickel (Ni) rod. The Ni rod, with an outside diameter of 15.873 mm (OD) is bored through then machined with a female thread on one end. The inside diameter allows for the installation of upper and lower frit and carbon bed. The carbon reaction medium is housed inside the reactor body (1702). To load the reactor, the reactor body (1702) is positioned with the gas discharge opening (1706) facing down on a flat surface. A quartz frit (1705) is placed inside the reactor body (1702) to form the upper containment. 100 mg of carbon is then loaded into the reactor body (1702). After loading of the graphite bed inside the reactor body (1702), a second quartz frit (1703) is installed. A reactor pole (1701), machined out of a high purity graphite rod with matched male threads for the reactor body (1702), is then screwed onto the reactor body (1702). The reactor pole (1701) is designed to provide the identical graphite bed compression as that provided by the cup design (1708).

NiPtG Reactor:

Referring to FIG. 17B, the reactor body (1707) is based on a high purity nickel (Ni) rod. The Ni rod, with an outside diameter of 15.873 mm (OD) is bored through then machined on one end to have an inside diameter of 11.68 mm (ID). The inside diameter allows for the installation of a graphite cup (1708) and a 0.025 mm platinum (Pt) foil (1713). The graphite cup provides for reactor wall and foil isolation from the carbon bed. The carbon reaction medium is housed inside a 99.9999$_{wt}$% pure graphite cup (1708). To load the reactor, a quartz frit (1709) is placed inside the graphite cup (1708) to form the bottom containment. 100 mg of carbon (1710) is then loaded into the cup (1708). After loading of the graphite bed inside the cup, a second quartz frit (1711) is installed; this system is defined as the cup assembly. Prior to installing the cup assembly, the foil (1713) is used to line the inside surface of the reactor wall. The cup assembly is then placed within the nickel reactor body (1707) and foil (1713). After the cup assembly is installed, a 99.9999$_{wt}$% pure graphite cap (1712) is screwed onto the reactor body. The cap secures the cup from movement after assembly.

PtIrGG Reactor:

Referring to FIG. 17C, the reactor body (1714) is based on a high purity graphite rod. The graphite rod, with an outside diameter of 15.873 mm (OD) is bored through then machined on one end to have an inside diameter of 11.68 mm (ID). The inside diameter allows for the installation of a graphite cup (1715) for reactor wall isolation from the carbon bed. The carbon reaction medium is housed inside a 99.9999$_{wt}$% pure graphite cup (1715). To load the reactor, a quartz frit (1716) is placed inside the graphite cup to form the bottom containment. 100 mg of carbon (1717) is then packed into the cup. After loading of the graphite bed inside the cup, a second quartz frit (1718) is installed; this system is defined as the cup assembly. The cup assembly is then placed within the graphite reactor body (1714). After the cup assembly is installed, a cap (1719) composed of platinum and 10% wt iridium is screwed onto the reactor body. The cap secures the cup from movement after assembly.

The residence time of the starting material within the reactor is effective to instantiate product into the starting material and can be between 0 and 15 minutes.

Preferred reactors used in the methods of the invention are shown in the table below.

| Reactor ID | Cup Material | Cap Material | Reactor Material | Pole Material | Boundary | Chamber Capacity | Coil Type |
|---|---|---|---|---|---|---|---|
| CgF | N/A | N/A | Cu, Ni or Mo or graphite | graphite | N/A | 100 mg | Induction |
| CuG | Graphite | graphite | Cu | quartz | N/A | 100 mg | Induction or Frequency |
| PtIrGG | Graphite | Pt/Ir | graphite | quartz | N/A | 100 mg | Induction |
| GPtG | Graphite | graphite | graphite | quartz | Pt | 100 mg | Induction or Frequency |
| GPtGPtG | Graphite | graphite | graphite | quartz | 2X Pt | 100 mg | Induction |
| GG-EL | Graphite | graphite | graphite | quartz | N/A | 100 mg-3 g | Induction or Frequency |
| Foil (Pt) | Graphite | graphite | graphite | quartz | Pt | 100 mg | Induction or Frequency |
| GZ Foil | Graphite | graphite | graphite | quartz | Nb, Co or any | 100 mg | Induction or Frequency |
| nZG Foil | Graphite | Any Z | graphite | quartz | Ir | 100 mg | Induction or Frequency |
| NiG | Graphite | graphite | Ni | quartz | N/A | 100 mg | Induction or Frequency |
| NiPtG | Graphite | graphite | Ni | quartz | Pt | 100 mg | Induction |
| ZG | N/A | Pd/Ru or any Z | graphite | quartz | N/A | 100 mg | Induction |
| Ref-X | Graphite | graphite | graphite | quartz | N/A | 1-20 g | Frequency |

The invention further relates to methods of instantiating elemental metals in nanoporous carbon powders to produce nanoporous carbon compositions. Instantiating is defined herein to include the nucleation, assembly and agglomeration of metal atoms within carbon structures, particularly, ultramicropores. Without being bound by theory, it is believed instantiation is related to, inter alia, degrees of freedom of the electromagnetic field as expressed by quantum field theory. By exposing a gas to harmonic resonances, or harmonics, of electromagnetic radiation within one or more ultramicropores, vacuum energy density is accessed and allows for the nucleation and assembly of atoms. Electromagnetic energy that is within the frequencies of light, x-rays, and magnetic fields subjected to frequency generators can enhance the formation and maintenance of such harmonics. Modifying the boundaries of the system, by selecting the reactor materials and adding a foil layer can also enhance the harmonics.

In particular, the invention includes processes of producing, or instantiating, nanoporous carbon compositions comprising the steps of:
  adding a nanoporous carbon powder into a reactor assembly as described herein;
  adding a gas to the reactor assembly;
  powering the one or more RA coils to a first electromagnetic energy level;
  heating the nanoporous carbon powder;
  harmonic patterning the nanoporous carbon powder between a first electromagnetic energy level and a second electromagnetic energy level for a time sufficient to instantiate an elemental metal nanostructure in a nanopore.

The term "harmonic patterning" is defined herein as oscillating between two or more energy levels (or states) a plurality of times. The energy states can be characterized as a first, or high, energy level and a second, or lower, energy level. The rates of initiating the first energy level, obtaining the second energy level and re-establishing the first energy level can be the same or different. Each rate can be defined in terms of time, such as over 1, 2, 3, 4, 5, 6, 7, 8, 9, 10 or more seconds. Each energy level can be held for a period of time, such as 1, 2, 3, 4, 5, 6, 7, 8, 9, 10 or more seconds. Harmonic patterning is continued until instantiation is achieved.

Where two more electromagnetic radiation sources are present (e.g., coils, x-ray source, lasers, and/or lamps), each can be subjected to harmonic patterning and the patterning can occur independently, simultaneously or sequentially.

The process further comprises independently powering any additional electromagnetic radiation source, as described above in the E/MEE apparatus or reactor assembly. For example, the process further comprises the step(s) of powering RA frequency generator(s) connected to one or more RA coils, one or more lamps or lasers, x-ray sources, induction coils, E/MEE coils, and the like substantially as described above.

The invention further includes processes of quantum printing metal atoms on nanoporous carbon compositions comprising the steps of:
  adding a nanoporous carbon powder into a reactor assembly as described herein;
  adding a gas to the reactor assembly;
  powering the one or more RA coils to a first electromagnetic energy level;
  heating the nanoporous carbon powder;
  harmonically patterning the nanoporous carbon powder between a first electromagnetic energy level and a second electromagnetic energy level for a time sufficient to instantiate an elemental metal nanostructure in a nanopore.

Ex. 1: Energy/Light Combed Activation (E/LC)

One hundred milligrams (100 mg) of powdered carbon was placed in a graphite tubular reactor (15.875 mm) OD, with ID machined to ~9 mm), as described above. Research-grade helium (He) was delivered at 2 SLPM to purge the system for a minimum of 25 seconds or more. The gases were fed through the E/MEE in a horizontal and level gas line, as described above.

Referring to FIG. 1, the argon "KC" light 108 located in position 0 (vertical lamp orientation; 7.62 cm from inlet or entrance flange; at 180°; bulb tip pointing up 2.54 cm from the outer diameter of the gas line) was turned on at the onset while simultaneously energizing the power supply to 5 amps. This light was kept on for a minimum hold time of 9 sec. Next light 109 in position 1 (109; horizontal lamp orientation; 7.62 cm from inlet or entrance flange; at 180°; bulb tip facing exit plate; bulb glass base at the optical entrance; 5.08 cm, from the outer diameter of the gas line), a krypton light, was turned on and the power is increased to 10 amps on the power supply. This was held for 3 seconds, light 107, in position 1 (107; horizontal lamp orientation; at 0°; bulb tip at the optical exit facing the exit plate; 5.04 cm from the outer diameter of the gas line), a xenon light was turned on and held for 9 seconds and the power was increased to 15 amps. After these 3 lights have been sequentially turned on, the amperage delivered to reactor was adjusted to 54 amps and held for a minimum of 40 seconds. Immediately after the power was increased light 103 in position 1 (103; vertical lamp orientation; 7.62 cm from inlet or entrance flange; at 0°; bulb tip pointing down 2.54 cm from the outer diameter of the gas line), a neon light, was turned on.

Amperage "harmonic patterning" was then initiated on the reactor. With each amperage pattern (oscillation), the gases fed to the reactor can treated by the same or different light sequence. In one embodiment of the experimental protocol, the amperage of the reactor was increased to 74 amps over 1 second, the high end harmonic pattern point. The amperage of the reactor was then decreased to 34 amps over 9 seconds and held at 34 amps for 3 seconds. Immediately at the start of the 3 second hold, an argon light 122 in position 1 (122; horizontal lamp orientation; at 180°; bulb tip pointing towards entrance plate at the optical entrance; 5.04 cm from the outer diameter of the gas line) was turned on. After the 3 second hold, amperage to the reactor was then ramped up to 74 amps over 9 seconds with a 3 second hold upon reaching 74 amps before a downward ramp was initiated. The reactor amperage was decreased to 34 amps, over 9 seconds and then held for 3 seconds. Immediately at the start of the 3 second hold, light 103 (103), a neon light in position 1, was turned on. The reactor amperage was again ramped up to 74 amps over 9 seconds, held there for 3 seconds, and then again ramped down to 34 amps over 9 seconds. A long-wave ultraviolet lamp (104; horizontal lamp orientation; at 90°; bulb tip facing entrance plate at the optical entrance; 5.04 cm from the outer diameter of the gas line) in position 1 was turned on. The reactor was again ramped up to 74 amps over 9 seconds, held for 3 seconds, then decreased to 34 amps over another 9 seconds. Next a short-wave ultraviolet lamp (105 horizontal lamp orientation; 7.62 cm from inlet or entrance flange; at 270°; bulb tip at the optical entrance and facing the entrance plate; 5.04 cm from the outer diameter of the gas line) in the E/MEE (position 1) E/MEE section light was turned on and held for 3 seconds. The reactor was again ramped up to 74 amps over 9 seconds; during the 3 second hold, E/MEE section light (106; vertical lamp orientation; centered between optical ends (FIG. 1 entrance 101, exit 110); at 0°; bulb tip pointing down 5.04 cm from the outer diameter of the gas line), a neon light was rotated 90° to position 2 (106; horizontal lamp orientation; at 0°; bulb tip facing exit plate; 5.04 cm from the outer diameter of the gas line). This new position was held for 3 seconds before the reactor amperage was decreased to 34 amps over another 9 seconds. The reactor was then held at 34 amps for 3 seconds, before another ramp up to 74 amps over 9 seconds was initiated. At 3 seconds into this ramp, lamp 107, in position 1 (107) was rotated 90° to position 2 and (vertical lamp orientation; at 0°; bulb tip pointing up; bulb base 5.04 cm from the outer diameter of the gas line) was turned on and held there for the remaining 6 seconds of the 9 second total ramp. The reactor was held for 3 seconds in this condition.

The lights were turned off simultaneously in the E/MEE section as follows: (103), (108), (106), (105) and (104) and the reactor was deenergized. The reactor was held at this state, with continuous gas flow for 27 seconds. Then all remaining lights were turned off. Gas continued to flow for 240 seconds. The sample was removed from the reactor.

Ex. 2 Gradient Sequenced Activation (GSA)

One hundred milligrams (100 mg) of nanoporous carbon powder was placed in a graphite tubular reactor (15.875 mm OD, with ID machined to ~9 mm) as illustrated in FIG. 2A. The powder was contained within the inner reactor using two porous frits which allow gas flow into and out of the reactor while trapping the powder. A fixed (packed) bed was used with a standard or reverse field coil. This reactor assembly was then placed within a quartz outer-containment vessel, which provides both gas control and a sealed system. Gases were delivered to the reaction zone from pressurized gas cylinders controlled by mass flow meters (Porter thermal mass flow meters). A Pall Gaskleen AT Purifier was installed immediately after the CO gas cylinder for carbonyl filtration at flowrates up to 5 SLPM and particulate filtration to 0.003 μm.

Research grade $N_2$ is introduced into the system as reaction gas and carrier of electromagnetic information embedded in its concentration gradient. The gas is introduced at a constant flowrate of 2 SLPM into the reactor until a concentration of at least 99.5% vol is reached at the reactor assembly inlet an entrance boundary condition for the oscillating magnetic field (to maintain the concentration profile for stabilizing information). Reaction/information carrier gas either passed through the E/MEE (as described above in Ex. 1) or bypassed the E/MEE through non-transparent Tygon tubing 6.25 mm OD with an approximate length of 2.4 m (8 feet), allowing for a residence time of 8 seconds between the gas manifold and the reactor inlet. The information carrier gas was maintained for a minimum of 25 seconds. At the completion of the gas induction period, the reactor power supplied to the induction coil operated at variable frequencies with a standard oscillating magnetic field (nominally 222 kHz). The induction coil was powered at 100 amps for a minimum of 35 seconds to satisfy information embedding requirements. The power is then reduced to 58.5 amps, providing a new set of oscillating field parameters to satisfy network information embedding requirements. At this time the carrier gas was secured to induce a reverse gradient created via application of inverse pressure via a vacuum condition. The vacuum was maintained for ~240 seconds to stabilize and fortify the embedded information network. The reactor power was then secured, and the reactor was allowed to cool for ~240 seconds. The reactor was then opened to atmospheric conditions and samples recovered for analysis.

In the baseline experiment, the nanoporous carbon powder was a 200 mesh graphite (Alfa Aesar, >99.9995%$_{wt}$ pure).

Ex. 3: Reduced Gradient Activation (GSR)

One hundred milligrams (100 mg) of nanoporous carbon powder was placed in a graphite tubular reactor (15.875 mm OD, with ID machined to ~9 mm) as illustrated in FIG. 2A. Research grade $N_2$ is introduced into the system as reaction gas and carrier of electromagnetic information embedded in its concentration gradient. The gas is introduced at a constant flowrate of 2 SLPM into the reactor until a concentration of at least 99.5% vol is reached at the reactor assembly inlet an entrance boundary condition for the oscillating magnetic field (to maintain the concentration profile for stabilizing information). Reaction/information carrier gas either passed through the E/MEE (as described above in Ex. 1) or bypassed the E/MEE through non-transparent Tygon tubing 6.35 mm OD with an approximate length of 2.4 m (8 feet), allowing for a residence time of 8 seconds between the gas manifold and the reactor inlet. The information carrier gas was maintained for a minimum of 25 seconds. At the completion of the gas induction period, the reactor power supplied to the induction coil operated at variable frequencies with a standard oscillating magnetic field (nominally 222 kHz). The induction coil was powered at 40 amps for a minimum of 35 seconds to induce information network formation. The power is then reduced to 25 amps, providing a new set of oscillating field parameters to stabilize the embedded information network. At this time the carrier gas was secured to induce a reverse gradient created via application of inverse pressure via a vacuum condition. The vacuum was maintained for ~240 seconds to stabilize and fortify the embedded information network. The reactor power was then secured, and the reactor was allowed to cool for ~240 seconds. The reactor was then opened to atmospheric conditions and samples recovered for analysis.

In the baseline experiment, the nanoporous carbon powder was a 200 mesh graphite (>0.74 mm) (Alfa Aesar, >99.9995%$_{wt}$ pure).

Ex. 4: Site Activation Harmonic Resonance (Mini-X)

Figure 2C:
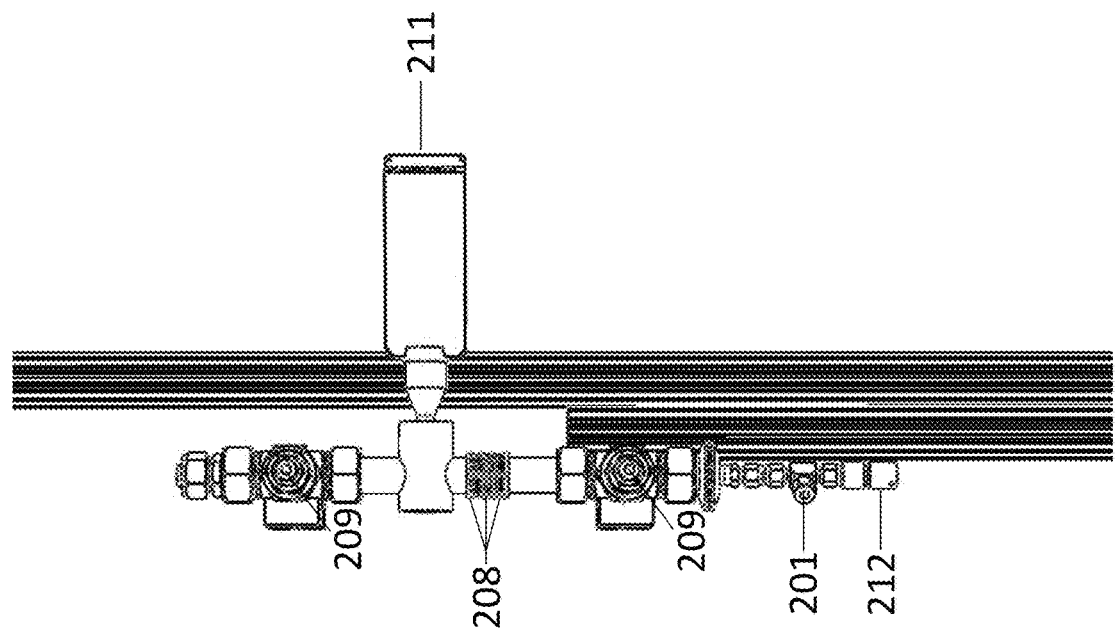

One hundred milligrams (100 mg) of powdered carbon was placed in a graphite tubular reactor (15.873 mm OD, with ID machined to ~9 mm), as illustrated in FIG. 2C. Research-grade helium (He) was delivered at 2 SLPM to purge the system for a minimum of 25 seconds or more. The gases were fed through the E/MEE (as described above in Ex. 1). In this example, a fixed (packed) bed was used with three coils and a mini-X x-ray tube. This reactor assembly was then placed within a quartz outer-containment vessel, which provides both gas control and a sealed system. Gases were delivered to the reaction zone as described above.

Research-grade Helium (He) was delivered at 2 SLPM to the reactor assembly, bypassing the E/MEE section, through non-transparent Tygon tubing 6.35 mm OD with an approximate length of ~2.5 m, allowing for a residence time of 8 seconds between the gas manifold and the reactor system inlet. This gas purge was maintained for a minimum of 25 seconds (or longer) to allow at least three system turnovers (>3× volume purge). At the completion of the purge period, the Mini-x (211) power was turned on and held for 2 seconds. After the 2 second hold, a 405 nm Laser (212) directed through the reactor bed was turned on, immediately followed by frequency generator 2 controlling the second of three coils and then frequency generator 1 controlling the first of three coils. Initially, frequency generator 2 creates harmonic patterns from 626 Hz to 2.83 MHz sine wave ramping at a rate of 3 seconds up and 3 seconds downs for 1 complete harmonic pattern followed by 157 Hz to 557 KHz sine wave with a 6 second ramp up and down with 2 complete cycles followed by 157 Hz to 557 kHz sine wave with a 9 second ramp up and down with 6 complete cycles. Initially, frequency generator 1 creates harmonic patterns from 987 Hz to 2.83 MHz triangle wave ramping at a rate of 3 seconds up and 3 seconds downs for 1 complete harmonic pattern followed by 10 Hz to 987 Hz triangle wave with a 6 second ramp up and down with 2 complete cycles followed by 10 Hz to 987 Hz triangle wave with a 9 second ramp up and down with 6 complete cycles. After the first harmonic pattern cycle for both frequency generators were completed, gas was secured, discontinuing all new flow into the system, and a vacuum system was initiated to pull the gases. This vacuum was held for ~151 seconds or longer, allowing equilibration of the powder within the reactor system. Immediately after the vacuum condition was started, frequency generator 3 was turned on. Initially, frequency generator 3 controlling the third coil created harmonic patterns from 257 kHz to 263 kHz square wave ramping at a rate of 3 seconds up and 3 seconds downs for 4 complete harmonic pattern followed by 257 kHz to 263 kHz square wave with a 6 second ramp up and down with 6 complete cycles followed by 257 kHz to 263 kHz square wave with a 9 second ramp up and down and 3 complete cycles. At 150 seconds plus 600 milliseconds of the vacuum hold, frequency generators 1 and 2 were secured. At 150 seconds plus 809 milliseconds, frequency generator 3 was secured. At the end of the 151 second vacuum condition, an additional 3 second hold without the presence of vacuum was initiated. Following the 3 second hold both the 405 nm laser (212) and mini-X (211) were secured. The sample was removed.

Ex. 5: Site Activation Harmonic Resonance (Active)

One hundred milligrams (100 mg) of powdered carbon was placed in a graphite tubular reactor (15.875 cm OD, with ID machined to ~9 mm) with three wire windings (or coils) each connected to a power source and frequency generator, as shown in FIG. 2C. The powder was contained within the inner reactor using two porous frits designed to allow gas flow into and out of the reactor while trapping the powder. This reactor assembly was then placed within a sealed quartz outer-containment vessel as described above.

Research-grade Helium (He) was delivered at 2 SLPM to the reactor assembly. The gases bypass the E/MEE section, passing through non-transparent Tygon tubing 6.35 mm OD with an approximate length of ~2.5 m, allowing for a residence time of 8 seconds between the gas manifold and the reactor system inlet. This gas purge was maintained for a minimum of 25 seconds (or longer) to allow at least three system turnovers (>3× volume purge). At the completion of the purge period, the first and second frequency generators (1 and 2) connected to two coils were turned on and the frequency harmonic patterning started. Initially frequency generator 2 generated harmonic patterns from 626 Hz to 2.83 MHz sine wave ramping at a rate of 3 seconds up and 3 seconds downs for 1 complete harmonic pattern followed by 157 Hz to 557 kHz sine wave with a 6 second ramp up and down with 2 complete cycles followed by 157 Hz to 557 kHz sine wave with a 9 second ramp up and down with 6 complete cycles. Initially frequency generator 1 generated harmonic pattern from 987 Hz to 2.83 MHz triangle wave ramping at a rate of 3 seconds up and 3 seconds downs for 1 complete harmonic pattern followed by 10 Hz to 987 Hz triangle wave with a 6 second ramp up and down with 2 complete cycles followed by 10 Hz to 987 Hz triangle wave with a 9 second ramp up and down with 6 complete cycles. After the first harmonic pattern cycle for both frequency generator 1 and 2 were completed, gas was secured, discontinuing all new flow into the system, and a vacuum was initiated. The vacuum was held for ~152 seconds or longer. Immediately after the vacuum condition was started, frequency generator 3 connected to the third coil was turned on and the frequency harmonics started. Initially frequency generator 3 generated harmonic patterns from 257 kHz to 263 kHz square wave ramping at a rate of 3 seconds up and 3 seconds downs for 4 complete harmonic patterns followed by 257 kHz to 263 kHz square wave with a 6 second ramp up and down with 6 complete cycles followed by 257 kHz to 263 kHz square wave with a 9 second ramp up and down and 3 complete cycles. At 133 seconds plus 200 milliseconds of the vacuum hold, frequency generators 1 and 2 were secured. At 151 seconds plus 600 milliseconds, frequency generator 3 was secured. At the end of the 152 second vacuum condition, an additional 15 second hold without the presence of vacuum was initiated. The sample was removed.

Ex. 6: Site Activation Harmonic Resonance (Static)

One hundred milligrams (100 mg) of powdered carbon was placed in a graphite tubular reactor (15.875 mm OD, with ID machined to ~9 mm) with three wire windings or coils, as shown in FIG. 2C.

Research-grade nitrogen gas was delivered at 2 SLPM to the reactor assembly. The gas bypassed the E/MEE section, as described above. A gas purge was maintained for a minimum of 25 seconds (or longer). At the completion of the purge period, frequency generator 2 and then frequency generator 1, connected to two coils, were turned on. Frequency generator 2 generated harmonic patterns from 626 Hz to 2.83 MHz sine wave ramping at a rate of 3 seconds up and 3 seconds downs for 6 complete harmonic patterns followed by 157 Hz to 557 kHz sine wave with a 9 second ramp up and down with 3 complete cycles followed by 157 Hz to 557 kHz sine wave with a 6 second ramp up and down with 10 complete cycles. Frequency generator 1 generated harmonic patterns from 987 Hz to 2.83 Mhz triangle wave ramping at a rate of 3 seconds up and 3 seconds downs for 6 complete harmonic pattern followed by 10 Hz to 987 hz triangle wave with a 9 second ramp up and down with 2 complete cycles followed by 10 Hz to 987 hz triangle wave with a 6 second ramp up and down with 10 complete cycles. After the first harmonic pattern cycle for both frequency generator 1 and 2 was completed, gas was secured, discontinuing all new flow into the system, and a vacuum system was initiated to pull the gases. The vacuum was held for ~183 seconds or longer. Immediately after the vacuum was started, frequency generator 3 was turned on and the frequency harmonic patterns started. Frequency generator 3 was brought to 1.7 MHz square wave. At 174 seconds of the vacuum hold, frequency generators 1 and 2 were secured. After an additional 182.6 seconds, frequency generator 3 was secured. The vacuum was discontinued for an additional 15 seconds. The sample was removed.

Ex. 7: Ref-X Conditioning—Static Pre-Conditioning

One gram (1 g) of powdered carbon was placed in a graphite tubular reactor (44.5 mm OD, with ID machined to ~25 mm) as shown in FIG. 4B. The gases pass through an E/MEE section, as generally described in Ex. 1. Research-grade nitrogen was delivered at 2 SLPM to the reactor assembly. A purge was maintained for 90 seconds. The reactor assembly was then installed in a Desorb conditioning oven, preheated to 176 C (350° F.). After 30 seconds, frequency generator 1 was turned on. Frequency generator 1 generated harmonic patterns from 0.001 Hz to 3.5 MHz sine wave ramping at a rate of 9 seconds up and 9 seconds downs for 33 complete harmonic patterns followed by 0.001 Hz to 3.5 MHz triangle wave ramping at a rate of 9 seconds up and 9 seconds downs for 34 complete harmonic patterns followed by 0.001 Hz to 3.5 MHz square wave ramping at a rate of 9 seconds up and 9 seconds downs for 33 complete harmonic patterns followed by 827 Hz to 2.83 MHz sine wave ramping at a rate of 6 seconds up and 6 seconds downs for 30 complete harmonic patterns followed by 827 Hz to 2.83 MHz triangle wave ramping at a rate of 7 seconds up and 5 seconds downs for 30 complete harmonic patterns followed by 827 Hz to 2.83 MHz square wave ramping at a rate of 7 seconds up and 5 seconds downs for 40 complete harmonic patterns followed by 827 Hz to 2.83 MHz square wave ramping at a rate of 5 seconds up and 7 seconds downs for 50 complete harmonic patterns followed by 235.5 kHz to 474 kHz triangle wave ramping at a rate of 2 seconds up and 4 seconds downs for 100 complete harmonic patterns followed by 235.5 kHz to 474 kHz sine wave ramping at a rate of 2 seconds up and 4 seconds downs for 100 complete harmonic patterns then by 235.5 kHz to 474 kHz square wave ramping at a rate of 2 seconds up and 4 seconds downs for 100 complete harmonic patterns. Thirty seconds after the initiation of the frequency harmonic patterns, 403 light was turned on in E/MEE (FIG. 4A). After a 60 second hold, 402 was turned on and held for 1745 seconds. 404 was then turned on and held for 360 seconds. 403 was then rotated 90° to position 2 and held for 6 seconds. 402 was then rotated 90° to position 2 and held for 4 seconds. 408 was then turned on and held for 395 seconds. 408 was then rotated 90° to position 2 and held for 35 seconds. 405 was then turned on and held for 347 seconds. 406 was then turned on and held for 6 seconds. 408 was then rotated 90° back to position land held for 5 seconds. 405 was then turned off and held for an additional 600 seconds. The frequency generators were paused while the reactor assembly was removed from the oven and placed on a heat resistant platform while maintaining gas flow. The frequency harmonic patterns were immediately restarted. 406 was rotated to position 2 and held for 36 seconds. 406 was then rotated to position 1 and held for 126 seconds. 408 was then rotated to position 2 and held for 600 seconds. 408 was then rotated to position 1 and held for 840 seconds. 408 was then rotated to position 2 and held for 184 seconds. 408 was then rotated to position 1 and held for 6 seconds. 403 was then rotated to position 1, turned off and held for 9 seconds. Frequency generator 1 was secured; 408 & 406 were turned off and held for 9 seconds. 404* and then 402 were turned off and held for 90 seconds. Gas flow was secured and the reactor assembly was disconnected from the gas feed line. The carbon bed was removed.

Ex. 8: Ref-X Conditioning—Static

One gram (1 g) of powdered carbon was placed in a graphite tubular reactor (44.45 mm OD, with ID machined to ~25 mm), as shown in FIG. 4B. A fixed (packed) bed is used with three wire windings or coils.

Research-grade Neon (Ne) gas was delivered at 2 SLPM to the reactor assembly. The gas passed through the E/MEE section. A gas purge was maintained for a minimum of 90 seconds (or longer) to allow at least three system turnovers (>3× volume purge). At the completion of the purge period, the 404 was turned on immediately followed by 402 and held for 8 seconds. The coil in the E/MEE was energized and using frequency generator 4. Frequency generator 4 provided a constant 1.697 MHz Square wave signal to the coil (407). Immediately after Frequency generator 4 is started, 408 was turned on immediately followed by the turning on the Mini-X x-ray source (424) followed by a 2 second hold. A 405 nm laser (427) was turned on immediately followed by a 532 nm laser (426) and held for 22 seconds. The following lights were powered in the following sequence: 415 & 418, 416 & 419, 417 & 420, and 406 which were then held for 9 seconds. 402 was then rotated 90° to position 2 immediately followed by a change in the incoming gas from Neon (Ne) to Nitrogen (N2) and held for 90 seconds. 406 was then rotated 90° to position 2 and held for 3 seconds. 415 was turned off and 4034 was immediately rotated 90° to position 2 and held for 6 seconds. 415 was turned on and held for 3 seconds. 406 was then rotated 90° to position 1 and held for 4 seconds. 404 was turned off and held for 2 seconds. 406 was turned off and held for 27 seconds. The frequency generator 2 and then frequency generator 1 were turned on and held for 5 second hold. Initially frequency generator 2 generated harmonic patterns from 626 Hz to 2.83 MHz sine wave ramping at a rate of 3 seconds up and 3 seconds downs for 20 complete harmonic patterns followed by 157 Hz to 557 Khz sine wave with a 9 second ramp up and down with 8 complete cycles followed by 157 Hz to 557 Khz sine wave with a 6 second ramp up and down with 10 complete cycles. Initially frequency generator 1 generated harmonic patterns from 987 Hz to 2.83 MHz triangle wave ramping at a rate of 3 seconds up and 3 seconds downs for 20 complete harmonic pattern followed by 10 Hz to 987 Hz triangle wave with a 9 second ramp up and down with 8 complete cycles followed by 10 Hz to 987 Hz triangle wave with a 6 second ramp up and down with 10 complete cycles. Five seconds after the frequency generators began, 418 and 416 were turned off and held for 1 second. 418 and lower 416 were then turned on. 419 and 420 were then turned off and held for 1 second. 419 and 420 were then turned on and held for 27 seconds. Frequency generator 4 was shut down and 408 was turned off, immediately followed by turning off 402 and held for 87 seconds. Incoming gas flow was secured, and a vacuum was started and held for 18 seconds. 403 was turned off and held for 72 seconds. 405 was turned on and frequency generator 3 was started at a fixed frequency of 1.697 MHz square wave and held for 54 seconds. Both frequency generators 1 and 2 were secured and held for 123 seconds. Frequency generator 3 and the vacuum system were secured and held for 3 seconds. 415, 416, 417, 418, 419, and 420 are turned off simultaneously and held for 3 seconds. 424 and 427 were then shut off simultaneously. The 426 was then shut off and held for 3 seconds. 404 was turned off and held for 15 seconds. The samples were then removed.

Ex. 9: Ref-X Conditioning—Eversion

One gram (1 g) of powdered carbon is placed in a graphite tubular reactor (44.45 mm OD, with ID machined to ~25 mm), as shown in FIG. 4B.

Research-grade Neon (Ne) gas was delivered at 2 SLPM to the reactor assembly. During the purge, gases passed through the E/MEE section. This gas purge was maintained for a minimum of 90 seconds to allow at least three system turnovers (>3× volume purge). At the completion of the purge period, the 404 was turned on immediately followed by 402 then an 8 second hold was started. At the end of the 8 second hold, the coil (407) in the E/MEE was energized. Frequency generator 4 started harmonic patterns from 557 Hz to 157 kHz sine wave ramping at 9 seconds up and 3 seconds down to the coil until shutdown. Immediately after Frequency generator 4 was started, 408 was turned on immediately followed by the turning on of the Mini-X x-ray source (427) followed by a 2 second hold. A 405 nm laser was then turned on immediately followed by a 532 nm laser (426) followed by a 22 second hold period. The following lights were then turned on in the following sequence, 415 & 418, 416 & 419, 417 & 420, then 406 followed by a 9 second hold. 402 was then rotated 90° to position 2 immediately followed by a change in the incoming gas from Neon (Ne) to Nitrogen (N2) followed by a 90 second hold. 406 was then rotated 90° to position 2 followed by a 3 second hold. 415 was then turned off immediately followed by 403 rotated 90° to position 2 followed by a 6 second hold. 415 was then turned on followed by a 3 second hold. 406 was then rotated 90° to position 1 followed by a 4 second hold. 404 was then turned off followed by a 2 second hold. 406 was then turned off followed by a 27 second hold. Frequency generator 2 and then frequency generator 1 were then turned on and their frequency harmonic patterns started followed by a 5 second hold. Frequency generator 2 started harmonic patterns from 626 Hz to 2.83 MHz sine wave ramping at a rate of 3 seconds up and 3 seconds downs for 20 complete harmonic patterns followed by 157 Hz to 557 kHz sine wave with a 9 second ramp up and down with 8 complete cycles followed by 287.5 kHz sine wave and held until termination. Frequency generator 1 started harmonic patterns from 987 Hz to 2.83 MHz triangle wave ramping at a rate of 3 seconds up and 3 seconds downs for 20 complete harmonic pattern followed by 10 Hz to 987 Hz triangle wave with a 9 second ramp up and down with 8 complete cycles followed by 285 Hz triangle wave and held until termination. After the 5 second hold, 418 and 416 were turned off and held for 1 second. 418 and 416 were then turned on. 419 and 420 were then turned off and held for 1 second. 419 and 420 were turned on and held for 27 seconds. Frequency generator 4 was shut down and 408 was turned off. 402 was immediately turned off and held for 87 seconds. Incoming flow was secured, and a vacuum was started on the system and held for 18 seconds. 403 was turned off and held for 72 seconds. 405 was turned on. Frequency generator 3 was started and the frequency was set at a fixed frequency of 1.697 MHz square wave for 240 seconds followed by 28.25 MHz to 28.75 MHz square wave cycling at 3 seconds up and down for 22 cycles and then 1.697 MHz square wave signal until termination. At the end of the 174 seconds of the 240 second hold on frequency generator 3, both frequency generator 1 and 2 were secured and a 1 second hold started. At the end of the 1 second hold, frequency generator 3 and the vacuum system were secured and a 3 second hold started. At the end of the 3 second, the following lights, 415, 416, 417, 418, 419, and 420 were turned off simultaneously, followed by a 3 second hold. The 424 and 427 were then shut off simultaneously. The 426 was then shut off and a 3 second hold was started. At the end of the 3 second hold time, 404 was turned off and a 15 second hold was started. At the end of the 15 second hold, the sample was removed.

Below is a table of the experiments performed with positive results:

| Illustration | Protocol | Carbon Form | Other Carbon Pretreatment | Reactor ID | Gas |
|---|---|---|---|---|---|
| 1 | GSA | Graphite Z | | ZG | N2 |
| 2 | GSA | Graphite Z | | CuG | N2 |
| 3 | GSA | Graphite Z | | GPtGPtG | He |
| 4 | GSA | Graphite Z | | NiPtG | N2 |
| 5 | GSA (at 750 C.) | Graphite Z | | NiPtG | He |
| 6 | GSA | Graphite Z | | PtIrGG | He |
| 7 | GSA | Graphite R | | CuG | N2 |
| 8 | Mini-X | Graphite R | | GG-EL | N2 |
| 9 | E/LC | APKI | | CgF | Kr |
| 10 | GSA | APKI | | CuG | N2 |
| 11 | GSA | APKI | 350 C. Desorb | CuG | N2 |
| 12 | E/LC | PEEK | | GG-EL | CO |
| 13 | GSA | PEEK | | CuG | N2 |
| 14 | GSA | MSP20X (raw) | | CuG | N2 |
| 15 | GSR | Lot 2006 | 24% CO2 | GG-EL | N2 |
| 16 | GSA | Lot 2006 | 350 C. Desorb 12% RH Soak | GG-EL | N2 |
| 17 | GSA | Lot 1000 | | CuG | N2 |
| 18 | GSA | Lot 1002 | | CuG | N2 |
| 19 | GSA | Lot 1013 | | GG-EL | N2 |
| 20 | GSA | MSC30(raw) | | GPtG | He |
| 21 | GSR | Lot 2008 | | GG-EL | N2 |
| 22 | GSA | Lot 2003 | | CuG | N2 |
| 23 | GSA | Lot 2003 | 125 C. Desorb | CuG | N2 |
| 24 | GSA | Lot 2003 | 250 C. Desorb | CuG | N2 |
| 25 | GSA | Lot 2003 | 350 C. Desorb | CuG | N2 |
| 26 | E/LC | GSX (raw) | | GG-EL/GZ(Co) | He |
| 27 | E/LC | Lot 2005 | 40% RH Soak | GG-EL | He |

-continued

| Illustration | Protocol | Carbon Form | Other Carbon Pretreatment | Reactor ID | Gas |
|---|---|---|---|---|---|
| 28 | GSA | Lot 2005 | 70% RH soak | GG-EL | N2 |
| 29 | GSR | Lot 2005 | 12% RH Soak | GG-EL | N2 |
| 30 | GSR | Lot 2005 | | GG-EL/GZ-(Pt) | He |
| 31 | E/LC | Graphite Z | | GZ (Nb) | He |
| 32 | E/LC | Graphite Z | | GZ(Co) | He |
| 33 | E/LC | Graphite Z | | NiG | N2 |
| 34 | GSA | Graphite Z | | ZG (Z=Cu/Rx=G) | N2 |
| 35 | GSA | Graphite Z | | ZG (Rx=Cu/Z$^{ins}$=G) | N2 |
| 36 | E/LC | MSC30(raw) | | NiG | He |
| 37 | E/LC | Graphite Z | | CgF | Mix 2 |
| 38 | E/LC | Graphite A | | Lollipop | Mix 1 |
| 39 | QPP-PFC (static) | Lot 1044 | | GG-EL | N2 |
| 40 | QPP-PFC (static) | 20% Lot 1044 80% Lot 1045 | | GG-EL | N2 |
| 41 | QPP-PFC (static) | Lot 2006 | 350 C. Desorb 70% RH Soak 24% CO2 | GG-EL | He |
| 42 | QPP-PFC (active) | MSP20X (raw) | | CuG | N2 |
| 43 | QPP-PCC(active | Lot 2000 | | CuG | He/H2 |
| 44 | QPP-PFC (active) | MSP20X (raw) | | CuG | N2 |
| 45 | Ref-X Static | Ref-X Blend | | Ref-X | Mix 3 |
| 46 | Ref-X Static | Ref-X Blend | | Ref-X | Mix 3 |
| 47 | Ref-X Static | Ref-X Blend | | Ref-X | Mix 3 |
| 48 | Ref-X Eversion | Ref-X Blend | | Ref-X | Mix 3 |
| 49 | Ref-X Eversion | Ref-X Blend | | Ref-X | Mix 3 |
| 50 | QPP-PFC (static) | MSP20X (raw) | | CuG | He/H2 |

Mix 1 = CO(50%):Kr(35%):He(15%)
Mix 3 = Ne followed by N2

Elements were detected in accordance with the above illustrations are set forth in the periodic table found in FIG. 16A-16E. Starting materials resulted in instantiation in accordance with the following table.

| Starting Material | Si | Ca | Ti | V | Cr | Mn | Fe | Co | Ni | Cu | Zn | Y | Zr | Nb | Mo | Ce | W | Pb |
|---|---|---|---|---|---|---|---|---|---|---|---|---|---|---|---|---|---|---|
| $C_{graphite}$ | 12 | 2 | 7 | 9 | | 3 | 5 | | 112 | 20 | 11 | | | | 8 | | 6 | |
| $C_{nano}$ | 53 | 19 | 7 | 3 | 36 | 4 | 3 | 16 | 51 | 3 | | 1 | 23 | 7 | 3 | 8 | 4 | 19 |
| $C_{act}$ | N/R | | 1 | | | 6 | | 1 | 38 | | 3 | 1 | 1 | 1 | 6 | 32 | 1 | 3 |
| $C_{MCG}$ | 6 | 3 | 3 | 2 | | 2 | 1 | | 3 | 1 | | | | | 6 | | | |

The patent and scientific literature referred to herein establishes the knowledge that is available to those with skill in the art. All United States patents and published or unpublished United States patent applications cited herein are incorporated by reference. All published foreign patents and patent applications cited herein are hereby incorporated by reference. All other published references, documents, manuscripts and scientific literature cited herein are hereby incorporated by reference.

While this invention has been particularly shown and described with references to preferred embodiments thereof, it will be understood by those skilled in the art that various changes in form and details may be made therein without departing from the scope of the invention encompassed by the appended claims. Numerical values were presented in the specification and claims are understood to be approximate values (e.g., approximately or about) as would be determined by the person of ordinary skill in the art in the context of the value. For example, a stated value can be understood to mean within 10% of the stated value, unless the person of ordinary skill in the art would understand otherwise, such as a value that must be an integer.

What is claimed is:

1. A process of instantiating an elemental metal within an ultramicro pore of a nanoporous carbon powder composition comprising the steps of:
   (i) initiating a gas flow in a reactor assembly (RA) comprising:
      a) a gas inlet and one or more gas outlets;
      b) a reactor chamber containing a nanoporous carbon material disposed within a reactor cup and covered with a reactor cap;
      c) a first porous frit defining a floor of the reactor chamber disposed within the reactor cup;
      d) a second porous frit defining the ceiling of the reactor chamber and disposed below the reactor cap; wherein each porous frit has a porosity that is sufficient to allow a gas to permeate into the reactor chamber and contain a nanoporous carbon material;
      e) a reactor head space disposed above the reactor cap;
      f) a foil disposed between the reactor chamber and reactor cup, wherein the foil envelops the reactor cup;
      g) an x-ray source configured to expose the reactor head space to x-rays;
      h) one or more lasers configured to direct a laser towards a frit and/or through the reactor chamber;

i) 2, 3, 4, 5 or more reactor assembly (RA) coils each RA coil independently comprising a wire winding surrounding the reactor chamber and/or reactor head space operably connected to one or more RA frequency generators and one or more power supplies;

j) 2, 3, 4, 5 or more pairs of RA lamps wherein the pairs of RA lamps are disposed circumferentially around the RA coils and define a space between the pairs of RA lamps and the RA coils; and k) a computer processing unit configured to control the power supply, and frequency generator;

(ii) independently powering each RA coil to a first electromagnetic energy level;

(iii) powering the one or more RA frequency generators and applying a frequency to each RA coil;

(iv) independently powering each RA lamp;

(v) independently powering each laser;

(vi) powering the x-ray source; and (vii) subjecting the nanoporous carbon powder to harmonic electromagnetic resonance in ultramicropores of the nanoporous carbon powder to instantiate an elemental metal nanostructure in a nanopore.

2. The process of claim 1, wherein the cup is composed of graphite.

3. The process of claim 1, wherein the reactor cap is composed of graphite, platinum, palladium or ruthenium.

4. The process of claim 1, wherein the foil is composed of platinum.

5. The process of claim 1, further comprising a pole disposed below the reactor chamber and above the gas inlet.

6. The process of claim 5, wherein the pole is composed of quartz.

7. The process of claim 1, wherein the reactor chamber is sized to hold about 100 mg nanoporous carbon material.

8. The process of claim 1, wherein:
the gas inlet of the reactor assembly is in fluid connection with at least one gas supply selected from the group consisting of air, oxygen, hydrogen, helium, nitrogen, neon, argon, krypton, xenon, carbon monoxide, carbon dioxide and mixtures thereof;
the gas supplies are free of metal salts and vaporized metals; and
the gas supply is directed through a gas manifold controlled by mass flow meters.

9. The process of claim 1, wherein the nanoporous carbon powder comprises graphene having at least 95% wt. carbon (metals basis), a mass mean diameter between 1 μm and 5 mm, and an ultramicropore surface area between about 100 and 3000 $m^2/g$.

10. The process of claim 9, wherein the nanoporous carbon powder is characterized by acid conditioning, wherein the acid is selected from the group consisting of HCl, HF, HBr, HI, sulfuric acid, phosphoric acid, carbonic acid, and nitric acid, and a residual water content of less than that achieved upon exposure to a relative humidity (RH) of less than 40% RH at room temperature.

11. The process of claim 1, wherein a first RA coil comprises a copper wire winding, a second RA coil comprises a braiding of copper wire and silver wire, and a third RA coil is a platinum wire winding and each RA coil is configured to create a magnetic field and wherein each power supply independently provides AC and/or DC current.

12. The process of claim 1, wherein the reactor assembly comprises 5 RA coils surrounding the reactor chamber and/or reactor head space operably connected to one or more RA frequency generators and one or more power supplies; wherein a first RA coil is aligned with the first frit, a second RA coil is aligned with the reactor chamber, a third RA coil is aligned with the second frit, a fourth RA coil is disposed between the first RA and the second RA coil and a fifth RA coil is disposed between the second RA coil and third RA coil.

13. The process of claim 1, wherein the reactor assembly comprises at least two lasers and wherein each laser is characterized by a different wavelength.

14. The process of claim 1, wherein a first pair of RA lamps are configured in a first plane defined by a center axis and a first radius of the reactor chamber, a second pair of RA lamps are configured in a second plane defined by the center axis and a second radius of the reactor chamber and a third pair of RA lamps are configured in a third plane defined by the center axis and a third radius of the reactor chamber.

15. The process of claim 1, wherein the reactor assembly further comprises an electromagnetic embedding apparatus (E/MEE) located upstream of the gas inlet, the E/MEE comprising:
one or more gas supplies;
a housing having a housing inlet and housing outlet;
an upstream gas line that is in fluid connection with each gas supply and the housing inlet;
an internal gas line in fluid connection with the housing inlet and housing outlet;
a downstream gas line in fluid connection with the housing outlet and the gas inlet;
at least one E/MEE pencil lamp positioned below the internal gas line, at least one E/MEE pencil lamp positioned above the internal gas line and at least one E/MEE pencil lamp positioned to the side of the internal gas line;
an optional short wave lamp and/or a long wave lamp; and
an optional E/MEE coil wrapped around the internal gas line;
wherein each E/MEE pencil lamp is independently rotatably mounted, located along the length of the internal gas line, and powered by the power supply;
wherein the central processing unit independently controls powering each E/MEE pencil lamp and a rotation position of each E/MEE pencil lamp; and wherein, prior to step (vii) the process further comprises the steps of:

(viii) independently powering each E/MEE pencil lamp;
(ix) powering a short wave lamp and/or a long wave lamp, if present;
(x) powering an E/MEE coil wrapped around the internal gas line, if present; and
(xi) independently rotating one or more E/MEE pencil lamps.

16. The process of claim 15, wherein the housing is closed and opaque, the internal gas line is transparent and external gas line in fluid connection with the housing outlet and gas inlet is opaque.

17. The process of claim 16, wherein the internal gas line is between 50 cm and 5 meters and has a diameter between 2 mm and 25 cm.

18. The process of claim 15, wherein:
at least 5 E/MEE pencil lamps are located along the internal gas line;
each E/MEE pencil lamp is independently placed such that its longitudinal axis is (i) parallel to the internal gas line, (ii) disposed radially in a vertical plane to the internal gas line, or (iii) perpendicular to the plane created along the longitudinal axis of the internal gas line or along the vertical axis of the internal gas line; and each E/MEE pencil lamp is independently affixed to one or more pivots that permit rotation between about 0 and 360 degrees with respect to the x, y, and/or z axis wherein (i) the x-axis is defined as the axis parallel to the gas line and its vertical plane, (ii) the y-axis defining the axis perpendicular to the gas line and parallel to its horizontal plane, and (iii) the z-axis is defined as the axis perpendicular to the gas line and parallel to its vertical plane.

19. The process of claim 15, wherein at least one E/MEE pencil lamp is a neon lamp, at least one E/MEE pencil lamp is a krypton lamp, and at least one E/MEE pencil lamp is an argon lamp.

20. The process of claim 19, wherein at least one pair of RA pencil lamps are selected from the group consisting of a neon lamp, a krypton lamp and an argon lamp.

21. The process of claim 1, wherein the one or more RA frequency generators establish a harmonic electromagnetic resonance in ultramicropores of the nanoporous carbon powder.

22. The process of claim 1, wherein the gas is selected from the group consisting of air, oxygen, hydrogen, helium, nitrogen, neon, argon, krypton, xenon, carbon monoxide, carbon dioxide and mixtures thereof.

23. The process of claim 15, wherein at least one E/MEE pencil lamp is a neon lamp, at least one E/MEE pencil lamp is a krypton lamp, at least one E/MEE pencil lamp is an argon lamp, at least one RA pencil lamp is a neon lamp, at least one RA pencil lamp is a krypton lamp, and at least one RA pencil lamp is an argon lamp.

24. The process of claim 1, wherein each RA lamp is powered sequentially and held for a time sufficient to expose the gas to a first electromagnetic radiation condition followed by rotating one or more RA lamps to a second position for a time sufficient to expose the gas to a subsequent electromagnetic radiation condition.

25. The process of claim 24, wherein metal atoms are deposited in a plurality of discrete rows on the nanoporous carbon powder, thereby forming a carbon-metal interface.

26. The process of claim 25, where the carbon at the carbon-metal interface is $sp^2$.

27. The process of claim 25, wherein the metal is deposited in an ordered nano-deposit array comprising discrete rows of nano-deposits, wherein the nano-deposits are characterized by a diameter of between about 0.1 and 0.3 nm, and the space between metal deposit rows is less than about 1 nm.

28. The process of claim 25, wherein the ordered nano-deposit array is characterized by a carbon rich area and a metal rich area adjacent to the array.

29. The process of claim 28, wherein the discrete rows are spaced to form a gradient.

* * * * *